United States Patent
Wasinger

(10) Patent No.: US 10,878,654 B2
(45) Date of Patent: Dec. 29, 2020

(54) CLOSED LOOP CABINET COOLING

(71) Applicant: AGS LLC, Las Vegas, NV (US)

(72) Inventor: Gerald Francis Wasinger, Berkeley Lake, GA (US)

(73) Assignee: AGS LLC, Las Vegas, NV (US)

( * ) Notice: Subject to any disclaimer, the term of this patent is extended or adjusted under 35 U.S.C. 154(b) by 168 days.

(21) Appl. No.: 16/022,446

(22) Filed: Jun. 28, 2018

(65) Prior Publication Data
US 2020/0005592 A1    Jan. 2, 2020

(51) Int. Cl.
| | |
|---|---|
| *G07F 17/32* | (2006.01) |
| *H05K 5/02* | (2006.01) |
| *H05K 5/00* | (2006.01) |
| *H05K 7/20* | (2006.01) |

(52) U.S. Cl.
CPC ....... *G07F 17/3216* (2013.01); *H05K 5/0017* (2013.01); *H05K 5/0208* (2013.01); *H05K 5/0221* (2013.01); *H05K 7/202* (2013.01); *H05K 7/20145* (2013.01); *H05K 7/20181* (2013.01); *H05K 7/20209* (2013.01)

(58) Field of Classification Search
CPC ............. G07F 17/3216; G07F 17/3202; G07F 17/3223; H05K 7/20145; H05K 5/0213; H05K 1/0203
See application file for complete search history.

(56) References Cited

U.S. PATENT DOCUMENTS

| | | | |
|---|---|---|---|
| 4,602,921 A | 7/1986 | Shinohara et al. | |
| 6,491,298 B1* | 12/2002 | Criss-Puszkiewicz | ...................... G07F 17/3202 273/148 R |
| 7,518,862 B1* | 4/2009 | Macika | ...................... G06F 1/20 361/688 |
| 8,358,397 B2 | 1/2013 | Dunn | |
| 2006/0253702 A1 | 11/2006 | Lowell et al. | |
| 2008/0108439 A1* | 5/2008 | Cole | ................... G07F 17/3202 463/46 |

(Continued)

OTHER PUBLICATIONS

U.S. Appl. No. 15/661,581 entitled "Cabinet Air Filtration System", filed Jul. 27, 2017.

(Continued)

*Primary Examiner* — Jay Trent Liddle
(74) *Attorney, Agent, or Firm* — Vierra Magen Marcus LLP

(57) ABSTRACT

A gaming machine is provided having a cabinet (and optionally an internal locked box) enclosing one or more heat generating components such that the heat generating components are enclosed within an air-tight gas-filled volume having a convective loop configuration. A clean thermal transfer gas is circulated about the loop so as to flow past and absorb heat energy from the heat generating components and then continue in sealed fashion through at least one flow-through path of a multi-flow heat exchanger having a plurality of flow-through paths in heat exchange coupling with one another. At least one of the other flow-through paths of the heat exchanger has ambient air flowing by or in it so as to remove heat energy from the clean thermal transfer gas. The gaming machine further includes a plurality of computer-controlled blowers operatively coupled to the heat exchanging flow-through paths.

19 Claims, 16 Drawing Sheets

(56) References Cited

U.S. PATENT DOCUMENTS

| | | | |
|---|---|---|---|
| 2009/0061987 A1* | 3/2009 | Canterbury | G07F 17/32 463/20 |
| 2010/0029391 A1* | 2/2010 | Greenberg | G07F 17/3216 463/46 |
| 2010/0093445 A1* | 4/2010 | Mattice | G07F 17/3202 463/46 |
| 2010/0099487 A1* | 4/2010 | Canterbury | G07F 17/3202 463/25 |
| 2010/0120539 A1* | 5/2010 | Endo | G07F 17/3202 463/46 |
| 2010/0160018 A1* | 6/2010 | Landsman | G07F 17/3202 463/16 |
| 2011/0111838 A1* | 5/2011 | Bauer | G06F 1/20 463/25 |
| 2013/0012311 A1* | 1/2013 | Cornell | G07F 17/3223 463/31 |
| 2013/0053129 A1 | 2/2013 | LeMay et al. | |
| 2013/0061749 A1* | 3/2013 | Lesourd | B03C 3/017 95/70 |
| 2013/0244795 A1 | 9/2013 | Waxman et al. | |
| 2013/0303264 A1* | 11/2013 | Gill | G07F 17/3216 463/25 |
| 2015/0243122 A1 | 8/2015 | Saffari et al. | |
| 2016/0066478 A1* | 3/2016 | Van Den Bergen | G03F 7/70991 361/679.47 |
| 2016/0089607 A1* | 3/2016 | Ike | G07F 17/3211 463/29 |
| 2016/0292959 A1* | 10/2016 | Salzman | G07F 17/3223 |
| 2018/0279508 A1* | 9/2018 | Roan | H01L 23/24 |
| 2019/0035207 A1* | 1/2019 | Wasinger | H05K 5/0221 |
| 2020/0111301 A1* | 4/2020 | Wasinger | G07F 17/3258 |

OTHER PUBLICATIONS

Response to Office Action filed Apr. 17, 2019 in U.S. Appl. No. 15/651,581.
Notice of Allowance and Fee(s) Due dated May 2, 2019 in U.S. Appl. No. 15/661,581.
Office Action dated Mar. 21, 2019 in U.S. Appl. No. 15/661,581.
Office Action dated Sep. 25, 2018 in U.S. Appl. No. 15/661,581.
Response to Office Action filed Dec. 13, 2018 in U.S. Appl. No. 15/661,581.

* cited by examiner

CLOSED LOOP CABINET COOLING

CROSS REFERENCES

U.S. Ser. No. 15/661,581 entitled "Cabinet Air Filtration System", filed Jul. 27, 2017 on behalf of Gerald Francis Wasinger is incorporated herein by reference in its entirety.

TECHNICAL FIELD

The present disclosure of invention relates to operations of gaming machines within a gaming environment.

BACKGROUND

Slot-type electronic and/or mechanical gaming machines, often also referred as slot machines, are popular fixtures in casino or other gaming environments. Such slot machines are generally operated by use of various electronic and/or electromechanical and/or electro-optical components as well as installed software programs that enable rapid and reliable gaming action. Aside from slot machines, various other kinds of gaming devices, including electronically-assisted gaming tables are also generally operated by use of various electronic and/or electromechanical and/or electro-optical components as well as installed software programs. A typical gaming environment (e.g., a casino) often has large arrays of side-by-side gaming devices (e.g., slot machines, gaming tables and ancillary devices) that are available for play and/or observation by large numbers of people. For sake of security, the gaming devices and ancillary equipment are generally housed in securely closed cabinets that themselves may include further and internally locked security boxes. The typical gaming environment often also provides wide varieties of activities for its many guests besides direct engagement in the gaming actions themselves, including for example: allowing bystanders to watch from nearby, providing for music and nearby dancing or exercising, serving drinks, serving snacks and/or allowing for on premise smoking. As a result of the numerous activities in the typical gaming environment (e.g., a casino), the various and generally often cabinet-enclosed electronic and/or electromechanical and/or electro-optical components of the on premise gaming devices (and ancillary other securely enclosed devices) can be exposed to an ambient atmosphere containing a wide variety of particles and/or vapors (e.g., cigarette smoke, dust, human sweat, hairs, moisture, loose carpet fibers, etc.). This can lead to problems including some elucidated below.

As mentioned, participants in the gaming environment may include one or more of primary players who are directly using the slot or other components-filled gaming apparatuses, one or more locally adjacent players who are directly using locally adjacent slot or other component driven gaming apparatuses (e.g., as in the case of a "bank" of slot machines all participating in a bank-wide progressive pool). Participants typically also include adjacent bystanders (e.g., players' friends) who are standing nearby the primary players, watching and perhaps pacing behind, smoking, drinking, etc. Participants may include nearby passers by who happen to be passing by in an area where they can view part of the gaming action(s) of one or more of the gaming action directly on the displays of the gaming machines or indirectly by way of other components-enclosing gaming support devices including for example large wall displays (e.g., video monitors presenting signage updates). The observed gaming actions may include those of progressively growing local or other larger area jackpot pools and the occasional (rare or more frequent) awarding of such jackpots. Many of the various attendees in the gaming environment may be pacing, snacking, drinking, smoking, dancing, walking by or just generally moving about, even if seated. All these activities can lead to emission of particles and/or vapors (e.g., dust, smoke, moisture) that, if not filtered out, can coat or otherwise impact the enclosed electronic and/or electromechanical and/or electro-optical components of the on premise gaming devices/ancillary support devices and then interfere with proper operation of these devices and/or reduce mean time between failure (MTBF) and/or mean time between normally-scheduled maintenance stoppages (MTBS). It is desirable to maximize MTBF and MTBS despite the presence of the particles and/or vapors that are routinely emitted into the ambient air of the gaming environment, sometimes in relatively high concentrations (e.g., due to gathering of crowds about some machines that appear to them to be extra lucky).

It is to be understood that some concepts, ideas and problem recognitions provided in this description of the Background may be novel rather than part of the prior art.

SUMMARY

Various embodiments in accordance with the present disclosure of invention generally relate to improved operating of gaming machines and in particular to preventing or reducing particles and/or vapors from coating or otherwise impacting enclosed electronic and/or electromechanical and/ or electro-optical components of gaming devices and ancillary support devices.

In accordance with one aspect of the present disclosure, a gaming machine is provided having a locked cabinet (and optionally an internal locked security box) enclosing one or more heat generating components. The cabinet and optional internal locked security box are configured to define an air-tight-wise sealed gas-filled containment volume having a loop configuration that encloses one or more of the heat generating components. A clean thermal transfer gas is circulated about the loop of the air-tight-wise (e.g., hermetically) sealed gas-filled containment volume so as to flow past and absorb heat energy from the one or more of the heat generating components and then to continue in air-tight-wise sealed fashion through at least one air-tight-wise sealed flow-through path of a multi-flow heat exchanger having a plurality of flow-through paths that are heat exchange-wise coupled (thermally coupled) with one another (operatively coupled to exchange heat energy from a hotter one or more of the paths to cooler one or more of the paths). At least one of the other flow-through paths of the heat exchanger has ambient air flowing by or in it so as to remove heat energy from the clean thermal transfer gas. The heat exchanger is disposed such that cooled denser portions of the clean thermal transfer gas are produced above a bottom portion of the containment volume and are delivered to that bottom portion in a convectively assisted manner. Even if power fails, convective circulation can continue. The gaming machine further includes a plurality of computer-controlled blowers operatively coupled to the heat exchanging flow-through paths, where at least one of the blowers is disposed to circulate the clean thermal transfer gas within the loop of the air-tight-wise sealed gas-filled volume while at least another of the blowers is disposed to blow ambient air along the other of the flow-through paths. An automated process controls blowing speeds and/or directions of the blowers so as to achieve one or more goals including keeping the heat generating components below respective predetermined temperatures and preventing particles from lodging in the flow-through paths of the heat exchanger. The clean thermal transfer gas is configured to not deposit thermally insulative materials on the heat generating components.

In one embodiment, a method of cooling internal components of a cabinet of a gaming machine is provided where the method comprises: (a) circulating a relatively clean thermal transfer gas in a air-tight-wise sealed loop, the loop including a first gas flow path of a multi-flow heat exchanger disposed at least within an upper portion of the cabinet and the loop including a components containment volume disposed at least within a lower portion of the cabinet, the components containment volume containing one or more heat generating components and/or containing one or more heat emitting parts of heat generating components such that the contained heat generating components and/or the contained heat emitting parts are exposed to the clean thermal transfer gas, wherein the circulating of the thermal transfer gas causes a relatively more dense and cooler part of the clean thermal transfer gas to form in a portion of the heat exchanger that is above a bottom portion of the components containment volume such that the more dense part can move down to gravitationally displace a relatively less dense and warmer part of the clean thermal transfer gas present at the bottom portion of the components containment volume, and (b) flowing unsealed ambient air along a second gas flow path of the multi-flow heat exchanger.

Further aspects of the present disclosure of invention may be found in the following detailed descriptions.

BRIEF DESCRIPTION OF DRAWINGS

The present disclosure may be better understood by reference to the following detailed description taken in conjunction with the accompanying drawings, which illustrate particular embodiments in accordance with the present disclosure of invention.

DETAILED DESCRIPTION

Figure 1:
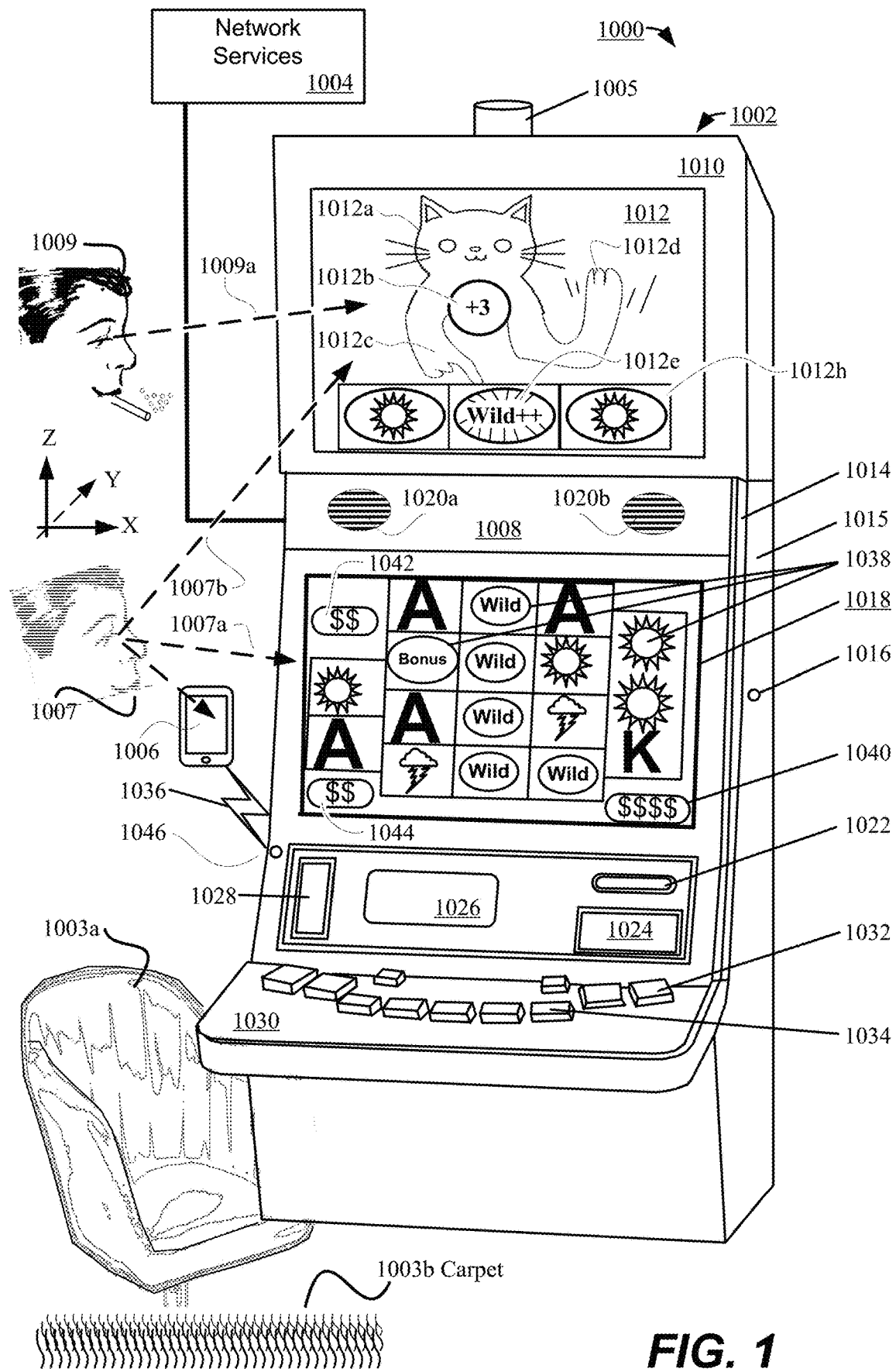
FIG. 1 illustrates a gaming system and environment including a wager-based gaming machine in accordance with the present disclosure.

Reference will now be made in detail to some specific embodiments in accordance with the present disclosure of invention. While the present disclosure is described in conjunction with these specific embodiments, it will be understood that it is not intended to limit the teachings of the present disclosure to the described embodiments. On the contrary, it is intended to cover alternatives, modifications, and equivalents as may be included within the spirit and scope of the teachings of the present disclosure.

In the following description, numerous specific details are set forth in order to provide a thorough understanding of the present disclosure. Particular embodiments may be implemented without some or all of these specific details. In other instances, well known process operations have not been described in detail in order not to unnecessarily obscure the present disclosure of invention. Although not explicitly shown in many of the diagrams, it is to be understood that the various automated mechanisms discussed herein typically include at least one digital data processing unit such as a central processing unit (CPU) where multicore and other parallel processing architectures may additionally or alternatively be used. The components are not limited to digital electronic ones and may include analog and/or mechanical and optical ones. Some of these components may generate concentrated amounts of local heat when operating and may have finned heat sinks and/or miniature cooling fans attached to them for maintaining predetermined acceptable operating temperatures. Some of these components may be securely enclosed within a series of the security enclosures for example, a locked box within a locked cabinet. It is to be further understood that the various automated mechanisms mentioned herein typically include or are operatively coupled to different kinds of non-transient data storage mechanisms including high speed caches (which could be on-chip, package secured caches), high speed DRAM and/or SRAM, nonvolatile Flash or other such nonvolatile random access and/or sequential access storage devices, magnetic, optical and/or magneto-optical storage devices (e.g., with motor-driven rotating media) and so on. The various data processing mechanisms and data storage mechanisms may be operatively intercoupled by way of local buses and/or other communication fabrics where the latter may include wireless as well as wired communication fabrics. The data storage mechanisms may generate heat.

In general, gaming systems which provide wager-based games are described. In particular, with respect to FIGS. 1 and 2, a gaming machine system including a plurality of automated wager-based gaming machines in communication with network devices is described. The gaming machine system can support wager-based games where one or more progressively growing prizes or awards (e.g., mega-jackpot, medium-jackpot, mini-jackpot) are made possible and/or where the unleashing of a whole series of bonuses (e.g., free spins) or other awards is made possible. One of the goals of providing progressive jackpot prizes and/or bonus games (e.g., wild card activated bonus games) is to increase level of excitement and draw large crowds of people into the gaming machine environment. However, large crowds tend to increase emission into the local ambient atmosphere of particles and vapors (e.g., dust, smoke, sweat, etc.).

The emitted particles and vapors can foul the interiors of cabinets of the crowded about gaming machines. One prior art method of reducing the amount of emitted moieties (e.g., particles, vapors) that enter the interior of air cooled cabinets is disclosed in the here incorporated by reference U.S. Ser. No. 15/661,581 entitled "Cabinet Air Filtration System", filed Jul. 27, 2017 on behalf of Gerald Francis Wasinger. Basically, a series of filters are used to remove large-sized and smaller sized particles as cooling air is forced through the filters and into the cabinet. But these interposed filters (especially the finer pored ones) act as blockages of air flow into the cabinets, thus often calling for larger, noisier fans, greater consumption of electrical energy to drive the air blowing fans and shorter time between normal maintenance stoppages for replacing clogged filters through which the ambient air was constantly forced and thus additively caused more and more particles to lodge in the filters. thereby calling for even more fan power. The present disclosure of invention overcomes problems such as these.

A prior art method not directly involved with gaming environments is disclosed in U.S. Pat. No. 8,358,397 issued Jan. 22, 2013 to Dunn and entitled "System for cooling an electronic display". In Dunn '397 an isolated transparent gas loops about a fixedly closed plenum so as to flow horizontally between a glass cover of and a front surface of a display so as to thereby cool the front surface of the display.

While various slot machines and/or other gaming devices may use mechanical reels or wheels and/or video reels or wheels to present to the respective players both of action occurring during development of a game outcome and a finalized outcome of a gaming action, typically the actual gaming action takes place rapidly and invisibly in a secured (e.g., cabinet enclosed, locked box further enclosed) electronic part of the system. The outcome is determined there (based on use of a truly random and/or pseudo-random outcome determining mechanism) and then later the development of the outcome and the final outcome are revealed to a corresponding one or more players by updating of various display and cabinet-enclosed signage means such as video screens. The video screens (and/or other signage means) may also display pending award amounts, including those of the growing jackpot amounts. Typically, before each gaming action by the machine system (e.g., including display of spinning of the reels or wheels), the player is required to ante up by placing at least one wager on the outcome of the gaming action. In some games, a player can elect to have at least part of one or more of his/her wagers (e.g., side wagers) correspondingly contributed to one or more progressive jackpot pools.

Chances for winning any one or more of games and/or progressive jackpot pools can come in various software mediated and/or analog-circuit and/or analog mechanical mediated ways. For example, a player at a slot machine may select or define a straight or other line or other pattern that will operate as an actively-wagered upon pay line/pattern over which, game-generated randomly distributed symbols are evaluated to determine if a winning combination is present (e.g., a sequence defining combination such Jack, Queen, King, Ace, etc. cards, hereafter also J, Q, K, A). If the actively-wagered upon pay line/pattern provides a winning combination, the player is rewarded (e.g., monetarily and/or otherwise). Because award amounts of relatively large size are often involved, a variety of both mechanical and electronic security measures are undertaken, including locking heat generating electronic components in a series of locked security enclosures. Various outcome enhancing symbols such as wild symbols can appear on the reels, wheels or other symbol presenting mechanisms of the game. Wild symbols typically serve as outcome enhancing substitutes for symbols needed to form a winning combination. In various prior art games, wild symbols: (1) can come into existence by other symbols individually morphing into wild symbols; (2) they can be individually copied from one reel or wheel to another; (3) they can be dropped from an animated character (e.g., cartoon) onto the reels or wheels to individually change certain existing symbols on a scatter distributed basis; and (4) they can populate a reel or wheel more frequently during so-called, free spins. On occasions, a player may be awarded with a wheel spin or other by-chance prize amount selecting mechanism that gives the player a crack at one or more of the progressive jackpot pools (e.g., the mega, medium and/or mini pool). In one example of a by-chance prize amount selecting mechanism, a player who won the primary gaming action (e.g., slot machine poker, table poker) is presented with a lottery-like scratch-to-reveal ticket (a virtual version of one) where the player's task is to scratch off a subset of the possibilities so as to match a set of symbols then presented elsewhere to the player. If he/she succeeds in matching the pattern, he/she is awarded the pending jackpot prize (e.g., $100 if it is a mini-jackpot). Due to such occasional sprinklings of chances at winning one of the progressive jackpot pools, the primary players and adjacent other persons may experience various emotional responses and derive entertainment value from not only the unique ways in which various games are played and game outcomes are developed but also from the chances of winning one of the progressive jackpot pools. The excitement may be accompanied with physical agitation (e.g., dancing, jumping, squirming, drink tossing, etc.) which may result in increased local release of particles and/or vapors into the ambient atmosphere.

A problem emerges when released particles and/or vapors (e.g., dust and moisture) enter the ambient atmosphere near the gaming machines. The same ambient atmosphere is often used to remove excess heat from the various enclosed components (e.g., electronic and/or electromechanical and/or electro-optical components) of the on premise gaming devices. The emitted moieties (e.g., particles, vapors) may over time build up as thick coatings on the cabinet-enclosed components and/or over time result in corrosion and/or in creation of electrical insulation/resistance between contacts and then interfere with proper operation of the devices (e.g., including proper cooling of components) and thus reduce mean time between failure (MTBF) and/or mean time between normally-scheduled maintenance stoppages (MTBS).

Referring to FIG. 1 of the present disclosure of, shown is part of an automated gaming system 1000 in accordance with the disclosure that includes a wager-based gaming machine 1002 (e.g., a slot machine). The wager-based gaming machine 1002 can include wireless or wired communication interfaces which allow communications with remote and also securely-housed servers and/or other devices including a remote services providing network 1004 (e.g., having service providing servers and/or other data storing, communicating and data processing units—not explicitly shown). The services providing network 1004 (typically housed in one or more secured cabinets with internal locked boxes further housing components of the network) can provide privacy-assuring/integrity-secured services such as but not limited to player tracking and management of progressive gaming. (Some specific network services are described in more detail in conjunction with FIG. 2). The player tracking service and the progressive gaming management service can be parts of a player and prizes accounting system that for example keeps track of each player's winnings and expenditures (including, in some embodiments, player contributions to one or more progressive jackpot pools). In addition, the gaming machine 1002 can include wireless communication interfaces, such as a wireless interface 1046 (internal, not specifically shown) which allow communication with one or more mobile devices, such as a mobile phone 1006 (only one shown), a tablet computer, a laptop computer and so on via respective wireless connections such as 1036. The wireless interface 1046 can employ various electronic, optical or other electromagnetic wireless and secured or non-secured communication protocols, including for example TCP/IP, UDP/IP, Bluetooth™ or Wi-Fi.

The respective mobile phones (e.g., 1006) and/or tablet computers and/or other mobile devices can be owned and/or utilized by various players, potential customers, authorized casino operators/agents or authorized gaming inspectors. A mobile device carried by a primary player (e.g., 1007) can be configured to perform gaming related functions, such as functions associated with transferring funds to or from the specific gaming machine 1002 and the primary player's account(s) or functions related to player tracking. In one embodiment, the mobile device carried by the primary player (e.g., 1007) can be configured to call for operator assistance and to provide the location of the mobile device so that a casino operator/agent can find the player requesting assistance. A mobile device carried by a casino operator/agent can be configured to perform operator related functions, such as responding to calls for operator assistance, performing hand pays, responding to tilt conditions or collecting metering related information. A mobile device carried by an authorized gaming inspector can be configured to perform inspection related functions, such as actuating software verification procedures and checking on the thermal, mechanical and/or electronic status of enclosed components.

Use of mobile devices is not limited to secured transactions. In one embodiment, mobile devices may be used for social networking. For example, a primary player 1007 may authorize his/her mobile device (e.g., 1006) to automatically interact with a currently used gaming machine 1002 for the purpose of automatically posting to a user-chosen social network various announcements such as, but not limited to, that the primary player 1007 has been having fun playing the Lucky Kitty game (a fictitious name for purposes herein) for X hours at the given gaming establishment or that the Lucky Kitty game has just awarded the primary player 1007 a symbols upgrade (e.g., Wild cards) that now gives that player an opportunity to spin for a mega- and/or mini- jackpot and/or other awards. The primary player 1007 may alternatively or additionally authorize his/her mobile device (e.g., 1006) to automatically announce (wirelessly) to a selected group of friends or associates that player 1007 has just been awarded an opportunity to spin for a jackpot and/or other awards and inviting them to stop by and watch the fun (e.g., as nearby other person 1009 is doing over the shoulder of the primary player 1007, where the latter in one embodiment, is seated in chair 1003s situated in front of gaming machine 1002 and typically mounted on a carpeted casino floor 1003b.) In some instances, various persons near the gaming machine 1002 (e.g., over the shoulder observer 1009) may be engaged in emissions producing activities such as smoking, vaping, head scratching, carpet pacing and so forth.

According to the same or an alternate embodiment, the primary player 1007 may use his/her mobile device (e.g., 1006) to temporarily reserve the particular gaming machine 1002 for a predetermined amount of time (e.g., no more than say 10 to 30 minutes) so that the primary player may temporarily step away to attend to various needs (e.g., the callings of nature). While the primary player 1007 is temporarily away, the gaming machine 1002 may display a reservation notice saying for example, "This machine is reserved for the next MM minutes by a winning player who was recently awarded a mini-jackpot and a lucky opportunity to spin for the mega-jackpot and/or other awards. Stand by and watch for more such lucky opportunities!" (where here MM is a progressively decreasing time counter). The reservation notice may be prominently posted on an upper display 1012 of the gaming machine 1002 as shall next be described.

The gaming machine 1002 can include a locked base cabinet 1008 (with an internal and additionally locked security box, not shown) and an upper or top box 1010 fixedly mounted above the base cabinet. The top box 1010 includes an upper and relatively large display 1012. The upper display 1012 can be used to display video content, such as game art associated with the game being currently played on the gaming machine 1002. For example, the game art can include one or more animated wheels or reels (or other chance/opportunity indicating mechanisms) and/or one or more animated creatures (e.g., the hand waving Lucky Kitty illustrated at 1012a). The animated wheels or reels can be configured to spin and to stop to reveal an occasional opportunity to spin for a jackpot and/or other awards and/or the awarding of a grand prize such as a progressive jackpot. In one embodiment, the predetermined stoppage position or area or awarding of a special prize (e.g., Wild symbol 1012e) may be pointed to by an animated finger 1012c of the Lucky Kitty character 1012a (or other appropriate animated figure). The Lucky Kitty character 1012a (or other appropriate animated figure) may temporarily wave an attention getting item such as a flag or a virtual fireworks sparkler, etc. (not shown) at the appropriate times to try to draw in farther back standby observers like 1009. At other times and/or in other examples, the video content of the relatively large upper display 1012 can include advertisements and promotions, such as for example, "A mega-jackpot amount of more than $100,000 was awarded on this machine two weeks ago. Is this the lucky machine for you too?"

In alternate embodiments, the top box 1010 can include one or more glass-covered mechanical and/or electronic devices in addition to the upper video display 1012. For example, mechanical devices, such as one or more mechanical wheels can be mounted to or within the top box 1010.

The mechanical wheel(s) can include markings that indicate various bonus award situations and/or situations where large (mega-) or smaller jackpots might be won. The wheel(s) can be spun and stopped at particular stopping points to reveal a bonus award situation or a multi-symbol transformation situation (e.g., awarding multiple wild cards, where the latter can increase the chance for winning a jackpot). In yet other embodiments, the top box 1010 can include a plurality of upper displays that provide similar functions.

With respect to chance providing mechanisms as described herein, it is to be understood that such can include not only mechanical chance providing mechanisms (e.g., mechanical spinning wheel with relatively unpredictable stop position), but also electronically based chance providing mechanisms that can be implemented in the form of digital and/or analog electronic circuits where in some cases, temperatures inside the cabinet can affect operations of these circuits. Some of the circuits may rely on flip-flops or registers designed with intentional meta-stability and/or on noise intolerant switching circuits that are intentionally exposed to random noise (e.g., thermal noise) so as to provide relatively random and unpredictable outcomes. In one embodiment, an automatically repeatedly actuated code/data verifier is called upon to verify that utilized software and control data use pre-approved hardware, firmware and/or software for properly providing random chances of respective predetermined probabilities at winning and or getting a chance to spin for respective prizes including for respective progressive jackpot pools (e.g., mega-, medium and/or mini-jackpots). Prior art technologies for truly random or pseudo-random picking of outcomes from respective finite outcome sets are too numerous to mention all here. Examples of Random Number Generation (RNG) include Oscillator controlled RNGs, Linear feedback shift register based RNGs; RNGs using Plural parallel outputs bits; Seed value controls for RNGs; Truly random number RNGs; RNGs with Plural parallel outputs, etc. More specific examples of RNGs are provided for example in U.S. Pat. No. 9,830,130 (Random number generator); U.S. Pat. No. 9,792,089 (Random number generator using an incrementing function); U.S. Pat. No. 9,778,913 (Method of generating uniform and independent random numbers); U.S. Pat. No. 9,640,247 (Methods and apparatuses for generating random numbers based on bit cell settling time); USPTO PreGrant 20170262259 (Method for Generating Random Numbers and Associated Random Number Generator); PCT/EP2017/069185 (Quantum Random Number Generator and Method for Producing a Random Number by Means of a Quantum Random Number Generator). A simple example of an RNG is a high speed asynchronous oscillator (e.g., GHz range) driving a wrap-around counter whose counting is stopped or captured by an asynchronous event of substantially slower and unsynchronized timing resolution (e.g. a user pushes a button, background noise is detected, etc.). The output of the stopped/copied counter may then drive an address input of lookup table populated by predetermined outcome values (e.g., playing card symbols) at their respective outcome frequencies. A particular outcome is thereby picked in a substantially random and optionally statistics skewed manner (skewed by the LUT) based on its frequency of appearance within the lookup table. (See also the example of FIG. 7.)

It will be appreciated by those familiar with gaming environments that participants in various gaming environments (also briefly see FIG. 2) include respective primary players like 1007 who are directly using their respective slot machines (e.g., 1002) and are each typically seated on a chair (e.g., cushioned chair 1003) disposed in front of the gaming machine so as to thereby position that primary player's eyes substantially level with a central vertical position (along the vertical Z axis) with a primary game outcome display area 1018 of the gaming machine 1002 thus allowing for a comfortable gaze angle indicated by viewing vector 1007*a*. The primary game outcome display area 1018 typically being positioned vertically below and slightly spaced apart from the upper video display area 1012. The vertical elevation of the upper video display area 1012 is chosen so as to be easily viewed by adjacent player(s) who is/are directly using adjacent slot machines (for example at an eye incline angle shown as viewing vector 1007*b*) and also to be easily viewed by adjacent bystanders 1009 (e.g., a player's friends) who are standing nearby the primary player or nearby one of the adjacent players or are nearby passers by who happen to be passing by in an area where they can view part of the gaming action(s) of one or more of the slot machines; and in particular the actions displayed by the upper video display 1012 at a comfortable viewing vector 1009*a*. Due to real or simulated movements of the mechanical reels and/or video reels in the primary game outcome display area 1018 and in the upper video display area 1012, the primary players and the adjacent other persons may experience various emotional responses (and react physically as part of the response by jumping, dancing etc.) and derive entertainment value and expectations for further excitement from the unique ways in which the slot game (e.g., the Lucky Kitty game illustrated as an example in areas 1012 and 1018 or other such software driven gaming actions) are progressing. For example, when a low frequency winning hand or winning pattern appears on a wagered-for pay line or pattern presentation area such as 1038 (or a low frequency combination of symbols appears within a predetermined pattern of on-display locations), attention grabbing other symbols (e.g., flashing arrow noted by gaze line 1007*a*) may be automatically presented on the gaming machine. In accordance with one aspect of the present disclosure, before the primary player 1007 spins for the jackpot (e.g., using a virtual wheel or reel that is not explicitly shown), attention grabbing further and larger displays appear on the relatively large upper video display 1012 (e.g., "Big Win Possible Here!"—not shown) so they are in the line of sight 1009*a* of bystanders or other primary players so as to draw them in. This can increase emotional levels of all involved, greater levels of physical agitation (e.g., jumping, shouting, heavy breathing) and heightened enjoyment of the gaming actions. In other words, a mixture of emotions and physical activities may be induced including those related to heightened expectations and foreboding that all the expected rewards may or may not be realized. If the primary player 1007 continues to win low frequency winning hands such as the four Aces (A) shown, the expectations for jackpot or like big payouts can increase, thus providing increased entertainment and excitement to those nearby the gaming machine 1002 (and optionally to those on social media who are following the primary player's progress). If high frequency jackpots (e.g., a mini jackpot—as opposed to a larger progressive jackpot, e.g. mega-jackpot with substantially higher possible payout but substantially lower odds of winning it) appear to be hit within a relatively short period of time among a specific bank or banks of machines, that may entice the nearby bystanders 1009 to flock to those machines and start participating in the gaming actions because it appears to the bystanders that such specific bank or banks of machines are extra lucky.

Flocking or clustering of players to a specific bank or banks of machines can have detrimental effects though. Among these is the increased local generation of particles and vapors being emitted into the ambient atmosphere; where, if sucked in by cooling fans into the interior of cabinets like 1008, 1015 can foul the interior of such gaming machines 1002. This can cost the casino revenues in various ways, including causing more frequent failures and shut downs of machines which means that the area cannot handle large volumes of customers when they show up at certain times of heightened traffic (e.g., during conventions, wedding parties, etc.). Customers may stop coming to the casino if they run into unavailability of machines too often. In the long run, it would be beneficial to the casino in terms of customer relations and long term smooth running of operations if a technical and automated solutions could be found which avoid altogether or significantly decrease the entry of emitted particles and/or vapors into interiors of cabinets (and locked boxes therein) while still providing proper cooling for all interior components in an economical and practical way.

One or more solutions of this type are disclosed herein. However, before delving into the solutions; yet further details for one embodiment are first provided. The base cabinet 1008 of one embodiment includes an exterior access entry mechanism instantiated for example as door 1014. The door 1014 swings outward and is coupled to a back portion 1015. The door 1014 includes a locking mechanism 1016. During normal operation, the door 1014 is locked and preferably blocks flow of ambient air therethrough and into the interior as shall be detailed below. Typically, unlocking the door 1014 causes the gaming machine 1002 to enter a tilt mode where gaming functions, such as the play of a wager-based game, are not available. This tilt mode can be referred to as a hard tilt. In one embodiment, after the door 1014 is reclosed an interior atmosphere flushing mechanism flushes out (e.g., purges through a one way pressure relief valve) ambient air that may have entered and replaces the flushed out air with a clean interior gas (which could also be air, but pre-cleared of potentially damaging particles and/or vapors). In one embodiment, the door 1014 includes a magnetically sealing flexible gasket all around for assuredly blocking contaminant containing fluids (gases and liquids) from entering all or a predetermined portion of the interior of the cabinet 1008.

The cabinet 1008 can include one or more additional and lockable security boxes that are accessible by way of respective hermetically sealable apertures that allow access to portions of a number of components which are disposed at least partially within the cabinet and also within the more secured, lockable security boxes. These wholly-in-cabinet/wholly-in-lock box or protruding-from-cabinet/protruding-from-lock-box components can include, but are not limited to displays such as 1018 and 1026, speakers such as 1020a and 1020b, a printer 1022, a bill acceptor 1024, a magnetic and/or chipped card reader 1028 and a resting shelf and/or button panel 1030 including buttons 1032 and 1034. As described in more detail below, these cabinet secured/lock-box-secured components can be used to generate or assist in wager-based game play on the gaming machine 1002. Unfortunately, these cabinet secured/lock-box-secured components can generate significant amounts of heat.

In particular embodiments, the bill acceptor 1024 can be used to accept currency or a printed ticket which can be used to deposit credits into an account maintained for the primary player 1007 and/or the gaming machine 1002. The credits can be used for wagers. The bill acceptor 1024 can include electronic and electromagnetic components (e.g., motors) that need to be cooled. The printer 1022 can be used to print tickets to transfer credits from one gaming machine (e.g., 1002) to another or to monetize accumulated credits. The printer 1022 can include electronic and electromagnetic components (e.g., motors) that need to be cooled. Typically, the tickets can be redeemed for cash or additional game play, such as game play on another gaming machine or at a gaming table. While in one embodiment, physical tickets or other such tokens are used for transfer of credits, it is within the contemplation of the present disclosure to alternatively or additionally use electronically secured digital tokens which may be securely transferred from the gaming machine 1002 into a players mobile device 1006 if the latter is properly instrumented with security assuring applications.

Figure 2:
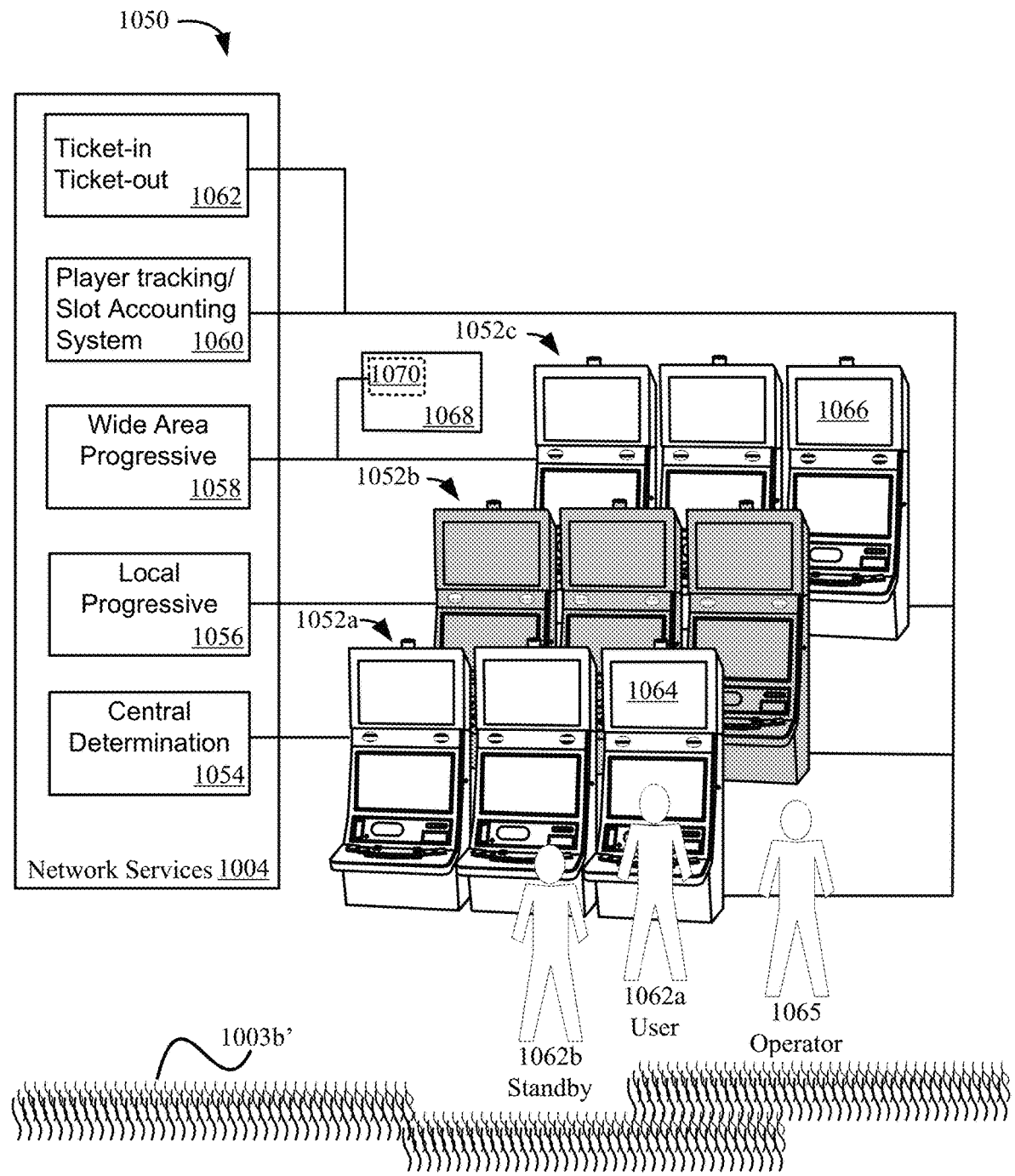
FIG. 2 illustrates a gaming system including three banks of gaming machines that may all participate in one or more progressive jackpot games.

The bill acceptor 1024 and printer 1022 can be part of ticket-in/ticket-out (TITO) system 1062 illustrated in FIG. 2. The TITO system 1062 can be included as one of the secured services provided by the services network 1004. The TITO system allows a ticket printed at a first gaming machine with a credit amount to be inserted into a bill acceptor at a second gaming machine and validated for game play. After validation, the credit amount associated with the ticket can be made available for game play on the second gaming machine. Additional details of the TITO system 1062 are described below in conjunction with FIG. 2. In one embodiment, mechanical mechanisms such as the bill acceptor 1024 and printer 1022 have motor operated security doors that temporarily open to the outside to allow for interface with the outside and then close. In accordance with one aspect of the present disclosure, after the motor operated security doors close, the interiors of these devices are flushed with a flow of clean air or other gas.

The bill acceptor 1024 can include a slot surrounded by a bezel which allows banknotes of various denominations or printed tickets to be inserted into the bill acceptor. The bill acceptor 1024 can include sensors for reading information from the banknotes and determining whether the banknotes inserted through the slot are valid. Banknotes determined to be invalid, such as damaged or counterfeit notes, can be automatically ejected from the bill acceptor 1024. In some instances, the bill acceptor 1024 can include upgradeable firmware and a connection to additional network services. Via the network connection, new firmware, such as new counterfeit detection algorithms can be downloaded for installation into the bill acceptor 1024.

The bill acceptor 1024 includes mechanisms for guiding the banknotes or printed tickets past the internal sensors. Banknotes or printed tickets which are accepted can be guided to a bill stacker (not shown) located within the cabinet 1008 of the gaming machine 1002. The bill stacker can hold a maximum number of bank notes or printed tickets, such as up to two thousand.

The gaming machine 1002 can include a sensor for detecting a fill level of the bill stacker. When the bill stacker is full or close to being full, the gaming machine 1002 can be placed in a tilt mode. Next, the cabinet door 1014 can be opened by authorized casino personnel and the full bill stacker can be replaced with an empty one. Then, the door 1014 can be closed and the gaming machine 1002 can be restored to a normal operational mode in which it is available for game play. In accordance with one aspect of the present disclosure, after the security door is close, the interior of the cabinet 1008 (and/or further locked boxes therein, not shown) are flushed with a flow of clean air or other gas.

One function of the printer 1022 is to print "cash out" tickets. In a "cash out," credits available on the gaming machine can be transferred to an instrument, such as a printed and/or magnetically encoded ticket, or wirelessly transferred by way of a secure link to an appropriate account (e.g., the primary player's account) for later access. Typically, a "cash out" can be initiated in response to pressing one of the physical buttons, such as 1032 or 1034, or touch screen button output on a display, such as primary display 1018 or a secondary display such as the one 1026 illustrated to be smaller than and disposed below the primary game outcome display 1018.

In one embodiment, the printer 1022 can be a thermal printer. The printer can be loaded with a stack of tickets, such as a stack with two hundred, three hundred or four hundred tickets. Mechanisms in the printer can grab tickets from the ticket stack and transport the tickets past the print heads for printing. The ticket stack can be located in an interior of the gaming machine cabinet 1008.

The printer 1022 can include sensors for detecting paper jams and a status of the ticket stack. When a paper jam or low ticket stack is detected, the gaming machine 1002 can enter a tilt mode where game play is suspended. In one embodiment, a tower light 1005 disposed above the upper box 1010 can light to indicate the tilt status of the gaming machine 1002. After the tilt condition is cleared, such as by clearing the paper jam or replenishing the ticket stack, and relocking the security doors of the machine, the gaming machine 1002 can enter a normal operational mode where game play is again available.

Figure 8:
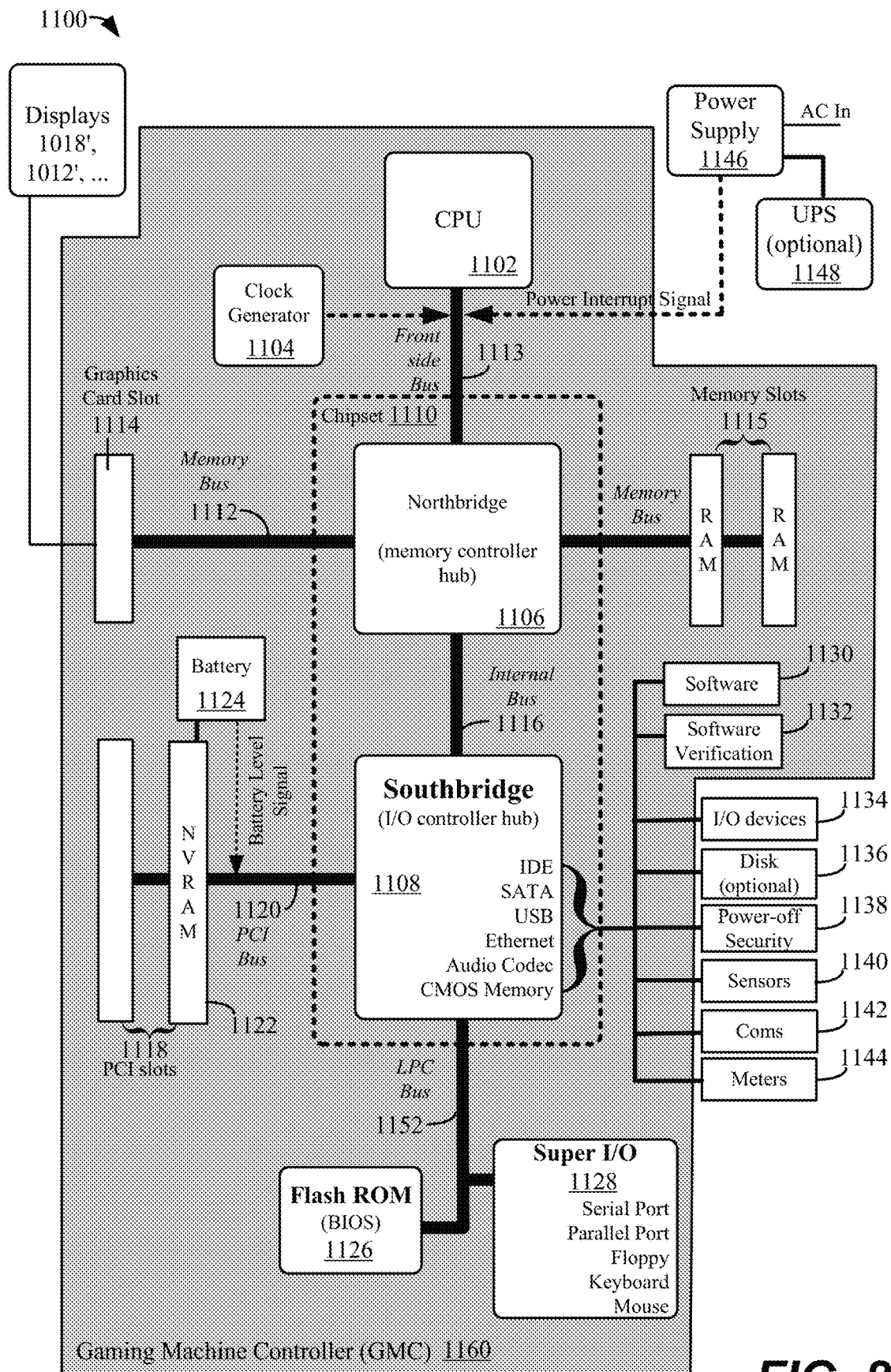
FIG. 8 illustrates a gaming controller in accordance with the present disclosure.

In particular embodiments, the printer 1022 can be coupled to a gaming machine controller (see 1160 in FIG. 8). The gaming machine controller 1160 can be configured to send commands to the printer which cause a "cash out," ticket to be generated. In addition, the printer 1022 can be coupled to other systems, such as a player tracking system (e.g., 1060 in FIG. 2). When coupled to the player tracking system, commands can be sent to the printer 1022 to output printed tickets redeemable for comps (comps refer to complimentary awards, such as but not limited to free credits, a free drink, a free meal or a free room) or printed coupons redeemable for discounts on goods and services.

As mentioned, in some embodiments, one or more wireless interfaces 1046 can be provided to operate as secured and/or unsecured wireless communication connections 1036. The wireless connections can be established for example between the gaming machine 1002 and one or more mobile devices, such as smart phone 1006. The wireless connection 1036 can be used to provide functions, such as but not limited to player tracking services, casino services (e.g., ordering drinks, snacks, calling for operator assistance) and enhanced gaming features (e.g., displaying game play information on the mobile device). The wireless interface can be provided as a stand-alone unit or can be integrated into one of the devices, such as the bill/ticket acceptor 1022 and the card reader 1028. In addition, the bill/ticket acceptor 1022 and the card reader 1028 can each have separate wireless interfaces for interacting with the mobile device. In one embodiment, these wireless interfaces can be used with a wireless payment system, such as Apple Pay™ or Google Pay™. The wireless payment system can be used to transfer funds to the gaming machine that can be used for wager-based game play.

The door 1014 can allow secured entry access an interior of the cabinet 1008. In one embodiment, the interior of the cabinet 1008 is divided to have a first portion which is cooled by a hermetically sealed and clean or ultra-clean circulating gas and a second portion which is cooled by unsealed flowing air. Additionally, in one embodiment, the interior of the cabinet 1008 which has the unsealed air flowing through it may be further divided such that part of the second portion has unfiltered or coarsely filtered ambient air flowing through it and another part of the second portion has more finely filtered ambient air flowing through it. Thus there can be a number of different air or gas flows moving within the interior of the cabinet 1008, including the hermetically sealed clean circulating gas, the filtered ambient air (e.g., passed through a HEPA filter) and the unfiltered or more coarsely filtered ambient air. In one embodiment, door 1014 has one or more gaskets (e.g., magnetically sealing gaskets) which assuredly seal(s) the respective portions or subdivisions thereof when the door is latched closed so that contaminant containing fluids or gases cannot easily enter. In the case where the first portion is subdivided, each subdivision will typically have a circulating gas ingress conduit which delivers a pre-cooled thermal transfer gas from a higher up heat exchanger to a bottom portion of the subdivision and a circulating gas egress conduit which removes heated transfer gas from a top portion of the subdivision and delivers it to the heat exchanger. A convective loop is thereby defined which can operate even if there is a power outage that deprives blowers of power. This will be made clearer when FIGS. 4A-4B are described in detail below. In an alternate embodiment, the entire interior of the cabinet 1008 is cooled by a hermetically sealed and clean circulating gas. The door access system allows components mounted or otherwise disposed within the cabinet, such as air/gas filters (not yet discussed), moisture/particle absorbers (not yet discussed), fans, displays 1018, 1026; speakers 1020a, 1020b; bill/ticket acceptor 1022 or printer 1024 to be serviced and maintained. For example, a receptor configured to receive currency and tickets, coupled to the bill acceptor, can be emptied. The receptor is often referred to as a bill stacker. In another example, blank tickets can be added to the printer 1022 or paper jams can be cleared from the printer. When door 1014 is opened, the gaming machine can enter a hard tilt state where game play is disabled. Although not explicitly shown, the audiovisual input/output mechanisms of the gaming machine 1002 need not be limited to the illustrated displays 1018, 1026; speakers 1020a, 1020b and buttons 1032, 1034. Additional audiovisual input/output mechanisms may come in the form of touch-sensitive screens, haptic input/output devices such as vibrators, sub-woofers, microphones for picking up verbal requests or audible indications of excitement by the primary player or adjacent other persons and so on. In one embodiment, the chair 1003 may be instrumented so as to detect not only when the primary player 1007 is seated on it, but also when that player is jumping up and down or otherwise moving in the chair due to heightened emotions. This detected movement can be fed back to the services providing network 1004 for adaptively learning what gaming combinations tend to provide more excitement and/or entertainment. This detected movement can also be used by the interior cooling control system to determine if particle anti-lodging actions should be undertaken (reciprocal blowing of air, discussed below). With authorization by the primary player 1007, a microphone and/or motion detector on his/her mobile device 1006 may be activated to provide similar automated feedback. In one embodiment, portions of interface components which are mounted to the cabinet and directly interface with the exterior ambient environment are sealed off, fluid-flow-wise from remaining portions of these components that are directly cooled by the hermetically sealed and ultra-clean circulating gas. (See briefly 310 of FIG. 3.) Fluid impermeable gaskets (e.g., moisture proof and particle blocking; water-tight) may be used to provide the sealing off function.

In addition, a number of further devices (not shown) can be provided within the interior of the cabinet 1008. A portion of these devices is not visible through an aperture in the gaming machine cabinet 1008. For example, a gaming machine controller (GMC) which controls play of a wager-based game on the gaming machine can be found within the cabinet 1008. Typically, the gaming machine controller is secured within a separate lockable enclosure (e.g., a lock box whose interior is directly cooled by the hermetically sealed and clean circulating gas). Details of the gaming machine controller are described below with respect to element 1160 in FIG. 8.

As another example, a number of security and safety sensors can be placed within the interior of the cabinet 1008. The security sensors among these (e.g., see 1140 in FIG. 8) can be configured to detect access to the interior of the gaming machine 1002. For example, the sensors can be configured to detect when the locking mechanism 1016 is actuated, the door 1014 (and/or other security doors) is opened or a locking mechanism associated with the gaming machine controller enclosure is actuated. The safety sensors (not all explicitly shown) may be disposed about the cabinet interior for detecting excessive temperature levels and/or excessive moisture or other contaminant levels. A power source, operable separately from an external power supply, such as a battery can be provided which allows the security and safety sensors to operate and be monitored when the external power supply is not connected or stops functioning for other reasons. In one embodiment, after closure of the main access door 1014 and/or of other security doors, the reclosed interior portion is flushed clean with a flow of an appropriate one of finely filtered air, coarsely filtered air, hermetically sealed and clean gas or with an appropriate sequence of such flows (e.g., coarse air first, then fine air and finely a hermetically sealed and clean gas).

In particular embodiments, the cabinet 1008 can have a sheet metal exterior (e.g., a stainless steel exterior skeleton) designed to provide the rigidity needed to support top boxes, such as 1010 and light kits as well as to provide a serious deterrent to forced entry. For example, the exterior sheet metal can be sixteen gauge steel sheet. Additionally, the door, such as 1014, can be backed with sheet steel in the areas around the displays. Other materials, such as wood, wood composites and sealing gaskets can be incorporated into the cabinet and the example of sheet metal is provided for the purposes of illustration only. Interior lock boxes (not explicitly shown) may also be formed of sheet metal exteriors (e.g., a stainless steel exterior skeleton) designed to provide a serious deterrent to forced entry and in appropriate circumstances, designed to form latchably lockable and re-enterable part or parts of one or more hermetically sealed containment volumes in which a respective one or more clean thermal transfer gases circulate.

Speakers, such as 1020a and 1020b (only two shown, but there can be more elsewhere disposed), can be protected by one or more metal screens. In one embodiment, a speaker, such as 1020a or 1020b, can include a subwoofer speaker portion. In general, a sound system associated with the gaming machine 1002 can include an audio amplifier and one or more speakers of various types, such as subwoofers, midrange speakers, tweeters and two-way speakers that also accept voice input.

If the main cabinet 1008 is entered, a "DOOR OPEN TILT" can be displayed halting game play and causing a "DOOR OPEN" event to be sent to the slot accounting system in 1004. In one embodiment, this message can be displayed on the main display 1018. These events can also be stored to the power hit tolerant memory. Upon door closure, the "DOOR OPEN TILT" will be replaced with a "DOOR CLOSED TILT" that can clear after the completion of the next game cycle. Additionally, a logic "DOOR OPEN TILT" can occur if the logic door is opened. The logic door is configured to be lockable independent of how the switch wiring is installed. The gaming machine 1002 can be configured to initiate the logic DOOR "OPEN TILT" regardless of whether or not a lock is installed on the logic door.

The displays such as 1018, 1012 and 1026, the speakers 1020, the printer 1022, the bill acceptor 1024, the card reader 1028 and the button panel 1030 can be used to generate a play of a wager-based game on the gaming machine 1008. Further, the primary display 1018 can include a touchscreen function. The touchscreen function can be used to provide inputs used to play the wager-based game. Some examples of wager-based games that can be played include but are not limited to slot games, card games, bingo games and lottery games. The wager-based games are typically games of chance and utilize a random number generator to determine an outcome to the game.

In general, the wager-based games can be classified as Class II and Class III games. Class II games can include bingo, pull tabs, lottery, punch board, tip jars, instant bingo and other bingo like games. Class III games can include but are not limited to slot games, black jack, craps, poker and roulette.

As described above, the wager-based game can be a slot game. The play of the slot game can involve receiving a wager amount and initiating a start of the wager-based game. A selection of a wager amount and a start of the wager-based game can be performed using buttons, such as 1032 and 1034, on button panel 1030. In addition, the button panel can be used to perform gaming functions, such as selecting a number of lines to play in a slot game, selecting the amount to wager per line, initiating a cash-out and calling an attendant. These functions will vary for different types of games.

In some embodiments, a touch screen function can be provided in or adjacent to (e.g., over) one or more of the displays, such as 1012, 1018 and/or 1026. The combination of the display and touch screen can be used to perform gaming functions that performed using the button panel 1030. Also, display and touch screen can be used to perform operator features, such as providing a game playback or a hand pay.

The play of wager-based games, such as a slot game, can involve making a wager and then generating and outputting a game presentation. The bet amount can be indicated in display area 1042. The game presentation can include a number of game features that vary from game to game. The game features provide variety in how the outcome to the wager-based is presented. For example, an award to the outcome of the game can be presented in a series of steps that vary from game to game. In some instances, a portion of the total award for a game can be awarded in each step. The steps and their graphical presentation can be referred to as game features. In various embodiments, information associated with one or more of the steps can be stored to a power hit tolerant memory. The power hit tolerant memory is discussed in more detail with respect to FIG. 10.

As an example, a portion of a slot game outcome presentation is shown on display 1018. The slot game outcome presentation can include displaying a plurality of normal reel symbols, such as pointed to by reference 1038 (e.g., blazing sun symbol, wild card symbol, bonus symbol etc.). During the game outcome presentation, the symbols can appear to move on the display 1018 (e.g., vertically to simulate a rotating reel). In addition, symbols can be made to appear to move off the display 1018 and new symbols can be made to newly appear onto the display 1018.

Different combinations of symbols can appear on the primary display 1018 for some period of time, which varies for each instance of the wager-based game that is played. At the end of an action-filled presentation, the symbols can be made to appear to settle and reach a final position or spin outcome. Then an award associated with the game outcome is presented on the display. The total award for the game can be indicated in display area 1044 for example and the total credits available on the gaming machine after the award can be indicated in display area 1040.

In particular embodiments, a portion of the award to the outcome of a game or spin can be presented as a bonus game or a bonus spin (e.g., a free spin). The portion of the award can be referred to a bonus award. The presentation of the bonus award can also be presented in steps where a portion of the bonus award is awarded in each step. These steps can be referred to as bonus game features. In some embodiments, information associated with the steps in the bonus game can be stored to the power hit tolerant memory. In various embodiments, components of the bonus game presentation can be presented on one or more of display 1018, 1012 and 1026.

More specifically in one embodiment, when a given spin takes place (e.g., indicated as such in one of display areas 1018, 1012 and 1026), a by-chance bonus awarding wheel is presented for actuation by the primary player 1007 (or by a casino dealer in case of a table game) and when actuated, it starts spinning. As the symbols of the spinning wheel in the primary display area 1018 start settling into a near-final outcome state, a relatively large horizontal announcement area may first indicate how close to a jackpot win is the state of the spinning wheel, and then when the wheel finally settles into its final outcome state, announcement area may indicate the win (e.g., "Mini-Jackpot Hit Here!!!) or how close the spin came (e.g., "Missed by one rung!"—not shown). The large announcement area may also be used to indicate the winning of low frequency hands or symbol patterns (e.g., "Royal Flush Here!!"—not shown).

Next, referring to FIG. 2, further details of one embodiment of the network services providing portion 1004 and of gaming machine operations, including organization of plural machines as banks disposed close to one another on a carpeted floor 1003b' and possible points of weakness due to such organization are described. In FIG. 2, gaming system 1050 includes three banks of gaming machines, 1052a, 1052b and 1052c with three side-by-side slot machines in each bank. The choice of three machines per bank is merely for purposes of illustration. A different number of side-by-side slot machines in each bank could be used (e.g., 4, 5, 6 etc.). What is of importance here is how many machines (or banks of such machines multiplied by the machines per bank factor) can be practically assigned to participate in each kind of game (e.g., a high frequency progressive jackpot pool) without running into problems such as when too many people crowd into the area with drinks, snacks, cigarettes and emit undesirably high levels of contaminants (e.g., smoke, dust, moisture, rubbed off carpet fibers, etc.) into the local ambient. It has been found that the tars and nicotine in cigarette smoke can create sticky films inside the interiors of unsealed cabinets where the sticky films have dust, carpet fibers, skin dandruff, plant pollen and other thermally insulative materials adhered to them so as to create blankets over all interior components that prevent proper cooling. This is believed to lead to undesirably reduced MTBF's. On the other hand, it is desirable from a revenue generating perspective to encourage large concentrations of players to gather about banks of machines they consider "lucky" and to allow all of them to play in that concentrated area.

The network services providing portion 1004 includes a central determination server 1054, a local progressives server 1056, a wide area progressives server 1058, a player tracking/slot accounting system server 1060 and ticket-in/ticket-out (TITO) server 1062. In gaming system 1050, all of the gaming machines in each bank, 1052a, 1052b and 1052c, are operatively coupled to the slot accounting system server 1060 and the TITO server 1062. However, for purpose of illustration it is assumed that only the gaming machines in bank 1052a are coupled to the central determination server 1054. Further, it is assumed that only gaming machines in bank 1052b and display 1068 are coupled to the local progressive server 1056. Finally, it is assumed that only the gaming machines in bank 1052c are coupled to the wide area progressive server 1058. The communication couplings between the gaming machines in each bank and the servers 1054, 1056, 1058, 1060 and 1062 can be wired connections, wireless connections or various combinations/permutations thereof.

In various embodiments, the central determination server 1054 can be used to generate a controlling portion of the game played on the gaming machines in bank 1052a. For example, the central determination server 1054 can be used to generate random numbers (by any of a variety of RNG techniques including those corresponding to examples mentioned above) used to determine outcomes to the games played in bank 1052a. In another example, the central determination server 1054 can be used to generate all or a portion of the graphics used during play of the games on the gaming machines in bank 1052a. For instance, the central determination server 1054 can be configured to stream a graphical presentation of a game to a gaming machine, such as that of upper display graphics 1064 and/or of the gaming machine's lower displays. (Lower displays not numbered here because primary player 1062a is illustrated obstructing those further displays.) The streamed upper display graphics 1064 may include that which on occasion (e.g., randomly or pseudo-randomly) reveals an active special bonus situation (e.g., Possible Jackpot win Here), reveals the awarding of a substantial prize (e.g., Jackpot !!! in area 1012e). The streamed graphical presentations can be output to respective displays on respective ones of the gaming machines and also to additional larger displays mounted on walls or other fixtures near the respective bank of machines. Because execution of gaming actions within the central determination server 1054 takes priority over the updating of the displays (signages) on the external machines (e.g., those of bank 1052a), there may be a slight delay between when an outcome of a specific gaming action is internally determined in the central determination server 1054 and when the displays (signages) on corresponding external machines (or signages on nearby additional displays) get updated to reflect the latest outcomes. This will be referred to herein as signage latency. Signage latency can vary as function of work load placed by higher priority operations on the data processing resources of the network services providing block 1004. If some of the circuits are overheating, processor clocking speeds may have to be reduced and signage latency may undesirably increase.

In one embodiment, the central determination server 1054 can be used to randomly generate numbers and/or other symbols used in a bingo type games played on the gaming machine in bank 1052*a*. These bingo type games are often referred to as class II games whereas traditional slot machines are referred to as class III games. In class II games, a draw of numbers (and/or other symbols) is made. The numbers/symbols can be mapped to a bingo card or equivalent, which the player purchases to play the bingo type game and which the player (e.g., 1062*b*) focuses on as the numbers/symbols are called or otherwise published. The announced/published draw of numbers/symbols can result in at least one winning game combination on the bingo type cards participating in the current bingo type game. In some games, the first player to recognize and call (or otherwise publicly indicate) his/her completion of a bingo like pattern wins the entire prize (a winner takes all rule for the first-in-time winner). In some other games, all the players who recognize and call their completion of a bingo pattern within a predetermined first time window after the last bingo number was announced, split the prize or all win the same prize amount. In yet other games, the machine system automatically determines who the winners are without need for player recognition and call indication.

The central determination server 1054 can be configured to repeat the number draws for the bingo type games at regular intervals. For example, number draws can be repeated every 20 milliseconds or according to a longer interval period. Players at the various gaming machines coupled to the central determination server 1054, such as the players at the gaming machine in bank 1052*a*, can initiate bingo games which utilize the bingo numbers from a particular bingo number draw. The bingo numbers in the number draw can be mapped to a bingo card displayed on the screen of the gaming machine, such as on display 1064.

Wins can be indicated by a winning pattern on the bingo card, such as four in a row or four corners. In response to a winning pattern on a bingo card on a particular gaming machine, the central determination server 1054 can send a prize amount associated with the win to the gaming machine with the winning pattern. This prize amount can be displayed on the gaming machine and the credits associated with the prize amount can be deposited on the gaming machine. For example, win of a bingo game on gaming machine 1064 can result in a prize amount being displayed on the main display. Further, the prize amount can be deposited as credits on the gaming machine 1064 such that the credits are available for additional game play.

In one embodiment, the prize amount can be output to look like a slot game. For example, if the prize amount is ten credits. Video reels can be displayed spinning on a main display of the gaming machine and a reel combination associated with a ten credit win in a slot game can be output to the display screen. If the outcome to the bingo game on a particular gaming machine is no award (e.g., because the player's call of bingo came after the strict adherence timing window closes), then the video reels can be displayed spinning and a reel combination associated with no award in the slot game can be displayed on the gaming machine. This process can be repeated on various participating gaming machines, as number draws for various bingo games are initiated and completed on the central determination server 1054. The local progressive server 1056 can be used to generate one or more progressive prizes that are limited to a local group of gaming machines, such as only the gaming machines in bank 1052*b*. When games are played on the gaming machine in bank 1052*b*, an amount of each wager (a predetermined or variable fraction) can be contributed to one or more progressive prizes that accumulate in a respective progressive contribution fund. The local progressive server can receive the contribution amounts from the gaming machines linked to the progressive game and can keep track of the prize amounts associated with the one or more progressive prizes. The prize amounts valid at a given time for the one or more progressive prizes can be output to displays on the participating gaming machines as well as to separate displays (cabinet enclosed signages) near the participating gaming machines.

The local progressive server 1056 can be configured to receive information regarding gaming events on the participating gaming machines. For example, the local progressive server 1056 can be configured to receive a notification from each of the participating gaming machines when a game outcome has occurred associated with a win of a progressive prize. In other examples, the local progressive server can be configured to receive gaming information, such as when each game is played on one of the participating gaming machines, an amount of wagered for each game and when one or more type of game outcomes occur on each of the gaming machines.

The gaming information associated with gaming events on the one or more gaming machines can provide a basis for additional bonus scenarios. For example, a bonus award can be triggered on one of the gaming machines after a random number of games are played on the gaming machines as a group. As another example, a bonus award can be triggered on one of the gaming machines after a particular game outcome occurs a random number of times on the participating gaming machines as a group, such as a particular combination of symbols appearing a random number of times.

The wide area progressive server 1058 is connected to the gaming machines in bank 1052*c* and display 1066. The wide area progressive server 1058 can be used to enable a progressive game played on gaming machines distributed over a wide area, such as multiple casinos distributed within a state or other such jurisdiction. Similar to the local progressive server 1058, when wagers are made, the wide area progressive server 1058 can receive contributions to the progressive prize from the participating gaming machines. The wide area progressive server 1058 can report these contributions to a remote device which tracks the total progressive jackpot. Further, if a progressive jackpot is won on one of the gaming machines to which it is connected, the wide area progressive server 1058 event can be reported to the remote device. Yet further, the wide area progressive server 1058 can receive a current progressive jackpot amount from the remote device. The current progressive jackpot amount can be reported on displays on the gaming machines participating in the progressive jackpot and/or nearby signage, such as 1068.

An exemplary display 1068 of yet another gaming machine or other display device (e.g., wide area display device) can have a digital sign controller 1070. The digital sign controller 1070 can have a network interface which allows it to communicate with a remote device, such as the wide area progressive server 1058. In this example, the digital sign controller 1070 can be configured to output information to display 1068 associated with the progressive game, such as a current jackpot amount. In some instances, due to differences between meter update speed and signage update speed, the displayed as current jackpot amount may be incorrect because a split second earlier, one of the players (e.g., 1062*a*) may have already won the jackpot. Other players (e.g., 1062*b*) who are looking to the slow-updated displays (e.g., 1068) may feel upset if the late displays show (or seem to have just shown) a higher amount and yet that not-first-in-time winner is awarded a lower amount. Such customer upsetting delays may be due in part to excessive temperatures building up in some cabinets and forcing temporary slowing or stoppages of the affected components.

In general, displays with digital sign controllers can be provided throughout a gaming environment, such as casino. The digital sign controller, such as 1070, can be configured to communicate with a remote device. The remote device can be configured to send information to the digital sign controller to output to a display. The information can include video, audio and picture data. Further, the remote device can be configured to send commands to the display, such as a command to output information to the display. In one embodiment, the wide area display devices (e.g., 1068) may provide announcements of when particular gaming machines (e.g., 1002) in the local area have awarded beyond a predetermined threshold number.

The slot accounting system portion of server 1060 can receive accounting information from each of the gaming machine in system 1050, such as an amount wagered for each game and amounts awarded on each gaming machine and/or the number of further extra gains awarded due to initially settled upon outcome combinations (e.g., K, A, J, Q) and follow up bonus award opportunities. The server 1060 can also receive information which uniquely identifies each gaming machine including a machine ID number and a current game being played on the gaming machine. The accounting information can be used for auditing purposes.

The player tracking system portion of server 1060 can track the game play of individual users. For example, a player can input account information into one of the gaming machines that is associated with a player tracking account that has been previously set-up. Based on the account information, a particular player tracking account can be located. The player tracking account can include information which identifies an individual user, such as user 1062*a* (User 1062*a* can be playing games at one or more of the gaming machines in bank 1052*a*.). The player tracking account information can include a player's name, address, phone number, gender, etc. It is to be understood that the graphics presentations on any given gaming machine can be structured for entertainment and heightened emotions and/or expectations of not only the primary player 1062*a* but also for that of nearby other persons 1062*b*.

In one embodiment, a player, such as user 1062*a*, can insert a player tracking card in a card reader (e.g., see card reader 1022 in FIG. 1). The card reader can read player tracking account information from the player tracking card, such as on a magnetic strip on the card, and send the information to the player tracking/slot account system server 1060. Based upon the received player tracking account information, the player tracking system portion of server 1060 can locate a player tracking account.

The player tracking account information can be input via other means on the gaming machine. For example, as shown in FIG. 1, the gaming machine 1002 may be able to wirelessly communicate with a mobile device, such as 1006. Thus, in one embodiment, the gaming machine 1002 may be configured to directly receive player tracking account information from a mobile device. In another embodiment, the gaming machine 1002 may be configured to generate an input interface on a touch screen display that allows a player to input player tracking account information.

After the player provides account information and an account is located, the player tracking system can enter accounting information associated with a player's game play into the identified player tracking account, such as an amount wagered over time. As described above with respect to FIG. 1, the accounting information associated with a player's game play can provide a basis for awarding comps to the player. For example, based upon a player's previous game play, the player tracking system portion of server 1060 can send an amount credits to the gaming machine on which the player is playing. In another example, the player tracking system portion of server 1060 can send a command to a printer (e.g., see 1022 in FIG. 1) on the gaming machine on which the player is playing to print out a ticket. The ticket can be redeemable for goods or services or a discount on goods or services, such as a free meal or discount a meal.

As described above, each of the gaming machines can be coupled to a ticket-in/ticket out (TITO) server 1062. TITO server 1062 can be used to generate and validate instruments associated with a credit and/or cash value. One example of an instrument, which can be generated and validated, is a printed ticket. Another example is a digital instrument, such as a printed ticket stored in a digital form. In one embodiment, a digital instrument can be stored on an electronic device carried by a user, such as a mobile device carried by user 1062*a*.

As an example, when a printer, such as 1022, is employed in a "cash out," the gaming machine controller (e.g., see 1160 in FIG. 8) can contact a TITO server (e.g., see 1062 in FIG. 2) with a cash out amount. In response, the TITO server can generate a unique number, associate the unique number with a value and send the gaming machine a unique number. The unique number can be sent to a printer (e.g., see printer 1022 in FIG. 1). Then, the printer can print a ticket with the unique number, such as a unique number encoded in a bar-code, and a value of the ticket, such as five dollars.

When the ticket is later presented for redemption, the unique number can be used to validate the ticket. For example, the user 1062*a* can "cash out" at a first gaming machine, such as 1064 in bank 1052*a*, and receive a printed ticket with a unique number generated by the TITO server 1062. Then, the user 1062*a* can go to a gaming second gaming machine, such as 1066 in bank 1052*c*, and insert the ticket into a bill acceptor (e.g., see 1024 in FIG. 1). The second gaming machine 1066 can contact the TITO server 1062 and send the ticket information, i.e., the unique number read from the ticket, to server 1062. Then, the server 1062 can validate the ticket and send back to the second gaming machine 1066 an amount of credits to deposit on the second gaming machine. The deposited credits can be used for additional game play.

In these examples, the servers can include processors, memory and communication interfaces. Various gaming functions are associated with each of the servers, 1054, 1056, 1058, 1060 and 1062. The described distribution of gaming functions is for the purposes of illustration in only. In alternate embodiments, combinations of gaming functions can be combined on the same server or repeated on different servers. For example, the central determination server 1054 can also be configured to provide a local progressive to the bank of gaming machine 1052*a*. In another example, the local progressive server 1056 can be configured to provide a number of different progressive prizes for different groups of gaming machines. In yet another example, the player tracking system portion of server 1060 can be configured to provide bonusing features at each of the gaming machines.

In FIG. 2, while gaming machines, such as those of displays 1064 or 1066, are operational, a user such as 1062a or 1062b can engage in game play. Under some conditions, such as tilt conditions, game play can be suspended and an intervention by an operator, such as 1065, may be required. An operator intervention may require an operator, such as 1065, to be directly present at a gaming machine, such as that of display 1064. For example, the presence of an operator may be required to directly access an interior of the gaming machine to clear a tilt condition (e.g., one caused by accumulated dirt layers within the cabinet interior). In other examples, an operator may be able to clear a tilt condition from a remote location via a near field or other communication coupling with the gaming machine (e.g., using a mobile device such as 1006).

In one embodiment, during game play, the gaming machine can award an amount above some threshold amount. Prior to receiving the award, an operator, such as 1065, can be sent to the gaming machine to have the player fill out a form for tax purposes. In the United States, this tax form is referred to as a W2G form. In addition, the operator may verify that the gaming machine was operating properly when the award was made prior to the player receiving the award. For example, if the gaming machine indicates a progressive jackpot has been won, the operator may check to verify the gaming machine was operating properly. In a hand pay, the operator, such as 1065, may provide an instrument redeemable for the jackpot amount.

As described above and in more detail with respect to FIGS. 1, 2, 10 and 11 an operator, such as 1065, may be required to be physically present at a gaming machine, such as 1064 and 1066, to clear a tilt condition and/or to deal with other customer needs or desires. For example, to clear a tilt condition, the operator, such as 1065, may have to access an interior of a gaming machine to remove built-up dirt, to clear a paper jam in a printer or a bill acceptor (e.g., see printer 1022 and bill acceptor 1024 in FIG. 1). In another example, to clear a tilt condition, the operator 1065 may have to access an interior of the gaming machine, such as 1064, to add more tickets to a ticket printer or empty a note stacker associated with the bill acceptor. For some tilt conditions, the gaming machine operator 1065 may access a menu output on a main display of the gaming machine, such as 1064 or 1066, to perform a RAM clear. RAM clears are described in more detail below with respect to FIG. 8. In yet another example, one or more customers may feel upset based on their perception of when certain timing windows closed or certain prize amounts changed and they may wish to lodge complaints or disputes with the operator.

As earlier mentioned, the various data processing devices (e.g., 1054-1064) in the network services providing block 1004 and in the individual slot or other software driven gaming apparatuses (e.g., 1052a-1052c) or combinations thereof are generally dependent on called upon and executed software programs (not individually shown) where the actual gaming action runs rapidly and is recorded on official "meters" within a secured part of the system. Non-official displays or other signages (e.g., 1068) may thereafter get updated on slower basis as system data processing bandwidth permits. The execution of the official gaming actions takes priority. A conventional installation of one or more software programs for carrying out the official gaming actions may proceed as follows. One or more software coding persons or code updating persons generate corresponding pieces of source code. The generated source code or codes are compiled by an automated compiler. Installable object codes produced by the compiler are transmitted to a build assembler. The build assembler creates an installation build from the received object codes and transmits the installation build to an appropriate automated software installer (not shown). At install time, the software installer automatically copies the to-be-installed object codes into one or more respective portions of the network services providing hardware 1004 and at the same time generates respective SHA-1 hashes of respective segments of the being-installed object codes. The generated SHA-1 hashes are automatically stored into corresponding records within a database server (not shown).

After installation, an automated software verifier may be activated and used for comparing hashes of the installed software segments (which should be the same as corresponding segments of the compiled code) against the respective hashes that had been stored in the database server. If all of the compared hashes match, then the installed software segments are deemed ready to be run (executed) within the network services providing hardware 1004 and/or in whatever destination data processing units (e.g., in respective ones of gaming apparatuses 1052a-1052c) they are predestined to be transmitted to by way of a secured transmission mechanism (not shown). In one embodiment, each time new or updated software is to be installed in the network services providing hardware 1004, a government official or other authorized agent/inspector authorized to do so, is called in to oversee the installation process and to obtain as an output of the software installer of its generated SHA-1 hashes in the form of a GLI certification letter that is in compliance with the latest government requirements and includes an unalterable copy of the SHA-1 hashes created for the respective segments of the received and installed object codes. In this way the integrity of big ticket jackpot runs may be preserved.

Thereafter, the government official/agent may return at any time to run the software verifier for the purpose of accessing respective segments of the installed object codes within the network services providing hardware 1004 and automatically generating SHA-1 hashes for those accessed respective segments of the installed object codes and then comparing the generated hash values against the SHA-1 hashes in the GLI certification letter to thereby verify that nothing has changed.

When the verified software is up and running, task completion speed may be a function of several variables, including temperature levels inside and outside the cabinets. If temperatures are too high (e.g., above predetermined thresholds), the clocking speeds of some components may have to be temporarily reduced to avoid permanent damage, some operations may have to be temporarily stopped, cooling fans may have to be run at higher speeds to get cabinet internal temperatures down to acceptable levels. Other factors that may interfere with smooth running of casino operations can include intermittent connections between circuits, faulty switches, corrosion impacted components and so on.

Figure 3:
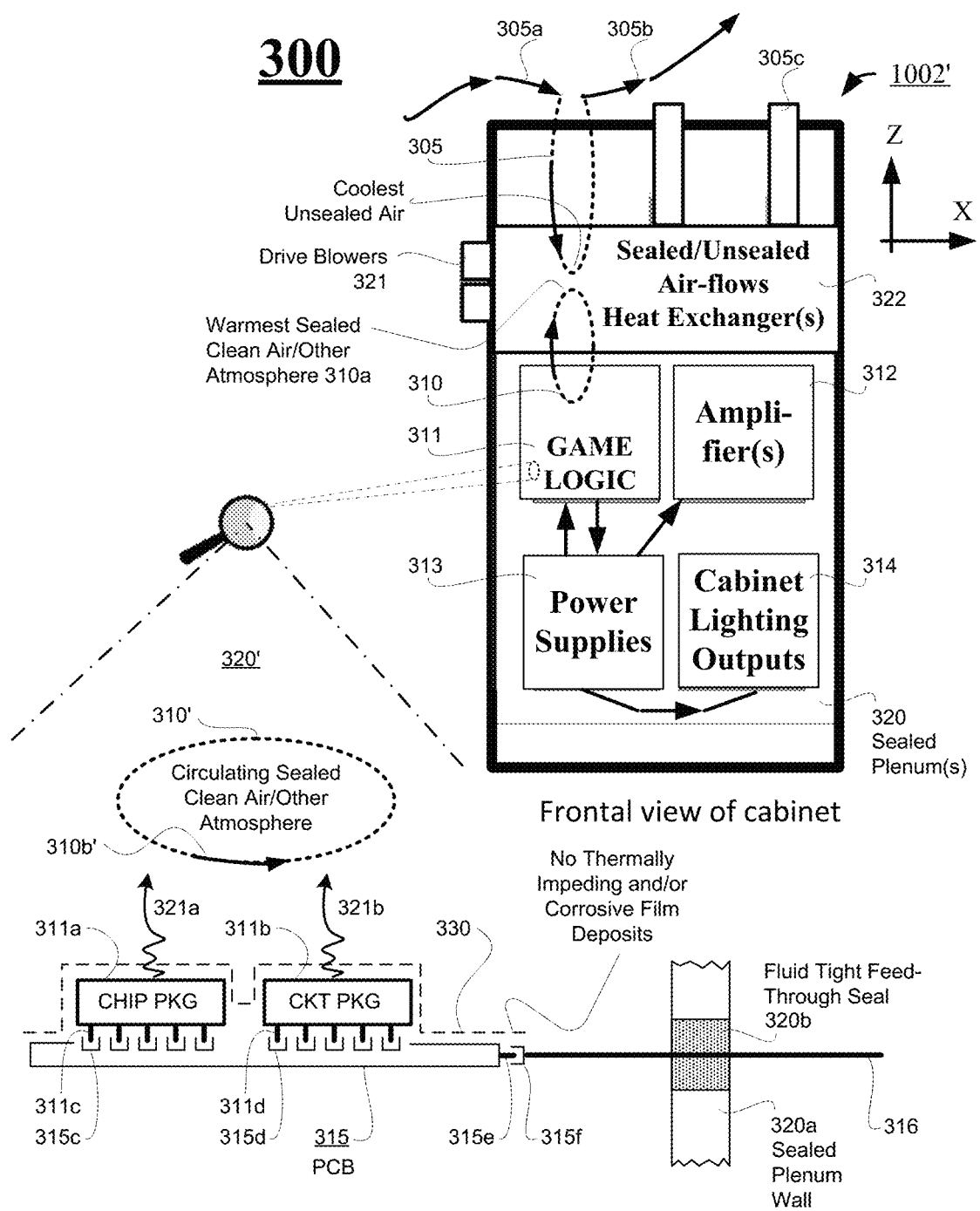
FIG. 3 schematically illustrates a gaming machine in accordance with the present disclosure that is configured to have a sealed and clean cooling gas (e.g., clean air) circulating in a loop to cool at least some of securely enclosed components of the gaming machine.
Figure 4A:
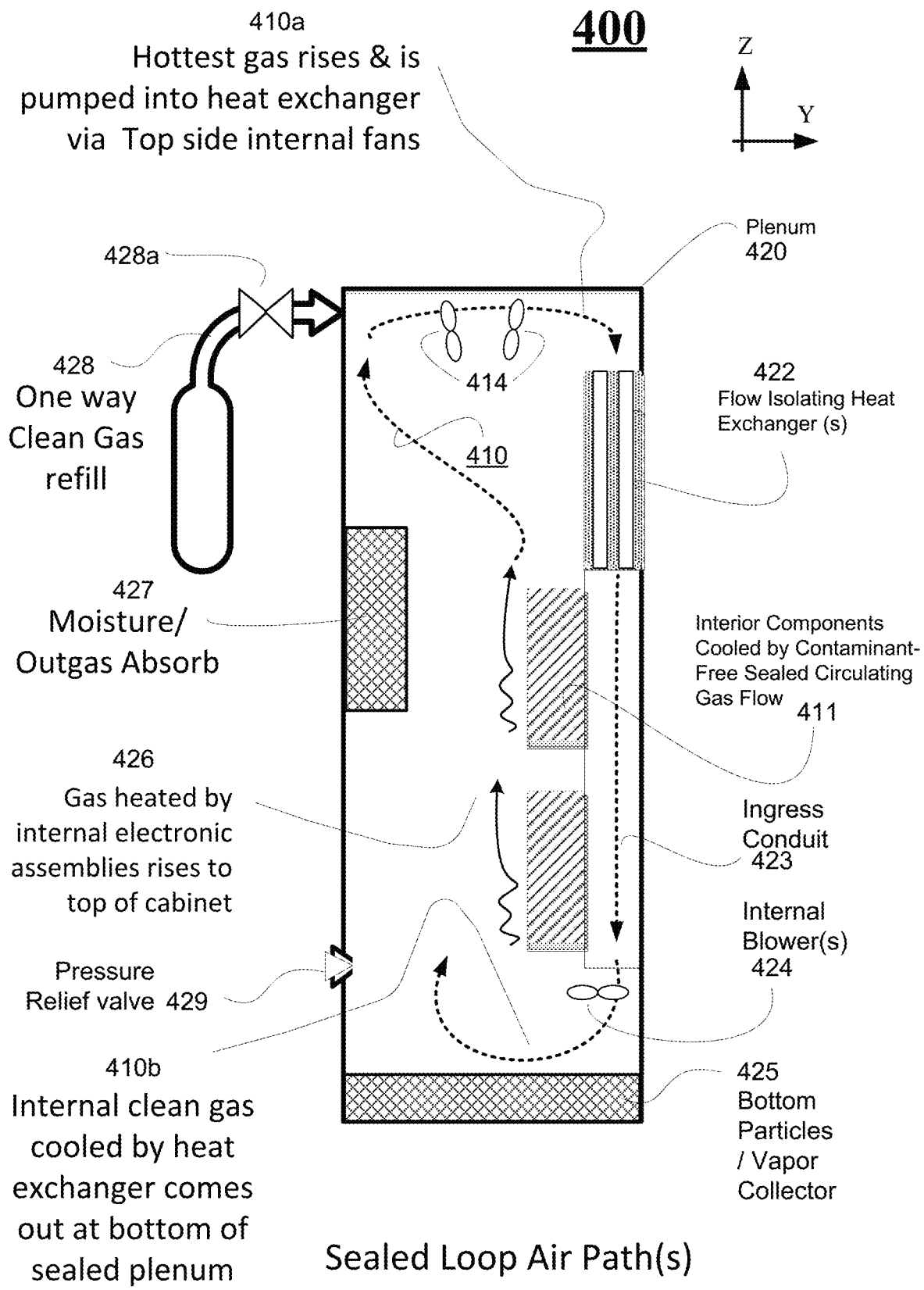
FIG. 4A schematically illustrates a circulation scheme for a sealed gas cooling system in accordance with the present disclosure.
Figure 4B:
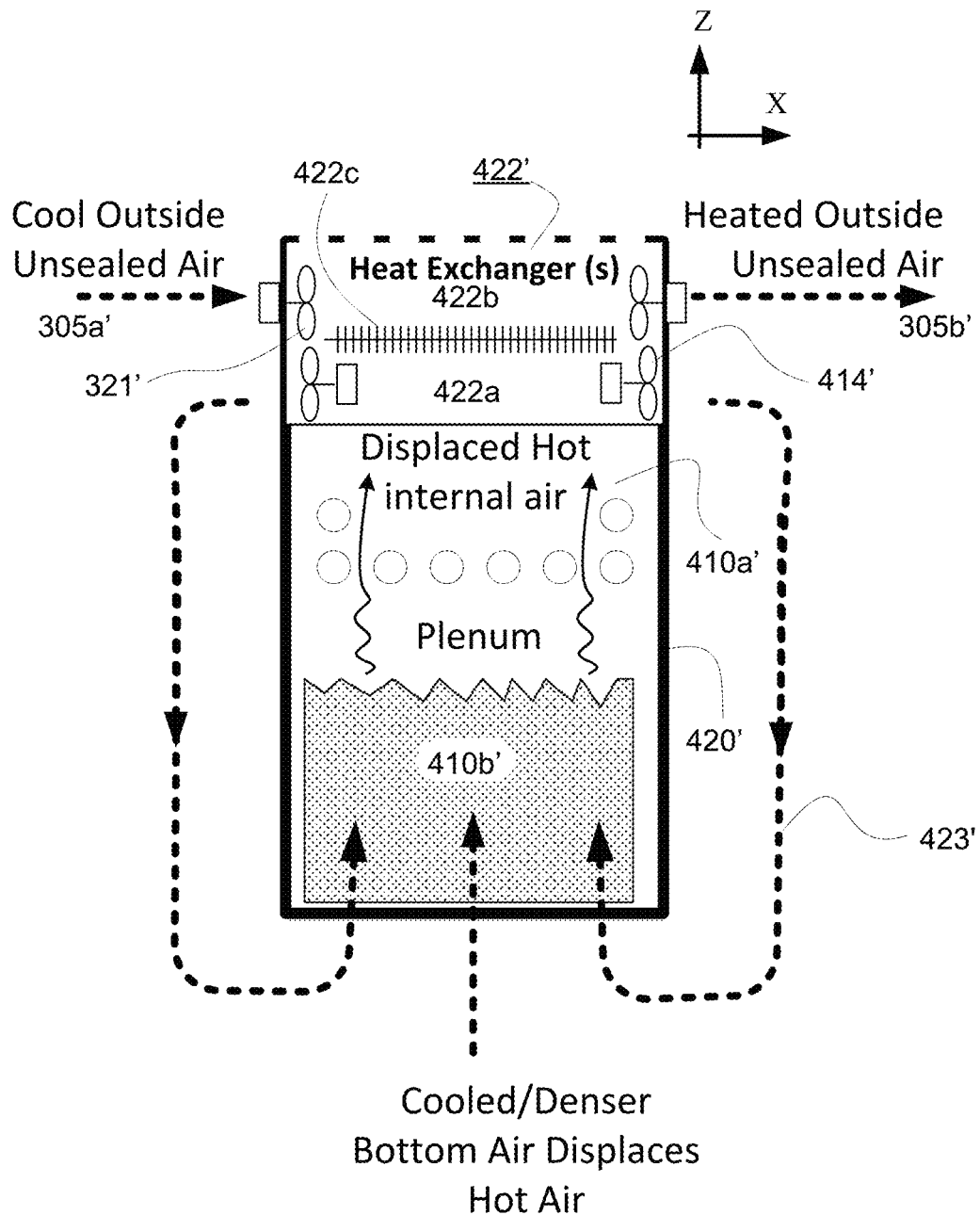
FIG. 4B schematically illustrates a thermal transfer scheme used in a sealed gas cooling system in accordance with the present disclosure.

Referring to FIG. 3, part of a cabinet cooling system in accordance with the present disclosure is described. It is to be appreciated that the present disclosure contemplates the simultaneous use of plural cooling subsystems and/or atmosphere flushing/purging subsystems within a primary enclosing cabinet where, as mentioned above, a variety of different gases may be used as appropriate, including for example, unsealed finely filtered air, unsealed coarsely filtered air, unsealed unfiltered ambient air and hermetically sealed gases of various levels of cleanliness (used as appropriate for example to achieve cost minimization goals). In FIG. 3, a frontal, but see-through view of part of primary cabinet 1002' is shown when facing towards the Z–Y plane. The illustrated part includes one or more air-tight-wise sealed plenums 320 as shall be detailed below. One or more multi-flow heat exchangers 322 are provided each configured to have an air-tight sealed (e.g., hermetically sealed) and clean gas circulation flow 310 moving through them and then looping through a corresponding one or more of the plenums 320. The multi-flow heat exchanger(s) 322 is/are preferably provided inside and near the top (in the Z direction) of the primary cabinet 1002' such that ambient air 305*b* warmed by the heat exchanger(s) 322 can be discharged immediately therefrom and out of the cabinet near a top portion of the primary cabinet 1002' (e.g., by way of optional exhaust chimneys 305*c*). More specifically, an unsealed flow 305 of ambient air (filtered or unfiltered) is schematically shown as having a relatively cool ingress portion 305*a* entering the primary cabinet 1002' and a relatively warmer egress portion 305*b* leaving the cabinet, where the egress portion 305*b* carries heat energy away from the cabinet 1002' preferably moving out an upper back portion of the cabinet. The hermetically sealed and closed, second flow 310 of relatively clean or ultra-air and/or other gases is schematically shown as having its relatively warmest portion 310*a* passing heat energy (through a heat transferring interface of the heat exchanger—not shown, see briefly 422*c* of FIG. 4B) to the unsealed first flow 305, preferably with the warmest portion 310*a* of the sealed and closed, second flow 310 thermally engaging with the coolest portion 305*a* of the unsealed first flow 305 so as to provide a substantial thermal gradient.

The hermetically sealed and closed, second flow 310 loops past one or more heat emitting internal components (e.g., 311, 313) of the cabinet 1002' so as to absorb heat energy from them and then carry the absorbed heat energy up (substantially in the +Z direction) to the heat exchanger(s) 322 for transferring the absorbed heat energy to the unsealed air flow 305 and ultimately out and away from the cabinet 1002' by way of egress flow portion 305*b*. Because it is generally warmer than the average temperature of the ambient air, the egress portion 305*b* of the unsealed first flow 305 will typically rise up above and away from the top of the cabinet 1002'. This natural flow may be assisted by action air blowers (not shown—see briefly 321' of FIG. 4B). In one embodiment, one or more chimneys 305*c* are provided for guiding the egress portion 305*b* up above and away from the top of the cabinet 1002' so that the warmed air 305*b* moves away from gaming machine players and bystanders. In one embodiment, the chimneys 305*c* each have two or more spaced apart security screens oriented to block straight line access through each others apertures and into the interior of the cabinet 1002'. Power lines and/or other electromagnetic linkages (not shown) may be coaxially extended from the casino ceiling and through one or more of the hot air exhausting chimneys 305*c*.

Examples of heat generating internal components of the cabinet 1002' are schematically illustrated at 311, 312, 313 and 314. These heat generating internal components may all be disposed within a single plenum structure 320 or alternatively distributed to be housed in separate plenum structures. The plenum structures (320) may be disposed in a respective one or more locked security boxes provided within the primary cabinet 1002' and/or one or more of the locked security boxes may be configured to define a respective, air-tight sealed (e.g., hermetically sealed) plenum. As used herein, the term "plenum" is to be taken to mean a substantially hermetically sealed container into which contaminant containing fluids (gases and/or liquids) cannot normally enter from the outside (one exception being where a plenum access door is opened to service internal components). The here used term, "plenum" is not required to have a fluid pressure different from the ambient air and indeed, in one embodiment, the pressure inside the plenum structure 320 is substantially equal to that of the outside ambient air or slightly above by a predetermined amount. Although for sake of illustrative simplicity the hermetically sealed and closed, second flow 310 is shown looping only through the components-containing module denoted as game logic 311, it is to be understood that the second flow 310 may additionally, in one embodiment, snake through one or more of further modules 312-314 before carrying its absorbed heat energy back up to the heat exchanger(s) 322. If such a sequential/serial snaking is utilized, the module that requires the most cooling preferably receives the coolest portion of the second flow 310 right after it egresses from the heat exchanger(s) 322 while other modules that can operate at higher temperatures receive more downstream and thus warmer portions of that snaking serial flow 310. Alternatively, each of the modules 311-314 has its own copy of the second air-tight flow 310 (hermetically sealed and clean gas flow) looping through that module with the coolest portion of the second flow 310 entering through a respective bottom portion of the module and with warmest portion of the respective copy of second flow 310 egressing from an upper portion of the module. See briefly FIGS. 4A-4B which are detailed below.

In the illustrated example 300, four modules that are cooled by respective and/or shared loops of the second flow 310 are denoted as game logic 311, amplifiers 312, power supplies 313 and cabinet lighting outputs 314. For the illustrated embodiment, game logic 311 receives regulated power from power supplies module 313 and also controls how much power module 313 will deliver to the other modules. For example, if the casino is closed/idle during certain times of the day or week it might be advantageous to reduce power consumption of unneeded portion of the cabinet (e.g., bright lighting, loud-speakers etc.). When power consumption is reduced, heat produced inside the cabinet may be reduced and circulation speed of blowers inside may be reduced so as to further reduce power consumption.

While the illustrated embodiment has four modules 311-314, in other embodiments there can be more or less of such modules with respective similar of different functionalities. The game logic 311 typically includes digital data processing units (e.g., CPU's, APU's, GPU's, ASIC's) normally operating at relatively high frequencies (e.g., in the GHz ranges) and thereby generating significant amounts of locally concentrated heat. These various data processing units may each provide one or more functionalities including, but not limited to, general central data processing functions (CPU functions), specialized arithmetic processing functions (APU functions, including for example random number generations), specialized graphic image processing functions (GPU functions, including for example determining what gaming action animations will appear on the displays of associated gaming machines) and application specific functions (ASIC functions, including for example automated security and maintenance functions). Because of the locally concentrated heated generated by one or more of these various game logic units, module 311 may include heat sinks and/or cooling fans (not shown) thermally coupled to respective ones of the game logic components. In other words, although game logic module 311 is denoted as logic, it is not necessarily limited to containing only digital logic chips and may have many other components including those tasked with actively moving heat energy away from the chip packages for exhaust by way of a heat exhausting portion of the cabinet 1002' (e.g., ultimately by way of chimneys 305c).

Referring to magnified sample view 320' of FIG. 3, shown is a more detailed possible structure within the game logic module 311. It includes a printed circuit board (PCB) 315 having one or more of integrated circuit chips mounted as packaged units (e.g., 311a) either directly on the PCB or coupled thereto by way of contact-making socket structures 315c engaged with contactable terminals 311c (e.g., pins, contact bumps) of the IC packages (e.g., 311a) or of daughter boards (not shown). As mentioned, the various components of game logic module 311 are not limited to just chips (e.g., 311a) directly mounted to a respective one or more PCB's (e.g., 315) and may additionally include daughter boards (referred to more generally as circuit packages 311b) plugged into corresponding motherboards and optionally themselves having contact-making socket structures 315d engaged with respective contactable terminals 311d. The included components may include discrete ones such as inductors, capacitors, resistors, power transistors, sensors and so on. The main motherboard(s) 315 may themselves have contact-making structures 315e (e.g., edge connectors) configured for engaging with counter-part contacting 315f.

In prior configurations, where contaminant carrying ambient air (not shown) was allowed to circulate freely over the circuit components (e.g., 311a-315f), a relatively thick and thermally insulative film 330 (shown in phantom) tended to build over time on and between the components, especially in casino environments. The film (or films) could be composed of a variety of substances. Typically, tars, nicotine and/or other sticky substances from tobacco smoke would adhere to the exteriors of the circuit components (e.g., 311a-315f) followed by secondary adhesion of carpet fibers, human skin particles, hair particles, plant pollen and the like. The layering process can repeat many times to form thick carpets of thermally insulative films 330. These thermally insulative films 330 can impede the transfer of heat energy (e.g., represented by heat flows 321a and 321b) away from the respective circuit components (e.g., 311a-315f). Temperatures would then rise and lead to undesired secondary effects including, but not limited to, unwanted thermal expansions and associated mechanical stresses, faster thermal degradation of circuit components, increased rates of undesirable chemical reactions including corrosive ones. Because of the uncontrolled chemical nature of the prior, contaminant carrying ambient air (not shown), the developed film(s) 330 could include reactive substances which, with the aid of built up heat and moisture in the ambient air, could corrode away electrical contacts (e.g., 311c, 315d) within the modules or grow into spaces between such contacts, leading to increased contact resistance and possibly intermittent or broken contacts and circuit malfunction.

In accordance with the present disclosure however, a contaminant-free thermal transfer gas 310' is circulated within the plenum 320' in which one or more of the cabinet interior components (e.g., 311-314) are hermetically enclosed. As used herein, contaminant-free means one or more of: substantially free of, essentially free of, and completely free of tobacco smoke, dust, carpet fibers, human dandruff, plant pollen, insect or other pest particles or other such air borne debris which may undesirably coat or undesirably react with the hermetically enclosed components. The contaminant-free gas 310' may be comprised of pre-cleaned air optionally mixed with or replaced (wholly or partially) by one or more other gases that do not negatively affect operations of the co-enclosed cabinet interior components (e.g., 311-314). More specifically, the pre-cleaned injectable thermal transfer gas includes pre-cleaned air and/or other gases from which particles of sizes larger than a predetermined diameter (e.g., 3 microns) have been removed and vapors in excess of respective predetermined concentrations (e.g., those that may cause corrosion) have been removed. The other gases may be selected from a group having as representative members thereof, nitrogen (N2), carbon dioxide (CO2) and a noble gas of the periodic table. Aside from these relatively inert gases, molecules of heavier molecular weight (e.g., heavier than that of CH4 and) that are relatively chemically inert with respect to exposed surfaces in the hermetically sealed loop and remain gaseous within expected operating temperatures of the cabinet interior may be used, where the heavier molecular weight gases or vapors are included for their ability to better absorb heat (e.g., due to vibrations of greater numbers/kinds of molecular bonds, for example multiple C=C bonds). It is not an object of this disclosure to identify an optimal gas or gas mixtures for thermal transfer. It is noted that simple clean air may be sufficient and cost effective. Carbon dioxide (CO2) is known to be heavier than air of same temperature and to be a good absorber of infrared (IR) emissions. Nitrogen (N2) is the majority gas in normal air and generally does not chemically react at room temperature with other substances. One desired attribute of the contaminant-free gas 310' is that cooler portions thereof should be substantially denser (heavier) than warmer portions so that when the cooler portions are introduced at the bottom of the plenum (see briefly the flow coming out of blower(s) 424 of FIG. 4A) the introduced cooler portions will convectively displace warmer portions (see briefly 426 of FIG. 4A and 410a' of FIG. 4B) at least due to gravitational forces if not also due to the general direction of gas flow (e.g., as urged by blowers and/or other propelling devices and/or by guiding conduits or baffles).

The contaminant-free gas 310' may be initially introduced into the plenum interior from any convenient source(s) including for example, from one or more compressed gas cylinders (see briefly 428 of FIG. 4A) that are operatively and removably coupled to the plenum interior. If simple clean air is used, it can be produced on-site at the casino, for example in a back room where outdoor air (or air conditioned air) is captured, cycled through a series of filters, compressed and stored in cylinders. In one embodiment, the series of air filters includes a first filter (not shown) configured to capture air borne particulate matter including particular matter associated with the tobacco smoke. For example, a "true" HEPA filter can be configured to capture 99.97% of particles 0.3 microns in diameter or larger. However, other less efficient but less costly filters, such HVAC filters can be used. The second filter (not shown) in the series can include activated carbon and/or other porous absorbent materials having relatively large surface area due to interconnected pores (open pores). The activated carbon and/or other porous absorbent materials can adsorb volatile chemicals including those associated with smoke or any other pollution producing source. Some of the porous absorbent materials can convert gaseous pollutants, such as volatile organic compounds (VOC's) found in smoke, into nongaseous solid form where the latter can be captured by particulate entrapping filters (e.g., HEPA filters). The first and second filters can be provided as a single periodically replaceable unit or they can be provided as separate filters which are individually replaceable. As mentioned the cleaning flow through the series of filters takes place outside of the gaming machine cabinet using blowers or pumps outside the cabinet. Thus, heat is not generated inside the cabinet for producing these pre-cleaned gasses. In accordance with one aspect the present disclosure, different gradations of cleanliness may be used for different ones of the cabinet supplying gas sources (e.g., 428 of FIG. 4A), including moderately clean air/or-other-gas and more or ultra-cleaned air/or-other-gas. The moderately clean air/or-other-gas may be used for purging the containment volume of the plenum before the more or ultra-cleaned air/or-other-gas is substituted in for purpose of long term circulation and thermal transfer.

Although one set of embodiments uses on- or in-cabinet gas supplying sources (e.g., gas canister 428 of FIG. 4A) for causing the air-tight-wise sealed portions of the cabinet to be substantially or essentially free of contaminants, it is fully within the contemplation of the disclosure to allow for much less stringent requirements for cleanliness within the air-tight-wise sealed portions of the cabinet. As long as the air-tight-wise sealed and cooling-gas circulating portions of the cabinet are isolated on a long term basis from the dirtier ambient of the outside so that dust and/or other contaminants do not accumulate over the long term and thus interfere with thermal transfer and/or other attributes of critical cabinet interior components that is better than the alternative where the critical cabinet interior components (e.g., thermal transfer portions thereof) are exposed to the substantially dirtier ambient of a casino or other like external environment. Accordingly, in one embodiment, substantially or essentially clean air is introduced into the air-tight-wise sealed and cooling-gas circulating portions of the cabinet just before the cabinet is shipped to the casino with the expectation that over the long term, the air-tight-wise sealed and cooling-gas circulating portions of the cabinet will remain sealed and thus not subject to long term internal accumulation of dust and/or other contaminants present in the ambient exterior. If the access doors are on occasion opened for attending to tilt or other service-needing situations, the amount of time that the access doors are open should be relatively small compared to the total amount of time that the gaming machine is operated without having its air-tight-wise sealed and cooling-gas circulating portions exposed to the ambient. Thus improved operation is obtained even in such less than stringently clean modes of operation. In one embodiment, the cabinet is manufactured in a relatively clean factory air environment and just prior to shipping, even cleaner air is flushed through the air-tight-wise sealed and cooling-gas circulating portions of the cabinet to clean their interiors before they are sealed (e.g., and their seals are tagged with seal certifying date tags that break if violated) and shipped to the casino or like other usage environment. Cost effective improved operation may be obtained with such less stringent approaches.

In operation, the essentially or substantially contaminant-free gas 310' is circulated long term (e.g., between scheduled maintenance servicings) within the plenum 320 such that a relatively coolest portion 310b of that sealed circulating flow engages with design-specified heat emitting portions (e.g., surfaces, heat sinks, air intakes of on-package mounted cooling fans) of the co-enclosed cabinet interior (and/or lock box more interior) components (e.g., 311a, 311b). The contaminant-free and circulating gas 310' absorbs heat energy from these engaged-with heat emitting portions and then flows to the higher-up located heat exchanger(s) 322 to transfer the absorbed heat via heat transfer members of the exchanger(s) 322 to the passing through exterior air flow 305.

Since the sealed circulating flow of contaminant-free gas 310' is essentially or substantially free of contaminants such as those mentioned above, the undesired thermally-insulative and/or corrosive and/or electrically-interfering films 330 do not take hold or grow over the long term. Good thermal heat transfer (e.g., 321a, 321b) is maintained. Excessive thermal expansion due to relatively high cabinet internal temperatures is avoided. Good electrical contacts (e.g., 331c/315c and 315e/315f) are maintained. As a result, mean time between failures (MTBF) is reduced and the cost of operating the casino or other such gaming establishment is advantageously reduced.

Although it is preferable to include as many cabinet interior components as possible inside the one or more plenums (e.g., 320) that have respective and air-tight sealed and closed, contaminant-free gas(es) 310 circulating in them for purposes of heat removal, some connectors and/or components (e.g., feed-through connector 316) may have to extend through the sealed air-tight plenum wall 320a. In such cases, fluid tight feed-through sealants 320b (e.g., water-tight grommets) are used in the feed-through apertures for keeping the interior of the plenum sealed in air-tight manner. Examples of connectors and/or components that may have to extend through the plenum wall 320a may include primary power supplying lines (e.g., AC power), input/output lines, cables or optical fibers that connected to user interface devices (e.g., switches, buttons 1032, 1034 of FIG. 1), couplings to external RF antennas and/or optical communication devices and so forth.

Referring to the power supplies module 313 of FIG. 3, while the primary input power for the gaming machine 102' typically comes in from outside by way of a fluid tight feed-through sealant (e.g., 320b), cabinet internal voltages (e.g., regulated voltages, clocking signals) and the like are preferably generated inside the cabinet in a circulating clean air and/or other clean gas environment 320' so that power transistors, heat sinks, inductors, switching transformers, etc., are kept dust free and able to operate at optimum performance levels. In one embodiment, backup batteries are also contained within a respective clean gas environment like 320' so that proper cooling is provided and contact corrosion or contact degradation is avoided or reduced. The backup batteries may produce undesirable off gases or vapors. In one embodiment (see briefly 427 of FIG. 4A) a moisture and/or off gas absorbing element is included alongside the flow path of the circulating clean air and/or other clean gas 310 for absorbing such internally generated contaminants. Preferably the internal contaminant absorbers and/or filters (e.g., 425 of FIG. 4A) are disposed so as to not block the free flow of the circulating clean air/gas(es) 310.

Referring to the cabinet lighting outputs module 314 of FIG. 3, in some embodiments it is desirable to generate bright lights at the exterior of the cabinet for purpose of attracting players and producing various states of excitement. Various elements may be used to generate the bright lights including, but not limited to, LED's (e.g., backlighting LED's within LCD displays), laser diodes, gas discharge bulbs (e.g., plasma displays), incandescent bulbs, fluorescent bulbs (e.g., providing backlighting within LCD displays) and so on. Such light generating elements tend to produce significant amounts of heat. Accordingly, at least heat emitting portions of these light generating elements (e.g., heat sinks) are preferably contained within a respective clean gas environment like 320' so that proper cooling is provided and contact corrosion or contact degradation is avoided or reduced. In some instances, the entire bodies of the light generating elements are inside a respective clean gas environment while optical fibers and/or other optical communication mechanisms (e.g., mirrors, feed-through windows) transfer the optical energy to the outside.

Referring to the amplifiers module 312 of FIG. 3, in some embodiments it is desirable to output loud sounds to the exterior of the cabinet for purpose of attracting players and producing various states of excitement. Various elements may be used to generate the loud sounds (e.g., music, bells, gongs etc.). However, power amplifiers that driver the sound production elements (e.g., speakers, woofers, vibrators etc.) and/or drive other high power output components are preferably contained within a respective clean gas environment like 320' so that proper cooling is provided and contact corrosion or contact degradation is avoided or reduced.

Referring next to FIG. 4A, shown schematically is a side view example of an air-tight-wise sealed plenum 420 in which a circulating flow 410 of a clean heat transfer gas (e.g., clean air) is maintained and used for cooling cabinet interior components (e.g., 411) where the flow 410 includes a warmest portion 410a at its top and a coolest portion 410b at its bottom. The illustrated Z-Y axis indicates that the flow isolating heat exchanger(s) 422 is/are disposed at the back side of the cabinet (see also X-Y-Z frame of FIG. 1) at or near its top. It is to be understood that items 427, 428, 428a and 429 (each of which is optional and not necessarily present in all embodiments) may also be placed at the back side of the cabinet (in the +Y direction). However, for sake of avoiding illustrative clutter they are schematically shown disposed on the opposite front side. In practice, user interface devices such as displays, push buttons, etc. (not shown) are preferably positioned towards the front (in the −Y direction) and in one embodiment, protrude partially in an air-tight (e.g., hermetically) sealed fashion through the plenum wall while not compromising the hermetic sealing in of the circulating clean heat transfer gas 410. In other words, the front side of the illustrated plenum 420 (left side in FIG. 4A) may have cabinet lighting components partially and hermetically protruding therethrough to the exterior of the plenum or having optical transmission elements and/or electrical transmission elements (e.g., cables) protruding in hermetically sealed fashion therethrough to the exterior of the plenum for purpose of outputting generated lights (e.g., computer controlled lighting effects) to, and passing electrical and/or optical signals between the plenum and the front side of the cabinet. For these partially hermetically protruding through components, their respective heat emitting portions preferably remain inside the plenum interior. Also, while not shown, it is to be understood that the plenum 420 may have one or more hermetically re-sealable access doors through which access may be gained to interior components of the plenum 420.

The warmest portion 410a of the circulating flow 410 (and also the least dense due to its temperature) of the clean heat transfer gas is present at the top (in the +Z direction). This may occur due to at least one of two forcing factors. First, the force of gravity urges cooler and more dense portions (heavier subcomponents) of the transfer gas 410 down in the −Z direction where they displace relatively less dense portions (lighter subcomponents) of the transfer gas and urge the latter upwards in the +Z direction. Secondly, one or more gas blowers (e.g., electrically driven fans) 414 and 424 are operated to maintain the indicated direction of flow 410 of the circulating clean heat transfer gas. One aspect of the present disclosure of invention is that gas circulating blowers (e.g., electrically driven fans 414 and 424) require less power to keep the this natural convection flow of the circulating gas 410 going than would be needed for unnaturally forced circulations (e.g., for trying to force hot air down and cool air up). As a result less electrical energy is consumed over the long run for maintaining the natural convection flow. (When heat energy is absorbed from a portion of the gas 410 while the latter is flowing through the top-wise disposed heat exchanger 422, that portion of gas 410 becomes more dense, heavier and tends to drop down along conduit 423 due to the force of gravity.)

The warmest portion 410a of the circulating flow 410 is urged (e.g., by action of one or more top side blowers 414) to pass through the one or more flow-isolating passage ways of heat exchanger(s) 422 where heat energy from the flow is transferred to a separate flow (e.g., 305 of FIG. 3) of ambient air. The cooled flow is then guided downwardly by an ingress conduit 423 into a substantially bottom most part of the plenum 420. It is to be understood that although the flow-isolating heat exchanger(s) 422 are shown to be wholly located internally within the plenum, this is one of many possible topological configurations. A more detailed description of that topological arrangement is provided below in conjunction with FIG. 5C. In other topological arrangements, at least part or some of the heat exchangers 422 will protrude in air-tight fashion through to the exterior of the plenum or be positioned wholly behind the back plenum wall (the farthest wall in the +Y direction) to receive the heat absorbing flow (e.g., 305 of FIG. 3) of unsealed ambient air (where the latter may be partly pre-filtered to remove large air borne debris from it). In an alternate embodiment, all of the flow-isolating heat exchanger(s) 422 is/are located outside the plenum 420 (but still securely enclosed within the equipment cabinet) while first feed-through conduits (not shown) conduct the warmest portion 410a of the circulating clean gas flow 410 into the external heat exchanger(s) 422 and then a corresponding one or more downwardly extending ingress conduits 423 pass the cooled gas through a feed-through aperture of the plenum wall which injects the downwardly flowing cooled gas 410b into the substantially bottom most part of the plenum 420.

The coolest portion 410b of the circulating flow 410 is then guided (e.g., by vertically extending baffles—not shown) to engage with heat emitting surfaces (e.g., heat sinks, package exteriors) of interior components (411) of the plenum. As the cooled portion 410b does so, it absorbs heat energy from the respective electronic and/or other interior components as indicated at 426. In one embodiment, one or more suction creating blowers 424 are disposed near the bottom end of the ingress conduit(s) 423 for creating a low pressure zone that urges the exchange-cooled gas 410b downwardly through and out of the bottom end of the ingress conduit(s) 423. In one embodiment, a mesh 425 for collecting and entrapping occasionally introduced particulate matter and/or for absorbing occasionally introduced moisture is positioned to extend horizontally at the bottom most part of the plenum 420 below the bottom end of the ingress conduit(s) 423 and below the optional suction creating blowers 424. Preferably, the mesh 425 does not directly block free flow of the downwardly guided, exchange-cooled gas 410b. The mesh may have plural subparts including an upper large aperture (large pored) mesh, an intermediate smaller apertures mesh and a bottom subpart containing activated carbon and/or other large surface area micro-porous materials for absorbing moisture and/or other undesired contaminants. An example of a situation where particulate matter and/or moisture is occasionally introduced into the plenum 420 is when the plenum access door(s) are temporarily opened for servicing plenum internal components. Another example of where particulate matter might occasionally be introduced into the plenum contained atmosphere is when particles inadvertently flake off from circuit boards or spinning/vibrating fan assemblies (for whatever reason; e.g., manufacturing defects). Like other plenum internal filters and/or absorbers, the bottom mesh 425 is removably replaceable.

In one embodiment, a sidewall mounted moisture and/or outgas absorbing element 427 is provided higher up along the flow path of the circulating flow 410. The sidewall mounted absorbing element 427 may have plural subparts including subparts respectively containing activated carbon and/or other large surface area porous materials for absorbing or neutralizing moisture and/or other undesired gaseous contaminants. An example of a situation where undesired gaseous contaminants might occasionally be introduced into the plenum contained atmosphere is when a plenum-contained backup battery outgases. The unexpected outgas may include an acid. The sidewall mounted absorbing element 427 may have a subpart designed for absorbing and neutralizing the outgas substances.

In one embodiment, a sidewall mounted pressure relieving one-way valve 429 is provided. One purpose of this valve 429 is to prevent plenum internal pressure from exceeding outside ambient pressure by more than a predetermined threshold value. An optional further purpose of this valve 429 is to allow for purging and then refilling of the plenum interior with a fresh supply of clean thermal transfer gas. Older, less fresh gas can be pushed out (purged) through the pressure relieving one-way valve 429 as newer and higher pressured gas is introduced (e.g., from above; from computer controlled inlet valve 428a). In one embodiment, a relatively less expensive (e.g., not so clean) purging gas is first flushed through the plenum interior (and through the hermetically co-sealed heat exchanger part of the clean gas circulating loop) and then the desired thermal transfer gas is introduced.

In one embodiment, one or more sidewall mounted, pressurized gas containers (only one shown at 429 with a corresponding computer controlled inlet valve 428a) are replaceably provided mounted to the outside of the plenum with one-way feed-through conduits for injecting one or more heat transfer or purging/cleansing gases into the plenum interior from time to time. An example of a situation where it is desirable to refresh the plenum internal atmosphere is when the plenum access door(s) have been temporarily opened for servicing plenum internal components and then closed again. Another example is when a computer implemented control mechanism, (e.g., a computer program) determines that a different chemical composition (e.g., more carbon dioxide, more nitrogen) is desired for the plenum internal atmosphere due to extant circumstances. When pressurized gas is released through a throttling nozzle (e.g., computer controlled inlet valve 428a), the depressurizing gas typically drops in temperature. As such it can be used to temporarily rapidly cool the plenum interior. In other words, another example of when a computer implemented control mechanism might automatically decide to inject a dose of gas that has been pre-pressurized to a predetermined above-ambient pressure is when it is desired to rapidly cool the plenum interior by such a gas release method.

Referring to FIG. 4B, shown schematically is a convective heat transfer mechanism that may be employed in accordance with the present disclosure. As explained for the example embodiment of FIG. 4A, one or more gas conduits such as 423' guide a flow of an exchange-cooled heat transfer fluid (e.g., clean air and/or other clean gases or vapors) to a substantially bottom most portion of a sealed air-tight plenum 420'. This creates a bottom up rising volume 41b' of relatively cooler, denser and heavier gas to displace a comparatively hotter, less dense and thus lighter volume 410a' of the heat transfer fluid that has already absorbed heat energy from plenum interior components (not shown in FIG. 4B). The upwardly rising (generally in the +Z direction) volume 41b' of relatively cooler heat transfer fluid absorbs heat energy from higher temperature surfaces with which it engages. At the same time, the higher up volume 410a' of already heated transfer is urged into a first chamber or other containment area 422a of the heat exchanger 422' (could be plural such heat exchangers with respective first chambers) where that first containment area 422a defines part of a sealed air-tight integrated and gas circulating structure together with the interior of the plenum 420'.

A heat exchange member 422c air-tight-wise isolates the first containment area 422a from a second and optionally open area 422b of the heat exchanger 422'. Any of a variety of different designs may be used for implementing the heat exchange member 422c as long as the isolation and cleanliness of the heat transfer fluid 410b'/410a' is not compromised. Some examples will be described below in conjunction with FIGS. 5A-5D. A first set 414' of one or more blowers propel the transfer fluid that has been cooled by way of heat transfer through the heat exchange member 422c down through conduits 423' for return to the bottom area of the plenum 420'. Although FIG. 4B schematically depicts the first set of blowers 414' as being driven by plenum-internal motors operatively coupled to respective fan blades, it is within the contemplation of the present disclosure to instead drive respective fan blades by way of rotating magnetic force fields passed from the exterior and through nonmagnetic wall portions (not explicitly shown~see briefly FIG. 5D) of the plenum. This way the fan blade driving means does not contribute to heat build up inside the plenum 420'.

A second set 321' of one or more blowers propel ambient air (optionally slightly pre-filtered air) over/along an opposed side of the heat exchange member 422c. Although second area 422b of the heat exchanger 422' is schematically shown as being a flow-through chamber for sake of simplified understanding, it does not have to be so. The second area 422b can be open to the ambient air so as to allow already heated portions of that unsealed air to rise up and out of the cabinet. (Note the apertures populated top of second area 422b. See also the example of FIG. 5D.) While heat exchange member 422c is schematically shown as having a large number of fins (e.g., for creating large surface areas along which the propelled fluids 410a' and 305a' flow), it is within the contemplation of the present disclosure to use any of a wide variety of gas-to-gas (or gas-to-liquid-to-gas) heat exchange designs employing one or more of laminar, helical and/or turbulent flow schemes. Preferably, the inner side of the heat exchange member 422c along whose surface area(s) the heated transfer fluid 410a' flows does not significantly impede the flow of that transfer fluid 410a' so that minimal power is needed for circulating the plenum internal transfer fluid 410a'/410b' over the long term.

As illustrated in FIG. 4B, while the plenum internal, heat transfer fluid 410a'/410b' is circulating through the interior of the plenum 420' and through the co-extensive first containment area 422a of the heat exchanger 422', cool external air (unsealed air) 305a' enters one side of the second area 422b of the heat exchanger 422' and correspondingly heated unsealed air 305b' exits from another side. Although FIG. 4B schematically illustrates the unsealed air flow 305a'/305b' as being left to right (in the +X direction), it may alternatively be right to left (in the −X direction) or periodically switched from one to the other such that dust or other clogging materials do not lodge and accumulate in the second area 422b of the heat exchanger 422' or on the fins of heat exchange member 422c. Alternatively or additionally, unsealed cool air may be pumped in from along the back side (disposed further back in the +Y direction of FIG. 1) of the plenum 420' and passed through second area 422b or its equivalent (latter not shown, picture the heat exchange member 422c as having an L-shaped cross section when viewed in the Z-Y plane with one of the fin-populated legs of the L being in the back) where the passed through air egresses as heated air, up and out of top-side apertures populated portion of the second area 422b or its equivalent in the +Z direction.

Figure 5A:
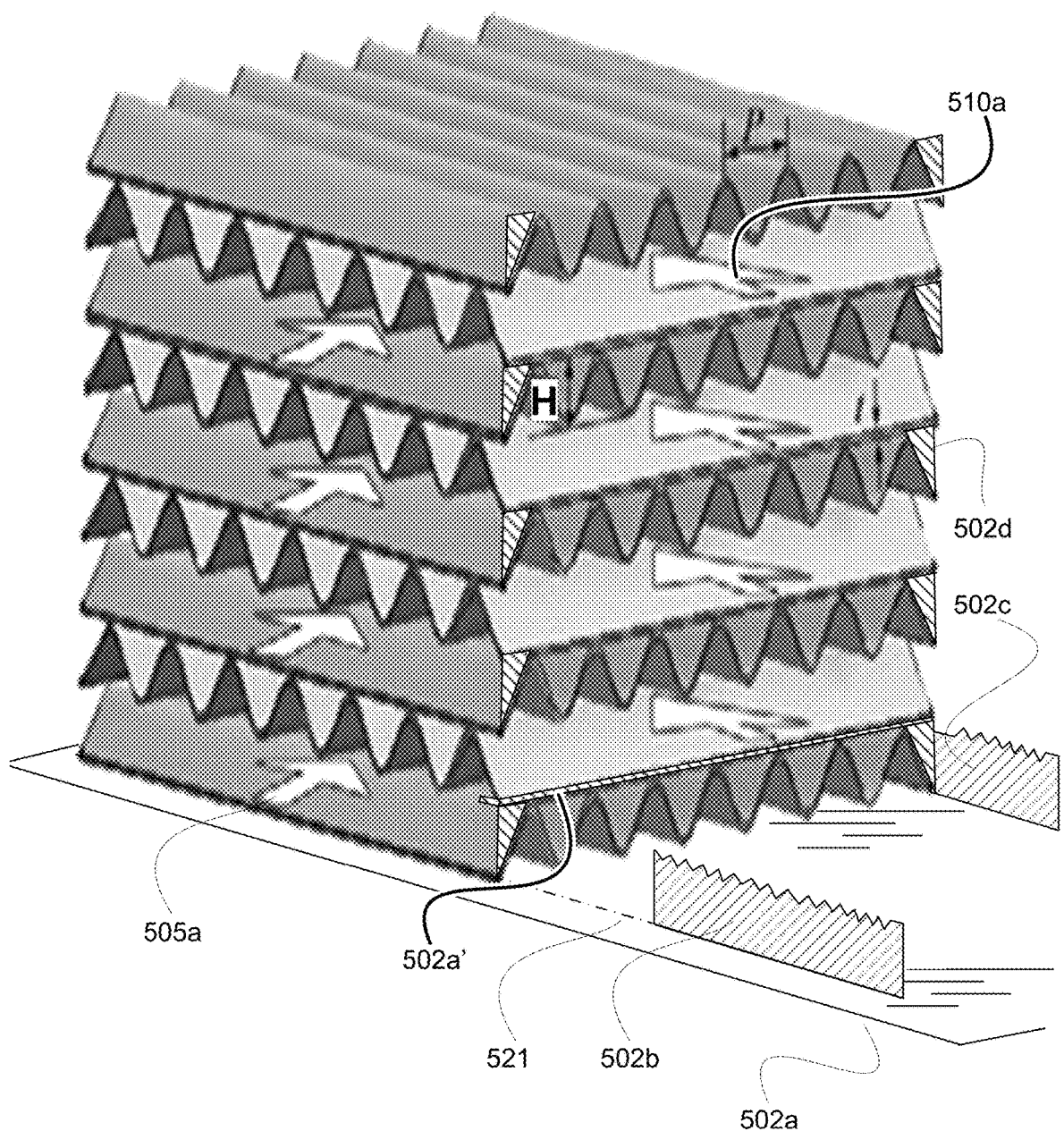
FIG. 5A schematically illustrates by way of a perspective view one possible heat exchange structure that allows for heat exchange between an air-tight-wise sealed and circulating clean gas and an unsealed flow of ambient air in accordance with the present disclosure.

Referring to FIG. 5A, shown is a first example of a multi-flow (dual gas flow) heat exchanger 500 where one of the flows is sealed in air-tight fashion and thus isolated from the ambient so that its flowing through and clean heat transfer fluid 510a is not contaminated by dust, smoke or other debris that may be present in the unsealed second flow 505a coming from the ambient air. The structure of the dual flow heat exchanger 500 may be comprised of corrugated sheets of heat conducting materials each having thickness t, pitch P and height H (where t, P and H are practical design values) and arranged in stacked crisscrossing manner as shown but with flat plate separation sheets similar to 502a (one more shown at 502a') interposed between the corrugated sheets so as to prevent contamination of the air-tight-wise sealed flow of the clean transfer fluid 510a by the orthogonally crossing but plate separated flow of the ambient air 505a. The materials of the alternating corrugated sheets and flat isolation plates (only two plates shown at 502a, 502a') may include one or more of good heat conductors such as aluminum, copper, steel (e.g., stainless), bronze, brass and graphite. The heat conductors may be coated with very thin layers of anti-corrosive materials such as polycarbonates at least on sides exposed to the moisture and/or debris of the unsealed air flow 505a. A bottom most of the flat plates, namely, 502a, may be extended as shown to form an air-tight sealed conduit for the flowing through and clean transfer fluid 510a. The formed conduit will also have side walls partially shown as 502b and 502c extending upwardly to seamlessly merge with a top flat plate (not shown, similar to 502a) disposed on the top most corrugated sheet. The side walls 502b and 502c intersect with troughs of the sine-wave shapes of the illustrated corrugated sheets as indicated by continuation line 521. Outer triangular leakage areas are also closed off by the triangular patches 502d so as to form the air-tight (e.g., hermetically) sealed structure in which the clean transfer fluid 510a flows. Other shapes for the corrugated sheets are possible, for example trapezoidal cross sections. The crisscrossing corrugated sheets do not all have to have same dimensions or directions of flow. Those skilled in the art will understand that the corrugated sheets function as strength providing fins between the flat plates (only two shown at 502a, 502a') that are interposed between adjacent ones of the stacked corrugated sheets. Non-porous bonding of the flat plates and the corrugated sheets one to the next (and attachment of sidewall plates 502b, 502c and sidewall patches 502d) may be performed by welding, brazing, soldering or other acceptable methods that allow for good heat exchange and air-tight sealing.

Figure 5B:
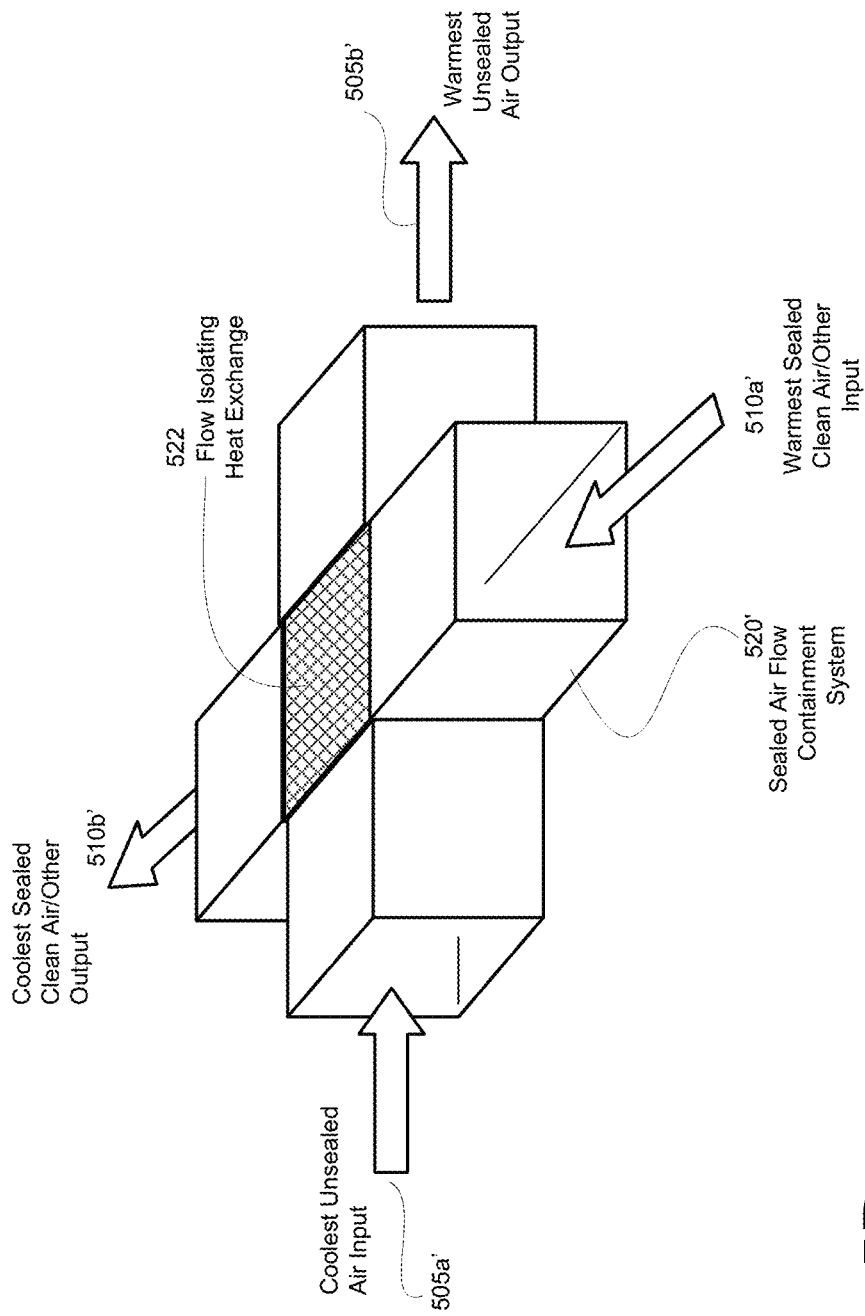
FIG. 5B schematically illustrates another heat exchange structure.

FIG. 5B shows a more schematic and perspective illustration of the concept introduced in FIG. 5A. The structure 501 includes a dual flow heat exchanger 522 that allows at least one of the flows, 510a'-510b' to pass through and exchange heat energy while remaining sealed in air-tight fashion. The second flowing through stream 505a'-505b' need not be from an air-tight sealed source. As shown, the ingressing part 510a' of the first flow is constituted by the warmest part of the sealed stream of clean transfer fluid (e.g., air and/or other gases or vapors) while the egressing counterpart 510b' is constituted by a substantially cooled part of the flowing through clean transfer fluid. (In accordance with the present disclosure, the cooled and thus relatively dense, egressing clean flow 510b' is in a downward direction (e.g., the −Z direction of FIGS. 4B and 5C so as to make use of convective forces.) Similarly, portion 505a' of the unsealed air constitutes the coolest part of the flowing through ambient air while portion 505b' constitutes a substantially warmer one. In one embodiment, the conduits 520' of the clean flow 510a'-510b' communicate in an air-tight sealed fashion with the plenum (not shown) through which the clean transfer fluid loops. The illustrated conduits of the unsealed air flow 505a'-505b' are optional and may contain one or more replaceable coarse filters for removing large sized particles from that air flow while not substantially impeding the unsealed air flow 505a'-505b'.

It is to be understood that the cubic shape of heat exchanger 522 in FIG. 5B is a nonlimiting example and many other three-dimensional shapes may instead be used including for example rectangular prismatic ones, trapezoidal prismatic ones (e.g., shaped like a 3D funnel where the cold clean transfer gas 510b' flows out the narrow end), hourglass shaped ones, cylindrical ones and so on. The flat plates and corrugated sheets of FIG. 5A can optionally be cut and stacked to form at least some of these alternative shapes.

Moreover, it is to be understood that the illustrated shapes and/or presence of the rectangular conduits shown in FIG. 5B are nonlimiting examples and many other configurations are possible so long as the preservation of the air-tight-wise sealed loop or containment volume in which the clean thermal transfer gas circulates is maintained. In one embodiment, which will be described immediately below in conjunction with FIG. 5C, the heat exchanger 522 is entirely inside the interior of the plenum while curved or otherwise bent ingress and egress conduits extend through the plenum wall to respectively bring the ingressing cool ambient air 505a' in for isolated flow through the flow path(s) dedicated within the heat exchanger 522 four ambient air flow and to exhaust the egressing warm ambient air 505b' to outside the plenum wall. At the same time, the illustrated conduit for guiding the ingressing warm clean thermal transfer gas 510a' into the heat exchanger 522 may be dispensed with as unneeded while the downward direct it conduit for guiding the egressing cooled clean thermal transfer gas 510b' out of the heat exchanger 522 is kept to assure that the cooled clean thermal transfer gas 510b' is injected into a bottom portion of the air-tight plenum (e.g., a hermetically sealed gas containment volume which includes one or more heat generating components). Alternatively, if the whole of the heat exchanger 522 is outside the plenum, then the conduits through which the clean thermal transfer gas 510a'-510b' flows may be curved or otherwise bent to draw egressing warm clean thermal transfer gas 510a' out of the top of the plenum into the heat exchanger 522 and then to return (e.g., as schematically indicated by 423' in FIG. 4B) the cooled clean thermal transfer gas 510b' back for injection into a bottom portion of the plenum.

Figure 5C:
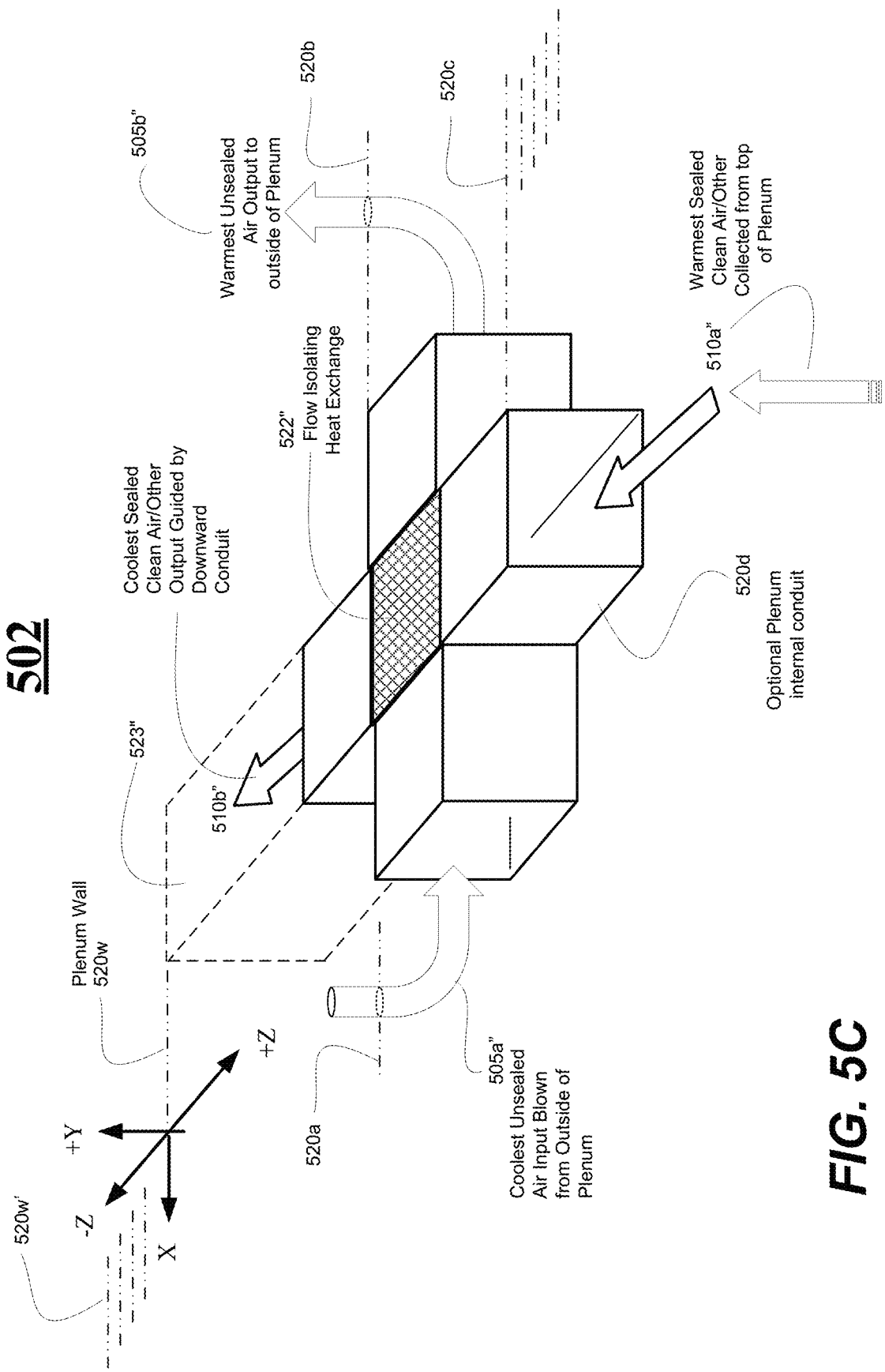
FIG. 5C schematically illustrates by way of a perspective view one possible topological configuration for mounting a heat exchange structure on the interior side of a rear plenum wall.

FIG. 5C illustrates by way of a schematic perspective and in more detail the aforementioned embodiment (now referenced as 502) in which the multi-flow heat exchanger 522' is wholly inside the plenum interior (on the −Y side of the rear plenum wall 520w) and the ambient air ingressing and egressing conduits 505a" and 505b" are bent to respectively intake and exhaust through sealed apertures (shown as dashed ellipses) formed at their respective portions 520a and 520b of the rear plenum wall 520w. Most of the rear plenum wall 520w is not drawn in within FIG. 5C so that portions in front of it (in the −Y directional) can be seen. Various portions of the rear plenum wall 520w are schematically indicated by dash/double-dot lines such as also illustrated at 520w' (in the X/−Z plane of the illustrated XYZ framework), at 520a where the ingressing conduit 505a" passes through, at 520b where the egressing conduit 505b" passes through, and at surface area 520c having in front of it (on the −Y side of the rear plenum wall 520w) an optional vertical conduit 520d that may be provided for guiding warm portions of the clean transfer gas 510a" down into the multi-flow heat exchanger 522'.

Although not shown in FIG. 5C, various blowers and/or other air/gas propelling devices (e.g., reciprocating baffles) may be included on the outside side (on the +Y side of the rear plenum wall 520w) and inside of (on the −Y side of) the rear plenum wall 520w for moving the respective ambient air flows and clean thermal transfer gas flows in the desired directions. The indicated flow direction for the ambient air 505a"/505b" is not mandatory and may be the opposite or may be periodically reversed such that the ambient air flows relatively symmetrically in both directions over a predetermined length of time. In one embodiment, reversible wall fans (not shown) are mounted on the outside side (on the +Y side) of the rear plenum wall 520w where the exhaust apertures (e.g., ellipses) are indicated for the ingressing/egressing ambient air flows 505a"/505b".

The illustrated, downward extending (e.g., in the −Z direction) conduit 523" for the cooled clean thermal transfer gas 510b" is desired so that the cooled gas 510b" is guided to the bottom portion of the plenum (see again return path 423' of FIG. 4B) for upwardly displacing warmer portions (e.g., 410a') of the clean thermal transfer gas. Although not shown in FIG. 5C, various blowers and/or other air/gas propelling devices (e.g., asymmetrically reciprocating baffles) may be included inside conduit 523" for urging the cooled clean thermal transfer gas 510b" downwardly (e.g., in the −Z direction). In one embodiment, the illustrated heat exchange structure 502 may be stretched in the X direction to substantially extend from the far left side of the gaming machine cabinet to the far right side while remaining mounted on the rear cabinet wall (e.g., a steel reinforced cabinet wall that forms part of a cabinet interior locked box).

Figure 5D:
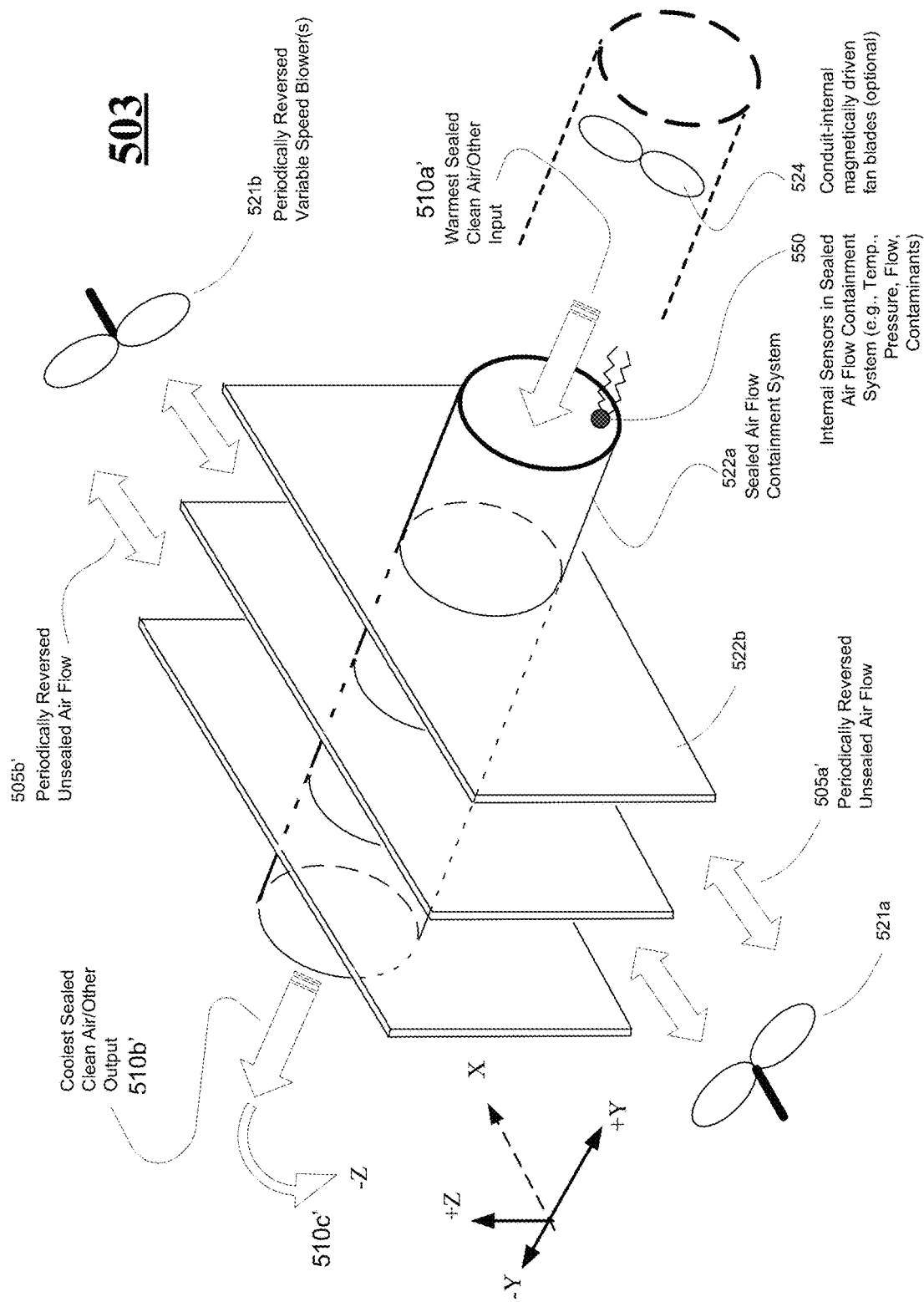
FIG. 5D schematically illustrates yet another heat exchange structure.

FIG. 5D is a perspective schematic illustration of yet another embodiment of a dual flow heat exchanger 503 that allows at least one of the flows, 510a'-510b' to pass through and exchange heat energy while remaining sealed in air-tight fashion. The second flowing through stream 505a'-505b' is not sealed and, although shown moving parallel to the X axis, is not so confined and may instead flow or reciprocate back and forth at any angle or plurality of angles as shadowed onto the Z-X plane so as to extend roughly parallel to the illustrated and exemplary flat plate fins 522b. (Although not shown, fins 522b may be augmented with bumps, grooves or other flow disturbing features so as to induce turbulent flow in addition to or in place of purely laminar flow.) As shown, the ingressing part 510a' of the first flow is constituted by the warmest part of the air-tight-wise sealed stream of clean transfer fluid (e.g., air and/or other gases or vapors) while the egressing counterpart 510b' is constituted by a substantially cooled part of the flowing through clean transfer fluid. Preferably conduit 522a turns downward (in the −Z direction) after advancing its sealed clean gas flow through the fins 522b as indicated by turn arrow 510c' and then returns the flow back through the fins the other way (e.g., in the +Y direction) or delivers the flow 510b' to a downwardly directed conduit like 423 of FIG. 4A for guidance of the heat exchange cooled flow to the bottom of a respective one or more plenums.

Similarly, if or when its flow is moving in the +X direction, portion 505a' of the unsealed air constitutes the coolest part of the flowing through ambient air while portion 505b' constitutes a substantially warmer one. In one embodiment, computer controlled blowers 521a, 521b are in unison or individually controlled to have variable speeds and/or directions of air propulsion. The controlling computer (not shown) may periodically, or based on detected environmental context (e.g., one or both cabinet internal and cabinet external environmental contexts such as above threshold temperature), reverse the flow direction of the blowers 521a, 521b (and optionally swivel them) so as to prevent dirt from lodging on or between the fins 522b and impeding the free flow of air between them or dislodging dirt that is suspected (due to sensed cabinet internal and/or cabinet external environmental contexts) to have lodged in one or more of the flow paths. Conduit 522a for the clean flow 510a'-510b' communicates in an air-tight sealed fashion with a respective one or more plenums (not shown) through which the clean transfer fluid loops. Although conduit 522a is illustrated for sake of simplicity as a single circular pipe passing through fins 522b and making good thermal contact with them, it is within the contemplation of the present disclosure to have plural such conduits like 522a running in parallel and/or snaking back and forth through the fins 522b so as to increase the effective surface area of heat exchange. Conduit 522a need not be circular or of any specific dimension. The interior surface of conduit 522a need not be smooth as shown but may instead have bumps of grooves for inducing nonlinear flow of the contained heat transfer gas 510a'.

In one embodiment, one or more sensors like 550 are mounted inside and along the ingress and egress flow portions of the conduits for the clean flow 510a'-510b' so as to respectively detect one or more of performance metrics including, but not limited to, temperature at the input and/or output of the heat exchanger 503, gas pressure at the input and/or output of the heat exchanger, gas flow rates, and level of moisture and/or other contaminants within the flowing by gas. The sensors may include photonic sensors. Advantageously, because the sensors 550 are mounted inside the air-tight sealed containment area, they are not subject to smoke, dust, moisture or other contaminants as they might be if mounted on the outside. Nonetheless, it is also within the contemplation of the present disclosure to mount one or more further sensors on the outside for example for the sake of detecting one or more of performance metrics of the unsealed flow 505a'-505b'. In response to detected sensor levels (e.g., both internal and external of the sealed cooling gas flow paths), the controlling computer (or computers, not shown) may speed up or slow down the rotation rates of one or both of blowers 521a, 521b, activate additional blowers including those that blow external air in different directions (e.g., intake cool air from different directions while testing for the coolest source air at the time), shut off some of the external blowers, send performance reports to a management server (e.g., indicating how well the heat exchanger is working) and/or output alarms calling for a casino operator to manually attend to the equipment cooling system (e.g., if one or more of the blowers fail, if filters need replacement, etc.).

In one embodiment, additional blowers like 524 are provided inside the clean air/gas conduit 522a for example at the input and/or output sides of the heat exchanger 503. The motors for driving the blowers (e.g., fan blades 524) may be mounted inside the conduit 522a; or in one embodiment, the fan blades are mounted to freely rotate inside the conduit 522a while external electromagnets are sequentially activated (e.g., by computer control) to rotate the in-conduit internal blades 524, where the latter have ferromagnetic materials and/or permanent magnets for interacting with the externally rotating magnetic fields. The externally produced and driving magnetic fields may be rotated at various desired speeds and even optionally in different directions or occasionally stopped at a desired angle of rotation. Since in the case of using external electromagnets, motors do not block the gas flow path inside the clean air/gas conduit 522a and heat generated by the driving external electromagnets is not added to the heat removal workload of the heat exchanger, power for operating the cooling system may be conserved.

Figure 6:
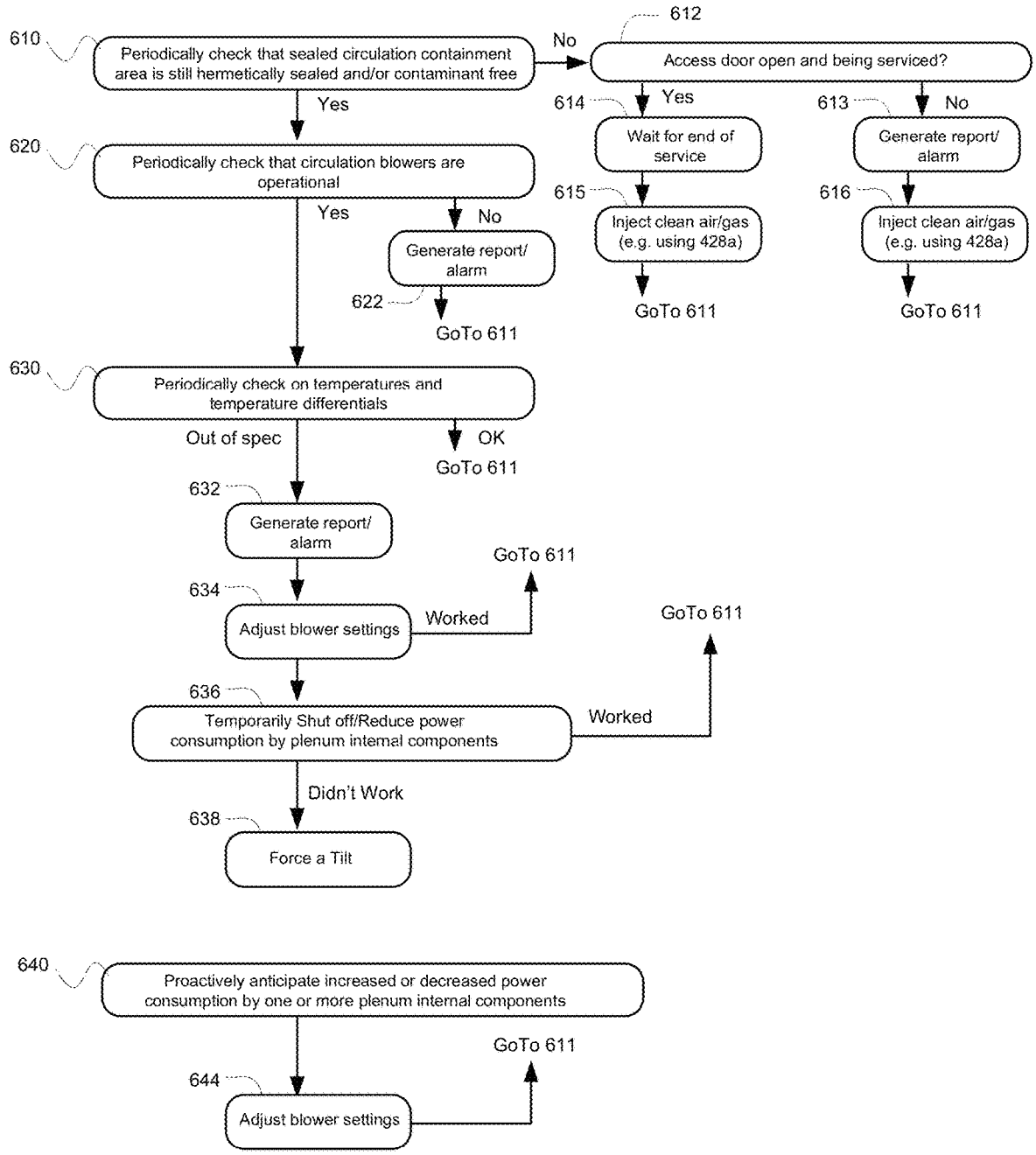
FIG. 6 is a flow chart of a cooling control method in accordance with the present disclosure.

Referring to FIG. 6, shown is a machine implemented and automated process 600 that may be used with the here disclosed air-tight sealed cooling system (e.g., that of FIG. 4). Execution may begin at step 610 in which the machine periodically, or in response to predetermined events (e.g., sensor detected events), tests the various sensors within the cooling system to verify that the sensors are working and the air-tight sealed circulation containment area is still sealed and/or that its atmosphere is contaminant free. The queried sensors may include door closure sensors, pressure sensors, temperature sensors, flow rate sensors and moisture sensors. If all the tested sensors indicate that the respective containment area (could be one of plural plenums) is properly sealed and free of detectable contaminants, then control advances to step 620. On the other hand, if the answer to test step 610 is No, control advances to step 612.

At step 612, the machine automatically references casino service logs and alarm logs or equivalents to determine if the cabinet of the present equipment is currently being serviced by a technician, thereby explaining why one or more of the access doors is open. If the answer to investigation step 612 is yes, control advances to step 614 where the process waits for the end of servicing by the technician and for the closing of all sealing doors for the subject containment area. Then, at step 615, the just serviced containment area is flushed clean (purged) with a predetermined purging gas and then refilled with a new injection of clean air and/or one or more other predetermined thermal transfer gases. In the case of embodiment 400 of FIG. 4, this step may include computer automated activation of one or more valves like 428a for predetermined durations that had been found sufficient to flush out unclean atmosphere by way of a pressure relief valve such as 429 and then to replace the purging gas or original unclean atmosphere with a clean one. More specifically, a heavier-than-air gas such as carbon dioxide ($CO_2$) may be first injected at the top or other part of the plenum 420 while the circulation blowers (e.g., 414, 424) are turned off (or in one variation, where the bottom blower 424 is operating in slow reverse) so that the injected, heavier than-air-gas (e.g., $CO_2$) displaces the unclean atmosphere (not shown) and forces it out of one or more exhaust ports (e.g., 429 of FIG. 4A). In another embodiment, computer controlled valves like 428a may additionally or alternatively be positioned near the bottom of the plenum 420 while exhaust valves (e.g., computer controlled ones) like 429 may be disposed at the top of the plenum 420. The injected, heavier-than-air-gas (e.g., $CO_2$) then fills the plenum from the bottom up and pushes the unclean but less dense atmosphere out through currently opened exhaust valves (not shown) located at the top of the plenum. After the unclean atmosphere has been flushed out with use of the heavier-than-air-gas (e.g., $CO_2$), a further one or more gases may be injected from respective pressurized cylinders such as 428 to achieve a desired clean atmospheric composition within the air-tight sealed plenum 420. After that, control returns to step 611. (As mentioned, the on- or in-cabinet pressurized cylinders (e.g., 428) are optional and in an alternate embodiment, cleanliness of the air-tight-wise sealed portions of the cooling system is achieved simply by sealing those portions after clean factory air is injected into them.)

If the answer to investigation step 612 had instead been No, then control advances to step 613 where at least one of an incident report and an alarm report are generated and sent to appropriate supervisory servers for subsequent handling. It should be noted that in general, a short time incident where the in-plenum atmosphere is not as clean as desirable is not usually a major catastrophe so long as appropriate cooling continues to be possible. The problem of slightly unclean thermal transfer gas can be handled at a later time when higher priority tasks are not being serviced. Optionally, step 616 is next automatically carried out to inject at least some amount of clean gas into the plenum and perhaps flush out some of the unclean atmosphere. Step 616 is not necessarily the same as step 615 where a full purge of the plenum atmosphere is carried out; although it could be. Alternatively it can be a partial purge. After that, control returns to step 611.

Step 620 is part of the periodic and/or events driven check out of the air-tight sealed (e.g., hermetically sealed) cooling system. In step 620, the circulation blowers are automatically tested, one at a time and then in combinations to verify that all the ones that are supposed to be operational are indeed operational. This testing may use some of the gas flow sensors to determine if desired gas flow rates and/or pressures are obtained when the tested blowers are driven to predetermined blowing rates at least temporarily while the operability test is being carried out. Preferably, the blower operability test is carried out while the gaming machine is idle (e.g., not having been used by any players in recent time or during off hours of the gaming establishment). If the answer to operability testing step 620 is No, then control advances to step 622 where at least one of an incident report and an alarm report are generated and sent to appropriate supervisory servers for subsequent handling. It should be noted that in general, the number of circulation blowers for the respective cooling system is set to a number greater than that needed for safe operation. Thus, if just one of the circulation blowers is inoperable, another can be used in its place and therefore the detected problem is not a major one. The bad blower is designated as not being supposed to be operational at this time. On the other hand, if all or a sufficient number of the circulation blowers are found to be inoperable such that safe operation of the gaming machine is unlikely, then control may be forwarded to step 638 where a tilt condition is intentionally forced. The gaming machine is then temporarily put out of commission until serviced by a technician. On the other hand if the blower problem is a minor one, after report/alarm generating step 622 control returns to step 611.

Test step 630 is reached after all the circulation blowers that are supposed to be operational are determined to be properly operational in test step 620. While the gaming equipment is in operation, temperatures, temperature differentials, pressures, pressure differentials and gas flow rates are checked within the sealed containment area and outside to verify that they are all within specification (e.g., within allowed margins of deviation). If all is normal, control returns to step 611.

On the other hand, if one or more of the current temperatures is higher than desired and/or one or more of the temperature differentials is lower than desirable (e.g., between input and output of the heat exchanger) and/or one or more of the pressure differentials is lower than desirable (e.g., between input and output of the heat exchanger), then first in step 632 an appropriate report and/or alarm is generated and sent to one of the supervisory servers. Thereafter in step 634 the current blower settings are readjusted (generally increased to faster speeds) so as to bring current temperatures and gas flow rates back to desired levels. If this works, control returns to step 611.

On the other hand, if the attempted adjustment of blower speeds does not solve the problem, then control may advance to step 636 where certain internal components of the plenum are shut down or switched to a reduced power consumption state so that they generate less heat. Although not shown, appropriate problem reports or alarms may be automatically generated and then control returns to step 611. If shut down or reduction of power consumption is not possible or does not work then the machine is forced into a tilt condition at step 638 and appropriate alarms and reports are generated and sent to supervisory servers.

Step 640 is optional and ancillary to steps 611-638. It is sometimes useful to proactively anticipate upcoming increases in power consumption (or alternatively decreases in power consumption) by one or more of the internal components of the plenum and to adjust the circulation blower settings accordingly (e.g., to increase the blower speeds or turn on more blowers just before power consumption actually increases and more heat is generated.) This is done in steps 640, 644 and then control returns to step 611.

Figure 7:
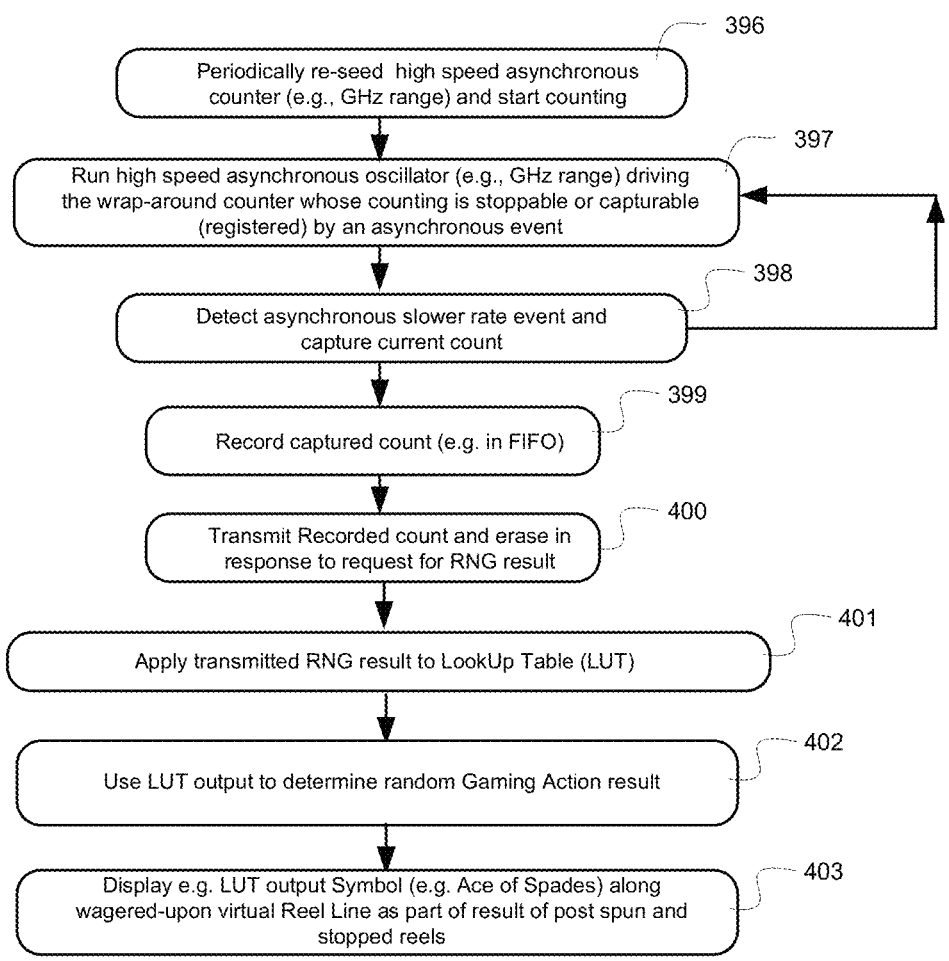
FIG. 7 illustrates a random number generating method.

Referring to FIG. 7, shown as a non-limiting example is a method 395 of using a random or pseudorandom number generator (RNG) for determining gaming action outcome. At step 396 a counter initializing value is determined as a seed for starting up a wrap-around digital counter driven by a high-speed oscillator. In one embodiment, a pseudorandom generator selects a subset of digits of the system real time clock. The selected digits are combined (e.g., summed) with a predetermined name seed and selected environmental noise measurement (e.g., background radio noise) to form the counter initializing seed. Then at step 397, the seeded counter begins its wraparound count while driven by a high-speed asynchronous oscillator (e.g., one operating in the GHz range). The counter may be a linear counter or a gray coded counter or account or otherwise wired for generating pseudorandom sequences.

At step 398, an external event that occurs asynchronously at a substantially slower rate (e.g., much slower than in the GHz range) is detected and used to trigger a register which captures the current counter value. The register captured value is stored in a temporary and secure memory such as a first-in first-out register (FIFO). In one embodiment, the FIFO is a circular one of limited size whereby unused recorded counts are overwritten by newly captured random count values. At step 400 a request is received for an orangey result and in response the count value at the output end of the FIFO is transmitted to the requester. The transmitted count value is erased from the FIFO.

In step 401 the relatively random RNG result value is applied to a statistics skewing look up table (LUT). The statistics skewing LUT differentially maps various ones of the input random numbers into respective output values or output symbols. Output values/symbols that are to have higher frequencies of occurrence are mapped to more of the input random numbers while values/symbols that are to have lower frequencies of occurrence are mapped to fewer ones of the possible input numbers. For example, in one embodiment the possible output symbols are the fifty-three possible cards in a normal playing card deck. The possible input number set may have thousands of unique members. At step 402, the output of the LUT forms at least part of the gaming action outcome. For example, the LUT output may represent an Ace of spades card. Plural an independent RNG's and LUT's may be simultaneously used for generating respective parts of a gaming action outcome having plural parts (e.g., a five card poker hand). At exemplary output step 403, the symbol represented by the LUT output is displayed for example along a wagered upon line of a set of virtual reel's that are first virtually spun and then slowed to a stop which settles on the predetermined gaming action outcome. Preferably, the RNG's and their associated LUT's are disposed in a secured central enclosure (e.g., 1004) where the graphics for the gaming action are also generated and the graphics are transmitted by secure communication links to the local gaming machines in the respective banks.

Figure 9:
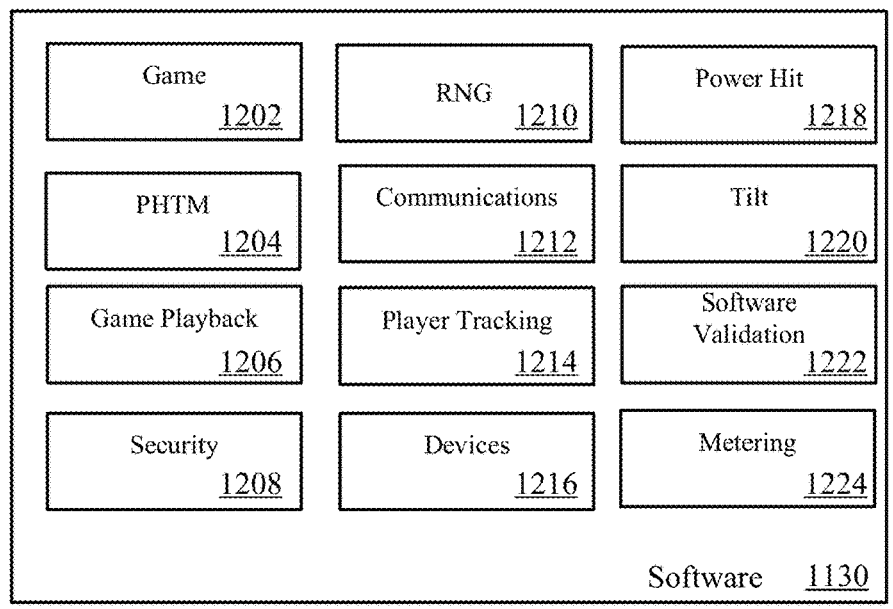
FIG. 9 illustrates gaming software in accordance with the present disclosure.

Referring to FIG. 8, details of a gaming machine controller that may be used to control the play of wager-based games including generating the game presentations and controlling the various gaming devices is described. FIG. 9 illustrates a block diagram of gaming machine components including a securely housed gaming machine controller (GMC) 1160. The GMC 1160 can be coupled to an external power supply 1146, displays such as 1018' 1012; etc., I/O devices 1134, external non-transient memories, such as a disk drive 1136, a power-off security device 1138, security sensors 1140, communication interfaces 1142 and meters 1144.

The external power supply 1146 can provide a DC voltage to the GMC 1160. The power supply can also provide power to the other devices in the gaming machine cabinet, such as I/O devices. Typically, the power supply 1146 is configured to receive power from an external power source, such as an AC voltage source. In some embodiments, an uninterruptable power supply (UPS) 1148 can be coupled to the power supply 1146. The UPS 1148 can be configured to provide back-up power for some time period in the event external power is lost. The GMC 1160 includes its own internal and thus securely housed battery 1124 (e.g., a rechargeable battery).

In a particular embodiment, the UPS 1148 communicates with the GMC 1160 on boot up and periodically to indicate power status and battery capacity of the UPS. If the UPS 1148 is not operational, this communication will fail and the game will display a soft tilt on the main game display, such as 1018', indicating that the UPS is not available. Under normal circumstances the UPS 1148 functions to condition the input power and ensure that the UPS battery remains fully charged. However, upon a power failure, the UPS 1148 in conjunction with the game platform will take one of two paths depending on the state of the UPS battery, which are described as follows.

If a power fail occurs and the UPS battery is more that 50% charged the GMC 1160 can immediately determine if there are credits on the machine (The threshold level can be a different percentage). If the game has no credits, the GMC 1160 can immediately hard tilt and become unplayable. The GMC 1160 can continue to run on battery power until either the battery level passes below 50% or power is restored to the game. If power is restored, the hard tilt is cleared and the gaming machine can become playable again.

If credits are on the machine, the GMC 1160 can allow game play to continue until the battery level reaches 50% charge. At that point, the GMC 1160 can complete a game in progress, cash out the player and begin an orderly shutdown. Allowing game play prior to shutting down allows the player to complete a game in progress and continue to remain on the game for a small period of time in case power is restored quickly. This keeps the game from tilting and the GMC 1160 cashing out the player for momentary glitches in power. It also allows some time for backup generators to come on line for a more serious power outage.

The power-off security 1138 can be configured to monitor the security sensors 1140 while power is off to the gaming machine, such as during a power failure or shipping. The power-off security 1138 can include its own processor, memory and power supply, such as the internal battery 1124. The power-off security device 1138 can report detected problems while the power was off to the GMC 1160 after power is restored. In some instances, a detected problem can cause a tilt condition. For example, a detected door open condition while the power was off may cause a tilt condition which has to be cleared by an operator. As another example, if the GMC 1160 can't detect the power-off security 1138, then the gaming machine can tilt.

The I/O devices 1134 can include the gaming devices that are directly or indirectly coupled to the GMC 1160 to provide the external interfaces that allow players to play the wager-based game(s) on the gaming machine. Examples of these gaming devices are described above with respect to FIG. 1. In some embodiments, a memory device 1136, such as disk drive and/or a flash drive, can be provided. As will be described in more detail below, the memory device 1136 can be used as a power hit tolerant memory (PHTM) or used to receive crucial data from another PHTM.

The communication interfaces 1142 can include wired and wireless communication interfaces, which use communication protocols, such as but not limited to Ethernet, Bluetooth,™ Wi-Fi, and NFC. A schematic indication of such a wireless communication interface 1046 is shown in FIG. 1. The remote servers (e.g., each server including one or more data processing units such as CPUs and appropriate memory such as SRAM, DRAM, Flash etc.) can form and provide the network services of block 1004 as described above with respect to FIGS. 1 and 2. The communication interfaces can be used to communicate with remote devices, such as remote servers, mobile devices in proximity to the gaming machine or other gaming machines. The GMC 1160 can be configured to support a variety of communication protocols over these communication interfaces.

In one embodiment, communications can be carried out with a back-end slot accounting system (SAS) (e.g., see network services block 1004 in FIGS. 1 and 2). In one embodiment, the SAS protocol uses a CRC redundancy check to ensure the integrity of messages going to and from the host. All type S, M, and G Long polls are CRC'd over the entire package including the address and command byte. The SAS engine can be configured to isolate the gaming code from the external communications. The SAS engine can be configured to only accept correctly formed SAS messages. Malformed, invalid or incorrect messages can be summarily dropped. Although CRC is mentioned here as one basis for data integrity validation, it is within the contemplation of the present disclosure to use of numerous other data and code integrity validation techniques including, but not limited to, hash matching techniques.

Messages that are valid can be translated into requests for the game player. The result of the message translation can be two-fold. First, the message is parsed and then evaluated for correctness and validity. If the message does not meet this criterion, it may not be translated and forwarded to the game player for a response, such as on display 1026 in FIG. 1. Second, no command, request or message from the external communication interface ever reaches any further than the SAS engine. This process ensures that erroneous signals or data will not adversely affect the game.

The meters 1144 can include hard meters, which are mechanical devices and meters maintained in software by the GMC 1160. In one embodiment, electronic digital storage meters of at least 10 digits that accumulate and store all the meters required can be used. For example, the number of games played since a RAM clear can be accumulated. In a RAM clear, critical memory can be cleared of data. Further, the number of games since the last power-up can be accumulated. As another example, games since the last door close can be accumulated.

Some other functions which may be tracked by a physical or software meter include but are not limited to attendant paid jackpots, attendant paid cancelled credits, bill in, voucher in (e.g., credit voucher), voucher out, electronic fund transfer in, wagering account transfer in, wagering account transfer out, non-cashable electronic promotion in, cashable electronic promotion in, cashable promotion credits wagered, non-cashable electronic promotion out, cashable electronic promotion out, coupon promotion in, coupon promotion out, machine paid external bonus payout, attendant paid external bonus payout, attendant paid progressive payout, machine paid progressive payout, non-cashable promotion credits wagered, number of progressives won, number of jackpots won, number of games won, number of games lost and total amount paid by attendant. Other meters can include main door open, logic door open, cash door open and stacker door open.

In a particular embodiment, software meters can be accessed from an operator menu by turning a key on the side of the gaming machine. The operator menu can be output on one of the displays (e.g., 1018', 1012'). All software meters can be cleared upon a RAM clear. In addition to the meters, the machine can also display the configured denomination, theoretical payout and actual payout. This information is accessible from the operator menu under the statistics screen. This information can be cleared upon a RAM clear event.

The GMC 1160 is preferably mechanically secured within an interior of the gaming machine. For example the GMC 1160 can be contained in a metal box. The metal box can include a secure entry, such as a hinged door, that is lockable. The openings for cables and wiring in the metal box can be purposefully designed to be as small as possible while still allowing proper electrical wiring standards regarding bend radius and connector strain. The locking mechanism for the metal box can be monitored by one of the sensors 1140.

The GMC 1160 can include a motherboard. The motherboard can be the only circuit card that contains control programs. The control programs include those used to control programmable operations within the GMC 1160. Other gaming devices, such as the I/O devices 1134, can include device specific control programs. However, these device specific control programs don't affect or alter the behavior of the control programs on the motherboard.

The mother board can include a chipset 1110. The chipset 1110 can include a Northbridge 1106, which is a memory controller hub, and a Southbridge 1108, which is an I/O controller hub. The Northbridge 1106 and the Southbridge 1108 can communicate via an internal bus 1116.

The Northbridge 1106 can be coupled to a memory bus 1112 and a front side bus 1113. The front side bus 1113 can couple on or more processors, such as CPU 1102, to the Northbridge 1106. The CPU 1102 can receive clock signals from clock generator 1104 via the front side bus 1113.

The memory bus 1112 can couple one or more graphics cards, which include graphical processing units (GPUs), to the Northbridge 1106. The graphics card or cards can be installed in the graphics card slot(s). The graphics cards can be coupled to displays, such as display 1018'. Further, the memory bus 1112 can couple one or more memory slots 1115, configured to receive volatile random access memory, to the Northbridge 1102. The CPU 1102 can communicate with the volatile memory in the memory slots 1115 and the graphics card in the graphics card slot 1114 via the memory bus 1112 and the front side bus 1113.

The Southbridge 1108 can be coupled to one or more PCI slots 1118 via PCI bus 1120. In various embodiments, the Southbridge 1108 can provide a variety of communications interfaces. The communication interfaces include but are not limited to IDE, SATA, USB, Ethernet, an audio Codec and CMOS memory. In addition, the Southbridge can communicate with a flash ROM (BIOS) 1126 and super I/O 1128 via the LPC (Low Pin Count) bus 1152. Typically, super I/O 1128 supports older legacy devices, such as a serial port (UART), a parallel port, a floppy disk, keyboard and mouse. Some of the gaming devices, such as the sensors 1140, can be coupled to the Southbridge 1108 via super I/O 1128.

The GMC 1160 can be configured to execute gaming software 1130 to control playing of a respective one or more wager-based games. On boot-up, a self-bootstrapping check of basic hardware, firmware and software integrity 1132 can be performed using firmware logic driven by the BIOS 1126. In a particular embodiment, an isolated and separate hardware device can be installed which includes the boot-up checking algorithms for the basic hardware, firmware and software integrity. The separate hardware device can be coupled to the Southbridge 1108.

In one embodiment, the gaming software 1130 can be stored on two compact flash cards, which are not conventional ROM devices. The verification mechanism can use one or more SHA-1 hashes, which produce a message digest of some length, such as one hundred sixty bits. Message digests can be stored on both compact flash memories. A public/private key covered and/or symmetric key covered algorithm with a key of some length, such as a 512-bit key can be used to encrypt and decrypt the message digests. If any errors are detected in the validation of the gaming software 1130, the GMC 1160 can automatically switch to a tilt mode and halt execution of gaming actions. The GMC 1160 can be configured to prevent programs deemed to be invalid (e.g., those failing periodic verification checks) from running.

When the gaming software 1130 is compiled and built, one or more of its respective code and/or data segments can be hashed using a hash algorithm, such as the SHA-1 hash algorithm. Other hashing algorithms can be used and SHA-1 is mentioned for illustrative purposes only. The resulting hash answers can form the hash digest. This digest, along with the start and stop values for the validation algorithm, can be encrypted by a private key. The key can be stored in a computer which is not connected to any network and which is physically stored in a secure location, such as a locked safe.

In one embodiment, prior to use, the public key can be installed in a power-hit tolerant memory, such as the NVRAM 1122 on the motherboard. This step can be performed when the gaming machine is manufactured. In another embodiment, the corresponding public and/or symmetric keys can be loaded from a secure mobile memory device, such as an authentication compliant USB device, in the field. In one embodiment, the USB port is only accessible when the enclosure which holds the GMC 1160 is opened. Without a proper public key, the machine will not operate.

When the game initially powers up, the BIOS 1126 can run a Power On Self-Test (POST) and checksum over itself and/or perform other boot-strapping integrity self-checking. If these tests fail, the game does not boot and an operator can be required to clear this tilt. If the BIOS self-test passes, the BIOS can retrieve the public key from NVRAM 1122 and can run a CRC over the retrieved key to ensure it is the correct key. The correct CRC answer can be stored on the BIOS. If the public key does not exist or if the public key CRC returns an incorrect answer, the game can halt and prompt the user to install the correct public key.

Once the public key is validated, the BIOS 1126 can test the integrity of the code stored in the system compact flash 1130 by using the validated public key to decrypt the SHA signatures for the data stored on the system compact flash 1130 and the start and stop sector identifiers indicating where the respective segments of data are stored on the compact flash for each corresponding SHA signature. The data can be stored between the start and stop sectors, inclusive. Unused sectors can be set to 0 (zero). The BIOS 1126 runs a low-level block-by-block integrity check using one or more SHA-1 hashes over the kernel and operating system (Boot and Root) partitions and compares the result to the decrypted file from the manifest. In one embodiment, the operating system can be Linux and the kernel can be a Linux kernel. If any of the hash values does not match, the game automatically goes into tilt mode.

If the values match, the BIOS 1126 can load the now-validated boot loader program and can relinquish control of the validation process to the boot loader. The boot loader can be executed by the operating system using CPU 1102. The procedure can validate the entire partition, not just the file structure. Thus any unused or unallocated areas of the partition can be tested for unintended programs or data.

Next, a file-by-file SHA-1 verification (or other hash based verification) can be performed over the pay table, assets, and player files. The resulting information can be compared against the decrypted results from the manifest file and/or from a secure encrypted database server (not shown). If the calculated answers match the decrypted answers, the GMC will proceed with the boot-up. If the hash answers do not match, the game tilts and requires operator intervention to clear.

In one embodiment, as an additional security measure, a compressed file system that is designed to be read-only can be used. The file system may not support or contain a write command or the ability to write to a file. The file system can be compressed so that it is not human-readable.

Each block of data in the file system can have a corresponding CRC stored with the block. When the block is read, the CRC is calculated and compared with the stored CRC. If the answer does not match, the file system can generate an error and the game tilts. Any changes, whether additions, deletions, or modifications, will change the CRC of the affected blocks and cause the game to tilt. This feature, in effect, monitors the integrity of the entire file system as well as the integrity of the media on a real-time basis. Although CRC is mentioned here as one basis for data integrity validation, it is within the contemplation of the present disclosure to use of numerous other data and code integrity validation techniques.

The SHA hash answers can be available on-screen and may also be accessed via the Gaming Authentication Terminal (GAT) interface. The GAT interface (not shown) can be provided as one of the I/O devices 1134 or within the super I/O 1128. The GAT interface can be configured to allow an operator to initiate an SHA-1 hash or an HMAC SHA-1 on-demand so that an operator (or other independent entity) can validate the integrity of the software 1130 at any time. In one embodiment, a nine-pin "D" connector is available to an operator or regulator (e.g., government authorized inspector) for access the GAT serial terminal.

Access to the GAT port requires opening of the main door. Further, it may require unlocking of the GMC enclosure. In one embodiment, a GAT port can be provided on the outside of the GMC enclosure. Hence, the GMC enclosure can remain locked while the GAT port is utilized.

As described above, the gaming machine can include a power hit tolerant memory (PHTM). For example, NVRAM 1122 (nonvolatile memory, for example a RAM coupled to battery 1124) can be used as a PHTM. The PHTM can be used to store crucial data, such as data generated during the play of a wager-based game. The PHTM can be configured to be able to quickly write the crucial data in response to a detection of an imminent power interruption. The CPU 1102 can be configured to detect a potential power interruption via the power interruption signal received from the power supply. The power interruption signal can indicate a fluctuation in the power.

Not all memory types may be suitable for use as a PHTM because their write times are not fast enough to store data between the detection of a potential power interruption and the power interruption. For example, some disk drives don't typically have fast enough write times for use as a PHTM. In one embodiment, a disk drive 1136 can be used. However, it requires that use of an uninterruptable power supply coupled to the disk drive 1136 and GMC 1160 to maintain power after the external AC power source is lost. Other types of memory with slower write times can be employed when an uninterruptable power supply is used.

Typically, a volatile RAM (random access memory) has a fast enough write speed to be used as a PHTM. However, after the power is lost, data stored in the volatile RAM is lost. To overcome this deficiency, a rechargeable battery, such as 1124, can be coupled to the RAM 1122 to provide persistence memory storage. This memory configuration can be referred to as a non-volatile RAM (NV-RAM). The battery power levels can be monitored so that it can be replaced as needed if it is no longer rechargeable. Alternatively or additionally, other forms of nonvolatile memory can be used including for example flash memory, phase change memory, etc.

In one embodiment, an NVRAM 1122 with a battery 1124 is shown inserted in one of the PCI slots 1118. The NVRAM 1122 can be used as a PHTM. In other embodiments, it may be possible to use a RAM inserted into one of the memory slots 1115 that is coupled to a battery. It yet another embodiment, it may be possible to use a high-speed USB connection to a memory storage device to provide a PHTM.

As noted above, a hard disk, such as 1136, in combination with an uninterruptable power supply 1148 can be used as a PHTM.

In yet other embodiments, a GMC 1160 may utilize multiple memory storage devices to store crucial data. For example, the NVRAM 1122 can be used as a PHTM. However, crucial data can be copied to a non-PHTM from the NVRAM 1122 as needed. The copied data can provide a back-up of crucial data stored in the PHTM. Further, after crucial data is copied from the PHTM and the validity of the crucial data is verified, it may be deleted from the PHTM to free up space.

In one embodiment, crucial data can be stored in an NVRAM chip and in a high speed read/write compact flash. Crucial data such as RNG outcome, game recall, game state (credits, wager, winnings), and meters can be stored in NVRAM as files. Each file is hashed (MD5 or SHA-1 depending on the file) and the hash answer can be stored with the file and/or stored in encrypted form in a secure encrypted database server (not shown).

Additionally, in a particular embodiment, in NVRAM, the critical files can be kept in triplicate with each copy having a separate MD5 hash of the information. Prior to displaying each game outcome, this data can be rehashed and the three outcomes can be compared. If all three hash answers match, the data is deemed to be good and the game results are displayed to the player and a copy is stored in NVRAM. If two of the sets match, the non-matching set is deemed to be corrupt and it is replaced with a copy from one of the other two and the results are displayed to the player. If all three are different, memory can be deemed to be corrupt and a tilt can occur, halting play. The comparisons can occur continuously, each time the memory is updated, which may be multiple times during the course of a single play. However, a comparison can be performed at least once prior to displaying the game outcome.

To protect meters in the event of a power loss, various meters can be stored in NVRAM 1122. Thus, the meters are protected in the event of a power loss. The battery 1124 can be a lithium cell rated, based on the current draw of the NVRAM, to maintain the meters for at least 90 days. In one embodiment, the lithium cell can be rechargeable via the power supply 1146.

In particular embodiments, a game play history associated with recent games can be stored in the NVRAM 1122. This information can be retrieved from the NVRAM 1122 via an operator menu and output to a display, such as display 1018. In particular embodiments, a complete play history for the most recent game played and the nine prior games can be made available. A method involving game play history is described in more detail with respect to FIG. 13.

Various embodiments in accordance with the disclosure can include one or more of the following as components thereof: as a CPU (e.g., 1102) or other processor: an Intel LGA1150™ Socket set (H3 socket) populated by a Haswell G3420™ dual core; for the Northbridge hub (e.g., 1106): an Intel Q87 Platform Controller Hub (PCH)™ chip set; for the Southbridge hub (e.g., 1108): this part is integrated within Q87 PCH™ chip set; for the system memory Bus (e.g., 1112): a PCI Express x16 Bus; for system Memory Slots (e.g., 1115): Dual 200 pin SODIMM, Non-ECC DDR3, providing e.g., 8 GB total; for NV RAM (e.g., 1122): a PCIe x1 Interface, e.g., providing 8 MB Battery Backed SRAM; for a backup Battery (e.g., 1124): a CR2032; for FLASH ROM(BIOS) (e.g., 1126): the SPI FLASH, W25Q128™ using a LOTES ACA-SPI-004-K01 Socket™; for Super I/O interface (e.g., 1128): a Realtek F81866AD-I™; for Gaming Software (e.g., 1130. Software): corresponding Game Software stored on 32 GB 2.5" SSD; for Software Verification (e.g., 1132): OS Software stored on a 4 GB CF Card; for a Power Supply (e.g., 1146): the N2 Power XL375-12™ controller; for a UPS (e.g., 1148): the CyberPower CP1350™ controller.

For a slot game, the game play history can include credits available, credits wagered, number of lines played (when appropriate), bonuses won, progressive won, game winnings (credits won) and credits cashed out. For "pick" bonuses, the intermediate steps involving the player picks can be retained. In games with free spins, the initiating game is retained with all or, for cases where more than fifty free games have been awarded, at least the last fifty free games played. This gaming information can be displayed in the recall screens through standard text meters, screen shots, graphical display elements and textual representations of specific situations that occurred during game play. The game play history can illustrate unique game play features associated with the game in general and specific game features that occurred during the instantiation of a particular play of the wager-based game.

A gaming machine controller configured to generate a wager-based game in accordance with player selected volatility parameters is described with respect to FIG. 8. Gaming software used to generate the wager-based game is discussed with respect to FIG. 9. With respect to FIG. 9, a power hit tolerant memory (PHTM) configured to store crucial data generated from playing the wager-based game is discussed. The crucial data can include information associated with selected volatility parameters and wager-based games generated using the selected volatility parameters.

Figure 11:
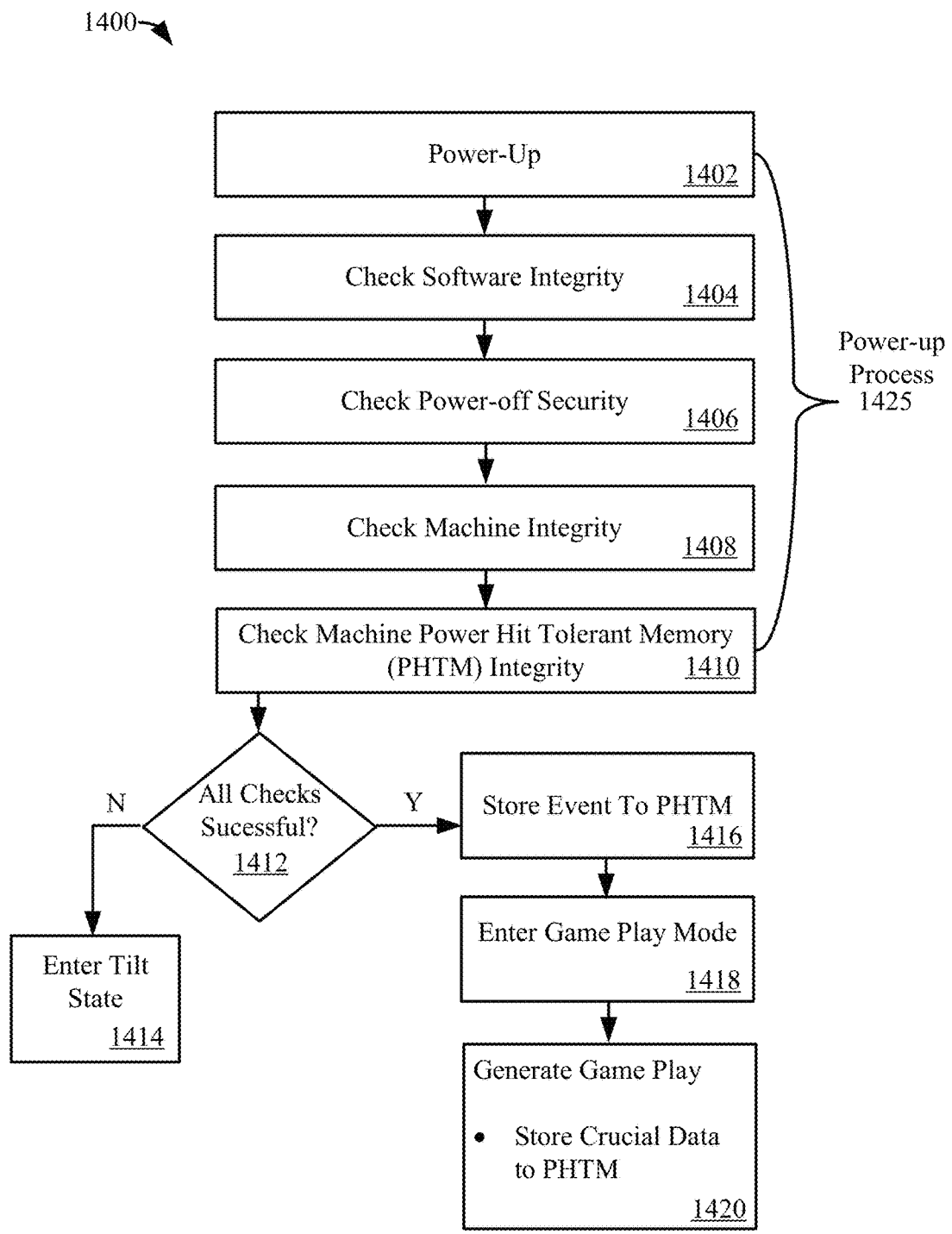
FIG. 11 illustrates a method powering up a gaming machine in accordance with the present disclosure.
Figure 12:
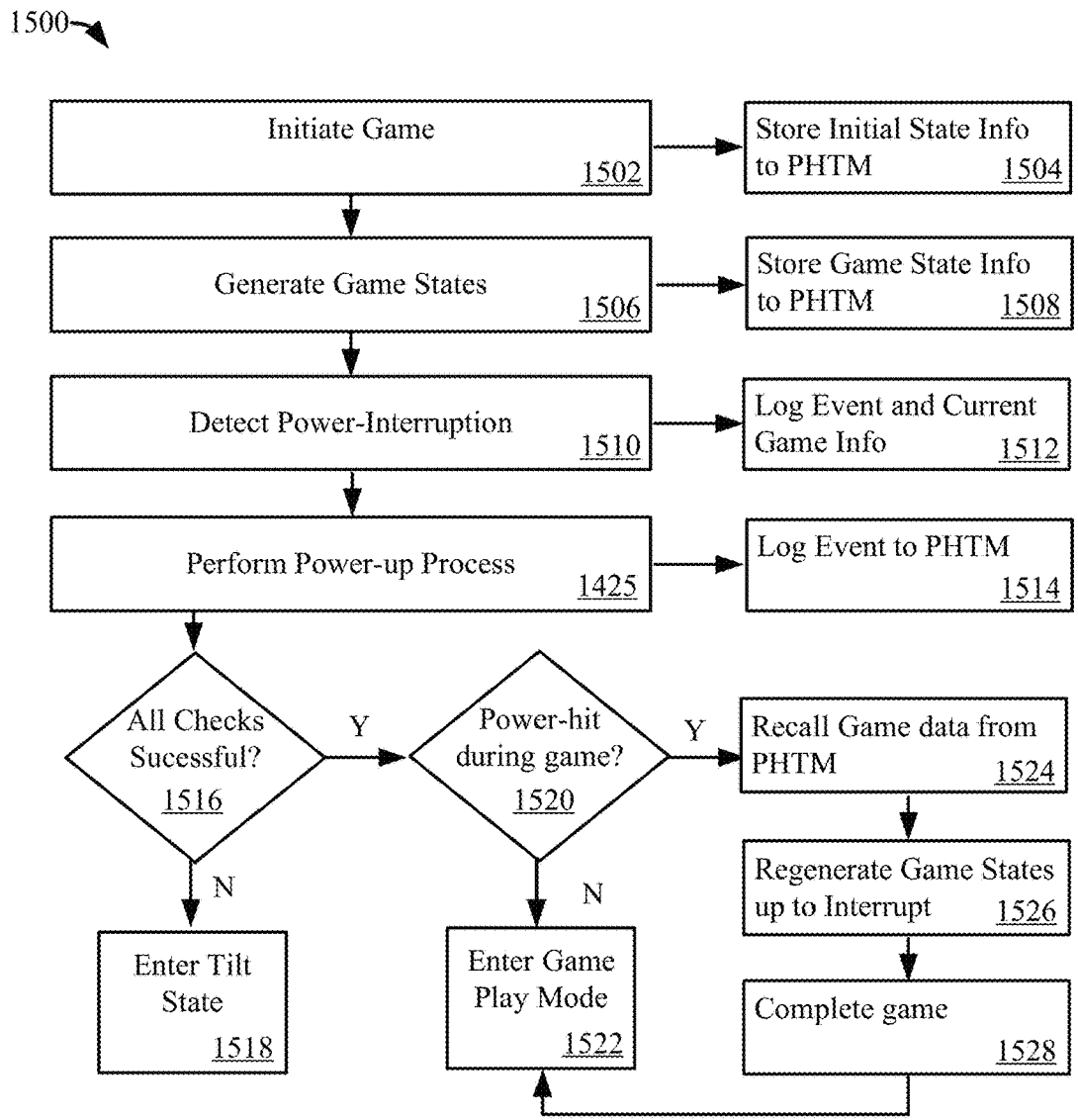
FIG. 12 illustrates a method for responding to a power interruption on a gaming machine in accordance with the present disclosure.

With respect to FIG. 12, a method for responding to a power interruption on a gaming machine, which utilizes the power hit tolerant memory, is discussed. With respect to FIG. 11, a method of powering up a gaming machine is described. Finally, with respect to FIG. 13, a method playing back a game, such as a wager-based game including a first primary game and a second primary game, previously played on a gaming machine is discussed.

FIG. 6 illustrates a block diagram of examples of gaming software 1130 that can be executed by a Gaming Machine Controller (GMC) 1160 in FIG. 8. The game software 1202 can be configured to control the play of the game. The play of the game includes determining a game outcome and award associated with the game outcome using the RNG software 1210.

The game software 1202 can be configured to utilize reel strips and/or wheels of chance with different properties. For example, virtual reel strips with different total number of symbols, different symbol combinations and different stopping probabilities. As described above, the game software may utilize different virtual reel strips in response to a selection of different prize structures involving scatter distributed symbols.

The award can be presented as a number of different presentation components where a portion of the award is associated with each presentation component. These presentation components can be referred to as game features. For example, for a video slot game, game features can involve generating a graphical representation of symbols moving, settling into final positions and lining up along a combination of different lines (e.g., paylines). Portion of the award can be associated with different lines. In another example, the game features can involve free spins and chance award of bonus wilds during the free spins. In yet another example, the game feature can involve generating a graphical representation of symbol and then actuating a mechanical device, such as wheel to indicate an award portion.

In a further example, a game feature can involve a bonus game where a portion of an award for a game is presented in a separate bonus game. The bonus game can involve inputting choices, such as a selection of a symbol. Similar to the primary game, the bonus game can include bonus game features where bonus game award is graphically presented in a number of different portions. A primary game can include game features which trigger different bonus games with different bonus game features.

As described above, game features and bonus game features can be stored to a power hit tolerant memory (PHTM). The PHTM software 1204 can be configured to manage the transfer of crucial data to and from the PHTM. Further, as described above, the PHTM software 1204 can be configured to verify the integrity of the data stored in PHTM.

In particular embodiments, the game 1202 has no knowledge of PHTM. Thus, the utilization of the PHTM can be totally abstracted from the game 1202 and contained in a shared object that is loaded at runtime. This shared object will also determine if the PHTM is available and how much memory space is available. If there is no PHTM, or it doesn't contain enough memory, the shared object can be configured to automatically use a disk file instead. This function may allow the game to be run in a windows environment and still have the ability to recover from a power hit.

One purpose of the PHTM 1204 is proper recovery from a power hit. In order to facilitate proper power hit recovery, numerous transition points can be built into the game 1202 where crucial data is stored to PHTM at each transition. The transitions can be implemented as states, which can be referred to as game states or game state machines. The states themselves can also be stored in PHTM so that on startup, after validating that the PHTM is not corrupt, the game 1202 can then check the current state that is stored. That state will then determine where the game will restart. The idea is that whenever a state transition occurs and is saved, the data needed to recover to that state has also been stored in PHTM.

Different approaches can be used in deciding when to save data to PHTM. In one embodiment, a thread runs in the background that constantly checks the data in memory against a copy of what's in PHTM as well as a force write flag. If the force write flag has been set or if it sees that the crucial data has changed, PHTM software 1204 writes it to the physical PHTM, updating the copy as well.

In another embodiment, the PHTM software 1204 can be configured to write all data directly to PHTM as it occurs. At certain times the PHTM software 1204 can be configured queue writes rather than committing them in order to make it an "all or nothing" write. This feature can be normally done for something that is going to cause a state change, a cash-out, etc. This feature can allow all the meters or crucial data associated with the game to be written at once, keeping the window of opportunity for corruption to the smallest amount of time possible.

In particular embodiments, multiple state machines can be used that are based on the overall game state machine. For example, separate "sub-state machines" can be used for critical functions that use external I/O devices, such as bill acceptors and printers. If the game 1202 restarts in a state that requires more granularity and has a different state machine such as a cash out or a ticket inserted state, it can switch to that sub-state machine to complete the actions and then return to the overall game state machine.

In particular embodiments, the sub-state machine concept can be used for areas of the game that are outside of the main game flow such as bonus games. For example, if the game is in a bonus game with bonus game feature including a free spin bonus round and the power cycles before all of the free spins have finished, the game will recover to the spin that was being executed when the power cycled and will continue from there. If the game is in a bonus game during a bonus game feature including a pick bonus, the game 1202 can recover to the point where the power cycle occurred. In particular, the picks that have already been made can be displayed and then the bonus game can continue from that point including receiving additional picks. Further, the game 1202 may be configured using the crucial data stored in the PHTM to regenerate on the display all or a portion of the game states prior to the power hit, such as the initial state of the game and game states that occurred prior to the bonus game.

The game playback 1206 can be used to display information associated with one or more game states of a wager-based game previously played on a gaming machine. As an example, a particular wager-based game can be initiated and played on the gaming machine. During game play of the particular game, crucial data associated with game states that occur can be stored to the PHTM. Subsequently, one or more additional games can be played on the gaming machine. Then, using crucial data recalled from the PHTM, game information associated with the particular game can be redisplayed on the gaming machine. The game information can include but is not limited to a) text information, b) screen shots that were generated during game play and c) a regeneration of all or a portion of a graphical game presentation associated with the particular game.

Typically, to access the gameplay back feature, the gaming machine has to be placed in a tilt mode where an operator menu is available. From the operator menu, using game playback software 1206, an operator can select a particular game for playback from among a plurality of games previously played on the gaming machine. To resume normal game play, the tilt mode can be cleared and the gaming machine can revert to a normal operating state. More details of game play back are described with respect to FIG. 10.

The security software 1208 can be configured to respond to information received from various security sensors disposed on the gaming machine and from the power-off security device (e.g., see 1138 in FIG. 8). For example, the security software 1208 can be configured to detect that a locking mechanism has been actuated on the gaming machine and then cause the gaming machine to enter a tilt mode. As another example, the security software 1208 can be configured to receive information from the power-off security device that the gaming machine door was opened while the gaming machine was being shipped. In response, the security software 1208 can cause the gaming machine to enter a tilt state. In yet another embodiment, the security software 1208 may not be able to detect a sensor, such as a sensor (e.g., see sensors 1140 in FIG. 8) which monitors a state of a door and in response enter a tilt state.

The RNG software 1210 can be configured to generate random numbers used to determine the outcome to a wager-based game. In one embodiment, a Mersenne twister random number generator (RNG) algorithm, which generates integers in the range [0, 2^k−1] for k-bit word length with a period of (2^19937)−1 can be used. It has a longer period and a higher order of equi-distribution than other pseudo-random number generators. The Mersenne Twister is also very fast computationally as it uses no division or multiplication operations in its generation process. It can work well with cache memory and pipeline processing.

In particular embodiments, the RNG cycles at seventy RNG cycles/second or above, such as equal to or above one hundred RNG cycles/second. This speed has been determined by engineers at the Nevada Gaming Control Board to be fast enough that it cannot be timed by the player. The tests showed that above seventy RNG cycles/second successfully hitting a specific outcome became sporadic, and the results were completely unpredictable at one hundred RNG cycles/second. An evaluation showed the variance in the contact mechanism of mechanical switches and the inherent variance in the "button press" detection circuitry, combined with the inability of a person to repeat a movement, provided enough ambiguity in the final registration of the button press to eliminate a player's ability to affect the payback characteristics of the game.

The RNG can be seeded using a plurality of variables. In particular embodiments, the RNG can be seeded by four variables that eliminate the same seed sequence from being used in more than one device, such as two gaming machines using the same RNG seed. The variables can be 1) absolute time, 2) time since the machine powered up, 3) machine number and 4) a random number from the kernel base RNG"/dev/urandom." The random number from the kernel can be associated with the Linux Kernel. This RNG"/dev/urandom" can be based on random occurrences, such as times between keystrokes, mouse movements, timing between interrupts, and hardware occurrences. These occurrences can be used to build and maintain an entropy pool.

The system protects against the same sequence in several ways. First, even if two games are powered on at exactly the same time, there is enough variability in the exact time that the time since power up should prevent any two games from having the same number returned from this function. Also, the "urandom" RNG is entropy based, and is self-seeded from environmental noise contained in the kernel, which makes it unlikely that two machines would ever have the same seed. Finally, the machine number (EPS number) is used as part of the seed. Because this number is used to uniquely identify the gaming machine on the floor, it should always be different from any other machine.

The communications software 1212 can be used to provide communications via the various communication interfaces and using various communication protocols. For example, the communications software 1212 can support the SAS protocol over wired or wireless communication interfaces. In another example, the communication software may allow the gaming machine to communicate with a mobile device via a wireless communication interface using a Bluetooth™ protocol.

The player tracking software 1214 may allow the GMC to communicate with a player tracking device installed on the gaming machine and/or directly with a remote server which provides player tracking services. For example, a player tracking device can be configured to communicate a GMC to transfer credits to and from the gaming machine. In another embodiment, the GMC can be configured to receive player tracking information from a card inserted in a card reader (e.g., see 1028 in FIG. 1A) or via wireless communications with a player's mobile device. Then, GMC can communicate with a remote server to receive information associated with a player and send information associated with the player's game play on the gaming machine.

The devices software 1216 may be used to allow the GMC to communicate with various devices coupled to the gaming machine, such as I/O devices coupled to gaming machine.

For example, the devices software may allow the GMC to communicate with a bill acceptor (e.g., see bill acceptor 1024 in FIG. 1) and in response add credits to the gaming machine. In another example, devices software may allow the GMC to communicate with a printer (e.g., see printer 1022 in FIG. 1) and in response cash out credits from the gaming machine in the form of printed ticket.

The power hit software 1218 can allow GMC to respond to power hits. For example, the power hit software can monitor the power supply and in response to a detection of power fluctuations update the PHTM with crucial data. In another example, when the gaming machine is power-up from a power hit, the power hit software 1218 can determine the power hit occurred during game play and initiate a restoration of the gaming machine to its state when the power hit occurred.

The tilt software 1220 can be configured to monitor sensors and gaming devices for tilt conditions. In response to the detection of a tilt condition, the tilt software 1220 can cause the gaming machine to enter a tilt state. Further, the tilt software 1220 can record tilt information to the PHTM.

For example, when a machine door open is detected, the game can tilt with a hard tilt that prevents play and disables the game. If the gaming machine includes a tower light, the tower light can flash to indicate that a door is open. Further, a "DOOR OPEN" indication can be displayed on the main display screen. Upon a detection of the door closing, the tower light can stop flashing and the "DOOR OPEN TILT" can be replaced with a "DOOR CLOSED SOFT TILT."

The door open tilt condition can be the behavior for all the machine doors, such as door 1014 in FIG. 1 or a CPU enclosure door (not shown). Additionally, the behavior may not change for multiple doors that are open. Thus, the "DOOR OPEN" indication can remain on, and the machine will be disabled until all the doors are closed. After the final door is closed, the tower light can go off, the game can become playable and the "DOOR OPEN" indication can be written over by a "DOOR CLOSED" indication which will remain until the end of the next game cycle.

A number of tilts can be generated that must be cleared by an attendant. These tilts may include clearing the condition with a key switch or, for tilts such as "PAPER OUT," the tilt may clear automatically after the attendant has remedied the malfunction. A low battery for a PHTM (e.g., see NVRAM 1122 in FIG. 8 or 1204 in FIG. 9) can be indicated by a "RAM BATTERY" tilt.

A "PRINT FAILURE" tilt can occur when there is a failure to print a ticket. In response, a printer hard tilt error can be issued and the description will indicate that the printer is offline. The tilt can be cleared when the printer is brought back online.

A "PRINT MECHANISM/PAPER JAM" tilt can occur for a paper jam. The game can indicate the paper jam has occurred and the printer is off-line (e.g., see printer 1022 in FIG. 1). This tilt can be cleared by clearing the jam and reinserting the paper into the printer.

A "PAPER OUT" tilt can occur when the printer runs out of tickets (e.g., see printer 1022 in FIG. 1). In response to detecting no remaining tickets, the game can display information indicating no paper is available and the game can be disabled. This tilt can be cleared when new printer stock is fed into the printer.

A defective storage media tilt can occur when an error is detected in a critical memory device, such as the memory storing the game software (e.g., see 1130 in FIG. 8), the memory storing the BIOS (e.g., see BIOS 1126 in FIG. 7) or the PHTM storing crucial data (e.g., see NVRAM 1122 in FIG. 8). A message indicating the validation error can be displayed. This tilt may require a "RAM CLEAR" to remedy the tilt condition. A "RAM CLEAR" can erase all meter, recall and other critical memory.

As described above, multiple copies of crucial data can be stored in the PHTM (e.g., see NVRAM 1122 in FIG. 8) and the GMC (e.g., see GMC 1160 in FIG. 8) can be configured to detect and correct copies of faulty data. When uncorrectable memory is detected in the PHTM or another device, it can result in a "CRITICAL MEMORY ERROR" tilt. Again, this tilt can require a "RAM CLEAR" to remedy the condition. Again, the "RAM CLEAR" can erase all meter, recall and other critical memory.

A "BILL JAM" can occur when the bill acceptor detects a bill jam (e.g., see bill acceptor 1024 in FIG. 1). The tilt condition can be displayed on the display, such as main display 1018 in FIG. 1A. This is a hard tilt which disables the game until an operator clears the bill jam condition.

When a stacker is full, the game can displays a soft tilt error on the main screen. A "stacker full" may be displayed as a security measure. The stacker can be coupled to a bill acceptor and located in the main cabinet of a gaming machine (e.g., see bill acceptor 1024 in FIG. 1). The game can remain playable but will not accept any further currency or tickets. This tilt is automatically cleared once the stacker is emptied or replaced. When the stacker is removed, the game will be disabled and display a "STACKER OPEN" message. This tilt can be cleared when the stacker is reinserted.

The software validation software 1222 can be executed by the CPU to validate the various software components on the gaming machine. For example, hashes of memory blocks can be performed and compared to stored hash values (e.g., stored in encrypted form in a secure encrypted database server). This software can differ from the validation logic which is executed separately by the BIOS to perform validation functions.

The metering software 1224 can be used to update the hard meters and generate and update the soft meters. The metering software 1224 can be configured to store metering information to the PHTM (e.g., see NVRAM 1122 in FIG. 8). Examples of the meters which can be maintained are described above with respect to meters 1144 in FIG. 8.

FIG. 6 illustrates a block diagram of one embodiment of a power hit tolerant memory (PHTM) (Additional details of PHTMs are described with respect to NVRAM 1122 in FIG. 9 and PHTM 1204 in FIG. 9). Crucial information associated with the current game can be stored in 1302. Some examples of crucial information include but are not limited to a wager amount, a game outcome, one or more random numbers to determine the game outcome, information about game states and sub-states including the current game state, an amount won, initial credits and frame captures associated with one or more states. As described above, this information can be used to return the game to a current state after a power-hit. The one or more random numbers can be used to regenerate a particular game outcome associated with the random numbers and the wager amount.

After a game is completed, it can be moved to a game history partition 1304. The game history partition can store crucial data associated with a plurality of previously played games. For example, in one embodiment, the PHTM 1300 can be configured to store crucial data associated with the current game and nine past games. In another embodiment, the PHTM 1300 can store information associated with up to one hundred past games.

When the maximum number of games in the game history partition is reached, the software which manages the PHTM 1300 can be configured to delete the oldest game. This process can occur prior to starting the next game. For example, if a maximum of ten games are stored in the game history 1304, then prior to the play of the eleventh game, the oldest game can be cleared from the memory. In one embodiment, prior to the deletion of the crucial data associated with the oldest game, it can be copied to a secondary persistent memory.

In 1306, accounting information can be stored. The accounting information can include the metering information previously described above. In some embodiments, this information can be recalled in the event of a power failure.

In 1308, machine configuration information can be stored. Some example of machine configuration information can include but is not limited to Manufacturer ID, date of manufacturing, machine ID, operating system version, number of screens, cabinet type, hard disk capacity, PHTM capacity, number of PHTM banks, printer model information, touch screen model information, card reader model information, bill acceptor model information, display model information, jurisdiction information, casino name and other information, sales order #, manufacture information, logo's, etc. In one embodiment, the public key used in the code validation process can be stored here.

In game configuration 1310, game configuration information can be stored. The game configuration information can include paytable selection, game features selections, bonus selections, jackpot contribution setting, denominations, max number of paylines, number of game titles and game versions. A gaming machine can have many paytables with different holding percentages which can be selected by the casino. Similarly, selectable game features and bonus features can be provided.

In security 1312, security information can be stored. Security information can include information that lead to a tilt condition and the associated tilt condition. For example, if a door is opened, the security information can include when the door was opened, when game play was disabled, when the door was closed, when the tilt condition was cleared and when game play was subsequently enabled.

Figure 10:
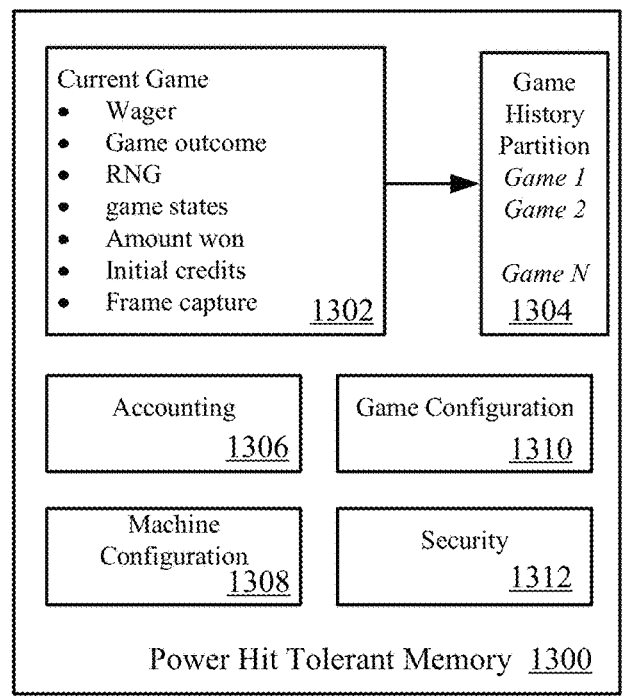
FIG. 10 illustrates a block diagram of power hit tolerant memory in accordance with the present disclosure.

FIG. 10 illustrates a machine-implemented automated method 1400 for responding to a power interruption on a gaming machine. In 1402, the gaming machine can begin a power-up process 1425. The power-up process can begin when a power switch in the interior of the gaming machine is turned on or when power is restored after a power interruption. In response to detecting external power is available, a signal can be generated which initiates a software integrity check on in 1404.

In 1404, the software integrity on the gaming machine can be checked. In particular embodiments, a public key/private key method and a "ladder of trust" can be used to verify control programs executed by the game controller. The initial rung of the ladder of trust can be the BIOS EPROM (see 1126 in FIG. 5), which may be a conventional ROM device. This conventional ROM device can load and can verify the initial code which continues the "verify then load" ladder of trust until the entire operating system and the game is loaded. This process was described above in detail with respect to FIG. 8.

In 1406, the power-off security device (see 1138 in FIG. 8) can be checked. The power-off security can monitor all the doors in the EGM. For example, the doors can use optical emitter/sensor pairs, but some might also use Hall-effect sensors. The system can be a standalone device with a CPU, RAM, NVRAM, sensors I/O board, and battery. The battery can be configured to last at least 30 days. It can be configured to record all critical events, such as power brown out, power black-out, main door open, logic (CPU) door open, bill acceptor door open, printer door open, top box door open and player tracking door open. These critical events may have occurred while the GMC was shut down and hence not monitoring the gaming machine for critical events.

In 1408, the machine integrity can be checked. For example, the security sensors on the gaming machine can be checked to verify all the doors are closed. Further, gaming devices, such as the printer and the bill acceptor, can be checked to determine the devices are operating properly (e.g., see printer 1022 and bill acceptor 1024 in FIG. 1).

In 1410, critical memory on the gaming machine can be checked. For example, the PHTM can be checked to make sure the stored information matches associated hash values. As described, a hash value can be generated for crucial data stored in the PHTM. The hash values can be stored with the crucial data. When the PHTM integrity is checked, new hash values can be generated and compared to the stored hash values.

In 1412, the GMC can determine whether all the checks were successful. If one or more of the checks are not successful, in 1414, the gaming machine can enter a tilt state and game play on the gaming machine can be disabled. Information about the tilt state can be output to a display, such as the main display on which a gaming presentation for a wager-based game is output.

In 1416, when all the checks are successful, event information associated with the successful power-up process can be stored to the PHTM. For example, the time that the gaming machine was enabled for game play can be stored to the PHTM. In one embodiment, as described above, this information can be used to generate a seed for a random number generator used on the gaming machine.

In 1418, the gaming machine can enter game play mode. Thus, the gaming machine is enabled to accept bills and tickets that are redeemed for credits on the gaming machine. After credits are deposited, the gaming machine can be used to make wagers on the game(s) available for play on the gaming machine. In 1420, the GMC can generate wager-based game play on the gaming machine and store crucial game play data to the PHTM.

FIG. 12 illustrates a method 1500 powering up a gaming machine. In 1502, a wager can be placed and a game can be initiated. In 1504, initial state information associated with the game can be stored to the PHTM. In 1506, game states associated with the game can be generated. In 1508, crucial data associated with the game states can be stored to the PHTM.

In 1510, a power-interruption can be detected. For example, the GMC can receive a signal from the power supply which indicates a power spike associated with a power shutdown has occurred. In 1512, the event can be logged to the PHTM. In addition, current game state information can be logged to the PHTM prior to the power failure. After power is lost, the GMC may no longer operate unless an uninterruptable power supply is available.

In 1425, the power-up process in FIG. 11 can be performed. In 1514, this event can be logged to the PHTM. In 1516, whether the power-up process is successful can be checked. In 1518, if the check is not successful, the gaming machine can be placed in a tilt state and information about the tilt state can be output.

In 1520, a check can be performed to determine whether the power-hit occurred during the play of a game and prior to completion of the game. This information can be stored in the PHTM. In 1524, when the power-hit occurred during the play of a game, data associated with the game including the current game state can be retrieved from the PHTM. In 1526, the game can be regenerated up to the current game state just prior to the power hit. In some embodiments, the gaming machine can be configured in the current game state without showing any information leading up to the current game state. In other embodiments, one or more game states prior to the current game state can be regenerated and output to the display.

In 1528, the current game can be completed. In 1522, the game can be enabled for game play. In 1520, when the power-hit didn't occur during play of a game, the gaming machine can be powered-up and enabled for game play in 1522.

Figure 13:
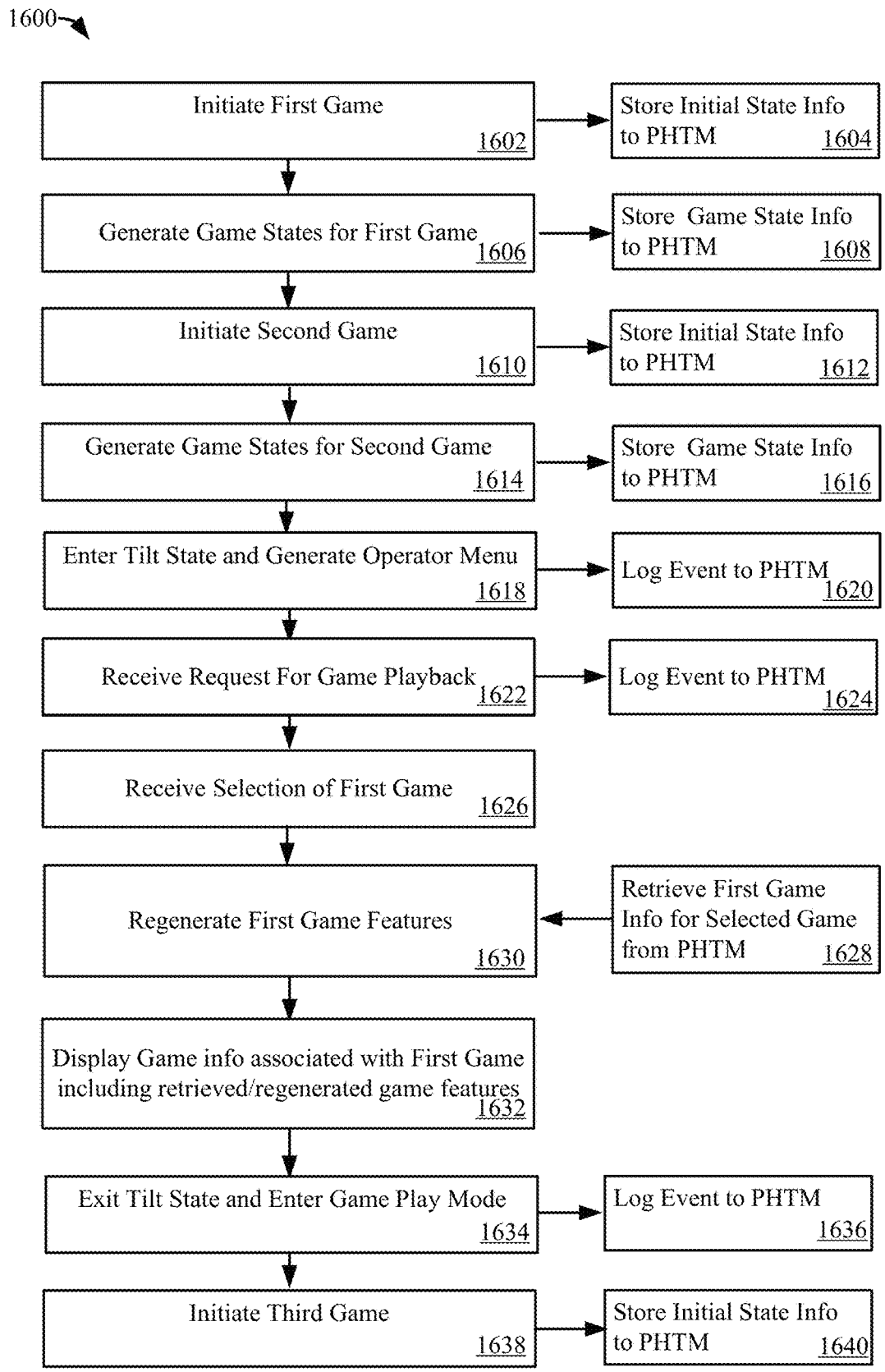
FIG. 13 illustrates a method playing back a game previously played on a gaming machine in accordance with the present disclosure.

FIG. 13 illustrates a method 1600 playing back a game previously played on a gaming machine. In 1602, a first game can be initiated on the gaming machine. In 1604, initial state information about the first game can be stored to the PHTM. In 1606, game states for the first game can be generated. In 1608, the game states can be stored to the PHTM. As described, in the event of a power-hit during play of the first game, the GMC (e.g., see GMC 1160 in FIG. 8) can be configured to restore the game and the gaming machine to a game state just prior to the power hit using information retrieved from the PHTM (e.g., see NVRAM 1122 in FIG. 8).

After the completion of the first game, in 1610, a second game can be initiated. The initial state information for the second game can be stored to the PHTM (e.g., see NVRAM 1122 in FIG. 8). In 1614, the game states for the second game can be generated and the second can be brought to completion. In 1616, the game state information for the second game can be stored to the PHTM.

In 1618, the gaming machine can enter a tilt state. In one embodiment, the tilt state can be initiated in response to the operator inserting and turning a key in a locking mechanism on the outside of the gaming machine cabinet. Then, an operator menu can be generated and output to a display on the gaming machine. In 1620, the tilt state event can be logged in the PHTM.

In the 1622, the gaming machine using an input device, such as a touch screen, can receive a request for a game playback. The game playback can involve displaying information about a game previously played on the gaming machine. In 1624, this event can be logged to the PHTM. In 1626, a particular previously played game can be selected from among a plurality of games with game information stored in the PHTM. In this example, the first game played is selected.

In 1628, game information associated with the first game is retrieved from the PHTM. Some examples of game information which can be retrieved includes but are not limited one or more of random numbers used to generate the first game, screen shots, award information, bet information, credit information and screen shots from one or more game states.

In 1630, first game features can be regenerated. These game features can include animations of the play of the game, which represent one or more game states, or static images representing different game states. The animations of the play of the game can be regenerated using random numbers associated with the original play of the first game.

In 1632, game information associated with the first game, including the retrieved screen shots, regenerated static images and regenerated animations, can be output to a display on the gaming machine. In one embodiment, the display can be the display where the game presentation for the wager-based game is output (e.g., see display 1018 in FIG. 1). In 1634, the gaming machine can exit the tilt state and enter game play mode. For example, to initiate this process an operator can turn a key in the locking mechanism and remove it from the locking mechanism.

In 1636, initiation of game play can be logged as an event to the PHTM. In 1638, a third game on the gaming machine can be initiated. In 1640, the initial state information associated with the third game can be stored to the PHTM.

Because such information and program instructions may be employed to implement the systems/methods described herein, the present disclosure of invention relates to tangible (non-transitory) machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure. As used herein, the term "and/or" implies all possible combinations. In other words, A and/or B covers, A alone, B alone, and A and B together.

While the present disclosure of invention has been particularly shown and described with reference to specific embodiments thereof, it will be understood by those skilled in the art that changes in the form and details of the disclosed embodiments may be made without departing from the spirit or scope of the present teachings. It is therefore intended that the disclosure be interpreted to include all variations and equivalents that fall within the true spirit and scope of the present teachings.

What is claimed is:

1. A gaming machine comprising:
   a cabinet including an entry that provides access to an interior of the cabinet, a locking mechanism coupled to the entry and a plurality of security sensors wherein at least one of the plurality of security sensors is usable to detect access or attempted access to the interior of the cabinet;
   a regulated power supply, disposed within the interior of the cabinet, receiving power from an external power source;
   a power-off security device disposed within the interior of the cabinet, coupled to one or more of the plurality security sensors and monitoring access or attempted access to the cabinet interior even when the external power source is unpowered;
   a display, coupled to the cabinet, outputting content associated with play of one or more wager-based games;

an input source receiving one or more selections from a player;

a non-volatile memory, disposed within a first locked box within the interior of the cabinet, storing non-transitory gaming software used to generate the one or more wager-based games on the gaming machine wherein the gaming software defines a plurality of selectable prize structures and a plurality of sets of virtual reel strips wherein predetermined permutations of chance spins of the sets of the virtual reel strips are respectively associated with one of the plurality of selectable prize structures and wherein properties of each of the predetermined permutations of chance spins of the sets of the virtual reel strips are selected such that a probability of winning respective progressive prizes remains approximately constant for each of the sets;

a power-hit tolerant memory, disposed within the first or another locked box within the interior of the cabinet and storing crucial data associated with a play of a plurality instances of the wager-based game;

a gaming machine controller, including a processor and a memory, disposed within the first or another locked box within the interior of the cabinet, coupled to the regulated power supply, to the power-off security device, to the plurality of security sensors, to the display, to the non-volatile memory and to the power-hit tolerant memory, the gaming machine controller being configured to: 1) control the play of the plurality of instances of the wager-based game, 2) monitor the power-off security device and the plurality of security sensors to detect conditions warranting tilt state; 3) store at least some data associated with the play of the plurality of instances of the wager-based game to the power-hit tolerant memory; and 4) generate an outcome for a particular instance of the wager-based game;

a multi-flow heat exchanger having a plurality of fluid flow-through paths in heat exchange coupling with one another, a first of the fluid flow-through paths being part of a sealed air-tight gas circulation containment volume within which a thermal transfer gas circulates, the gas circulation containment volume including at least part of an interior of at least one of said locked boxes within the interior of the cabinet, the thermal transfer gas being cleaner than a local ambient air environment surrounding the cabinet; and a plurality of gas blowers, said gas blowers being respectively and operatively coupled to respective subsets of the fluid flow-through paths of the multi-flow heat exchanger, a first of the gas blowers being disposed within the gas circulation containment volume and configured to circulate the thermal transfer gas through said at least interior part of at least one of said locked boxes and through the first fluid flow-through path of the heat exchanger so as to thereby define a gas circulating loop in the air-tight sealed gas circulation containment volume, and a second of the gas blowers being disposed and configured to blow air sourced from the local ambient air environment another a second of the fluid flow-through paths.

2. The gaming machine of claim 1 wherein the gas circulating loop is a convectively assisted circulating loop in which the multi-flow heat exchanger is disposed at an upper portion of the cabinet and wherein a bottom portion of the gas circulation containment volume is disposed below the heat exchanger so that when a relatively more dense and cooler part of the thermal transfer gas forms in the heat exchanger, the more dense part can drop to gravitationally displace a relatively less dense and warmer part of the thermal transfer gas present at the bottom portion of the gas circulation containment volume.

3. The gaming machine of claim 1 wherein at least portions of the one or more locked boxes that form the gas circulation containment volume have respective sealable air-tight access doors.

4. The gaming machine of claim 1 wherein cabinet has upwardly extending chimneys through which the air sourced from the local environment and heated by the heat exchanger can exhaust from the cabinet.

5. The gaming machine of claim 1 wherein the at least portions of the one or more locked boxes that form the gas circulation containment volume each has a fluid-tight feed-through aperture by way of which power and signals can be communicated while maintaining the air-tight seal of the respective locked box portion.

6. A method of cooling internal components of a cabinet of a gaming machine, the cabinet being disposed in a surrounding local ambient air environment, the method comprising:

actively circulating with aid of a first gas blower, a thermal transfer gas in an air-tight sealed loop, the thermal transfer gas being cleaner than the surrounding local ambient air environment, the loop including a first gas flow path of a multi-flow heat exchanger disposed at least within an upper portion of the cabinet and the loop including a components containment volume disposed at least within a lower portion of the cabinet, the components containment volume containing one or more heat generating components and/or containing one or more heat emitting parts of heat generating components such that the contained heat generating components and/or the contained heat emitting parts are exposed to the circulating thermal transfer gas, wherein the circulating of the thermal transfer gas causes a relatively more dense and cooler part of the thermal transfer gas to form in a portion of the heat exchanger that is above a bottom portion of the components containment volume such that the more dense part can move down to gravitationally displace a relatively less dense and warmer part of the thermal transfer gas that is being exposed to the one or more heat generating components and/or the one or more heat emitting parts present at the bottom portion of the components containment volume, and flowing air sourced from the surrounding local ambient air environment along a second gas flow path of the multi-flow heat exchanger.

7. The method of claim 6 wherein the sealed loop includes a flow guiding conduit and the method further comprises:

using the flow guiding conduit to guide the actively circulated and relatively more dense and cooler part of the thermal transfer gas that forms in the heat exchanger to flow downwardly so as to emerge substantially at the bottom portion of the components containment volume.

8. The method of claim 7 wherein:

the first gas blower is disposed inside the sealed loop and oriented to propel the thermal transfer gas such that the propelling causes the relatively more dense and cooler part of the thermal transfer gas that emerges substantially at the bottom portion of the components containment volume to rise upwardly within the components containment volume and absorb heat energy from at least one of the heat generating components and/or heat emitting parts of the components containment volume.

9. The method of claim 8 and further comprising:
automatically detecting that a temperature of at least one of the heat generating components and/or heat emitting parts of the components containment volume is above a predetermined threshold and responsively increasing a speed of the first gas blower and/or turning on additional one among the one or more further gas blowers provided inside the sealed loop so as to thereby increase the upwardly rising rate of the thermal transfer gas.

10. The method of claim 8 and further comprising:
automatically detecting that respective temperatures of all the heat generating components and/or heat emitting parts of the components containment volume are below respective predetermined thresholds and responsively decreasing a speed of the first gas blower and/or turning off one or more further gas blowers provided inside the sealed loop so as to thereby consume less power for propelling the thermal transfer gas.

11. The method of claim 8 and further comprising:
using one or more of further gas blowers provided inside the sealed loop to propel the thermal transfer gas such that the propelling causes the relatively less dense and warmer part of the thermal transfer gas to flow from an upper portion of the components containment volume into the first gas flow path of the heat exchanger for cooling by the heat exchanger.

12. The method of claim 11 and further comprising:
using one or more blowers disposed outside the sealed loop to propel the air sourced from the surrounding local ambient air environment along the second gas flow path of the multi-flow heat exchanger.

13. The method of claim 12 and further comprising:
automatically adjusting blowing rates and/or blowing directions of the outside blowers periodically or in response to detected changes in at least one of external and internal environments of the gaming machine cabinet.

14. The method of claim 6 wherein:
the thermal transfer gas includes pre-cleaned air from which particles of sizes larger than a predetermined diameter have been removed and vapors in excess of respective predetermined concentrations have been removed.

15. The method of claim 14 wherein:
the thermal transfer gas includes one or more additional gases beyond the pre-cleaned air, the one or more additional gases being provided in concentrations greater than those additional gases are found in the pre-cleaned air.

16. The method of claim 15 wherein:
the one or more additional gases are selected from the group consisting of: $CO_2$, $N_2$, a noble gas, and other gases of molecular weight greater than that of $CH_4$.

17. The method of claim 6 wherein:
the heat exchanger has at least one part thereof disposed inside the components containment volume.

18. The method of claim 17 wherein:
the contained heat generating components and/or the contained heat emitting parts include those of at least one of a gaming control module, a regulated power supplying module, a cabinet lightings outputting module, and an analog amplifiers module.

19. The method of claim 6 and further comprising:
purging the components containment volume with a first gas and thereafter introducing the thermal transfer gas into the components containment volume.

* * * * *